United States Patent
Song et al.

(10) Patent No.: US 9,891,856 B2
(45) Date of Patent: Feb. 13, 2018

(54) MEMORY ADDRESS REMAPPING SYSTEM, DEVICE AND METHOD OF PERFORMING ADDRESS REMAPPING OPERATION

(71) Applicant: Samsung Electronics Co., Ltd., Suwon-si (KR)

(72) Inventors: Won-Hyung Song, Osan-si (KR); Duk-Sung Kim, Hwaseong-si (KR); Hoki Kim, Seongnam-si (KR); Soo-Woong Ahn, Seongnam-si (KR); Ha-Ryong Yoon, Seoul (KR); Ju-Yun Jung, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 13 days.

(21) Appl. No.: 14/953,642

(22) Filed: Nov. 30, 2015

(65) Prior Publication Data

US 2016/0162217 A1    Jun. 9, 2016

(30) Foreign Application Priority Data

Dec. 5, 2014 (KR) .................. 10-2014-0173816

(51) Int. Cl.
| | |
|---|---|
| *G06F 12/06* | (2006.01) |
| *G06F 3/06* | (2006.01) |
| *G11C 8/12* | (2006.01) |
| *G11C 7/10* | (2006.01) |

(52) U.S. Cl.
CPC .......... *G06F 3/0638* (2013.01); *G06F 3/0604* (2013.01); *G06F 3/0629* (2013.01); *G06F 3/0683* (2013.01); *G11C 8/12* (2013.01); *G11C 7/10* (2013.01)

(58) Field of Classification Search
CPC .................................. G11C 8/12; G06F 12/06
See application file for complete search history.

(56) References Cited

U.S. PATENT DOCUMENTS

| | | |
|---|---|---|
| 7,289,386 B2 | 10/2007 | Bhakta et al. |
| 8,405,221 B2 | 3/2013 | Imai |
| 8,519,734 B2 | 8/2013 | Jeong et al. |
| 8,619,486 B2 | 12/2013 | Hayashi et al. |
| 8,681,525 B2 | 3/2014 | Sato |
| 8,713,349 B2 | 4/2014 | Byeon et al. |

(Continued)

FOREIGN PATENT DOCUMENTS

| | | |
|---|---|---|
| KR | 10-0762206 | 9/2007 |

*Primary Examiner* — Edward Dudek, Jr.
(74) *Attorney, Agent, or Firm* — Muir Patent Law, PLLC

(57) ABSTRACT

A memory system includes an address remapping circuit and a first set of memory devices. The address remapping circuit includes a plurality of input terminals for receiving a plurality of chip selection signals and a plurality of chip identification signals. The address remapping circuit receives input signals corresponding to a portion of the plurality of chip selection signals and the plurality of chip identification signals through corresponding input terminals of the plurality of input terminals and generates a plurality of internal chip selection signals based on the input signals and a remapping control signal. Each of the first set of memory devices is configured to be selected in response to a corresponding internal chip selection signal of the plurality of internal chip selection signals.

20 Claims, 38 Drawing Sheets

(56) References Cited

U.S. PATENT DOCUMENTS

| | | |
|---|---|---|
| 8,787,101 B2 | 7/2014 | Keeth et al. |
| 2008/0019198 A1* | 1/2008 | Co .......................... G11C 5/04 |
| | | 365/201 |
| 2009/0040827 A1 | 2/2009 | Kim |
| 2012/0182778 A1* | 7/2012 | Sato ........................ G11C 5/02 |
| | | 365/63 |
| 2012/0326775 A1 | 12/2012 | Heo |
| 2013/0021866 A1 | 1/2013 | Lee |
| 2013/0336039 A1* | 12/2013 | Frans ....................... G11C 5/02 |
| | | 365/51 |

* cited by examiner

|  | CS1 | CS2 | CID1 | CID2 | ICS1 | ICS2 | ICS3 | ICS4 |
|---|---|---|---|---|---|---|---|---|
| CASE1 | L | H | L | X | H | L | L | L |
| CASE2 | L | H | H | X | L | H | L | L |
| CASE3 | H | L | L | X | L | L | H | L |
| CASE4 | H | L | H | X | L | L | L | H |
| CASE5 | H | H | DC | X | L | L | L | L |

|       | CS1 | CS2 | CID1 | CID2 | ICS1 | ICS2 | ICS3 | ICS4 |
|-------|-----|-----|------|------|------|------|------|------|
| CASE1 | L   | X   | L    | L    | H    | L    | L    | L    |
| CASE2 | L   | X   | H    | L    | L    | H    | L    | L    |
| CASE3 | L   | X   | L    | H    | L    | L    | H    | L    |
| CASE4 | L   | X   | H    | H    | L    | L    | L    | H    |
| CASE5 | H   | X   | DC   | DC   | L    | L    | L    | L    |

|  | CS1 | CS2 | CID1 | CID2 | An | ICS1 | ICS2 | ICS3 | ICS4 |
|---|---|---|---|---|---|---|---|---|---|
| CASE1 | L | X | L | L | X | H | L | L | L |
| CASE2 | L | X | H | L | X | L | H | L | L |
| CASE3 | L | X | L | H | X | L | L | H | L |
| CASE4 | L | X | H | H | X | L | L | L | H |
| CASE5 | H | X | DC | DC | X | L | L | L | L |

|  | CS1 | CS2 | CID1 | CID2 | An | ICS1 | ICS2 | ICS3 | ICS4 |
|---|---|---|---|---|---|---|---|---|---|
| CASE1 | L | H | L | X | X | H | L | L | L |
| CASE2 | L | H | H | X | X | L | H | L | L |
| CASE3 | H | L | L | X | X | L | L | H | L |
| CASE4 | H | L | H | X | X | L | L | L | H |
| CASE5 | H | H | DC | X | X | L | L | L | L |

|  | CS1 | CS2 | CID1 | CID2 | An | ICS1 | ICS2 | ICS3 | ICS4 |
|---|---|---|---|---|---|---|---|---|---|
| CASE1 | L | H | X | X | L | H | L | L | L |
| CASE2 | L | H | X | X | H | L | H | L | L |
| CASE3 | H | L | X | X | L | L | L | H | L |
| CASE4 | H | L | X | X | H | L | L | L | H |
| CASE5 | H | H | X | X | DC | L | L | L | L |

|  | CS1 | CS2 | CID1 | CID2 | An | ICS1 | ICS2 | ICS3 | ICS4 |
|---|---|---|---|---|---|---|---|---|---|
| CASE1 | L | X | L | X | L | H | L | L | L |
| CASE2 | L | X | H | X | L | L | H | L | L |
| CASE3 | L | X | L | X | H | L | L | H | L |
| CASE4 | L | X | H | X | H | L | L | L | H |
| CASE5 | H | X | DC | X | DC | L | L | L | L |

|  | CS1 | CS2 | CID | An | ICS1 | ICS2 |
|---|---|---|---|---|---|---|
| CASE1 | L | H | X | X | H | L |
| CASE2 | H | L | X | X | L | H |
| CASE3 | H | H | X | X | L | L |

|  | CS1 | CS2 | CID | An | ICS1 | ICS2 |
|---|---|---|---|---|---|---|
| CASE1 | L | X | L | X | H | L |
| CASE2 | L | X | H | X | L | H |
| CASE3 | H | X | DC | X | L | L |

|  | CS1 | CS2 | CID | An | ICS1 | ICS2 |
|---|---|---|---|---|---|---|
| CASE1 | L | X | X | L | H | L |
| CASE2 | L | X | X | H | L | H |
| CASE3 | H | X | X | DC | L | L |

FIG. 18A

| | CS1 | CS2 | CS3 | CS4 | CID1 | CID2 | CID3 | An | An+1 | An+2 | ACTIVATED ICS |
|---|---|---|---|---|---|---|---|---|---|---|---|
| CASE1 | L | H | H | H | L | x | x | x | x | x | ICS1 |
| CASE2 | L | H | H | H | H | x | x | x | x | x | ICS2 |
| CASE3 | H | L | H | H | L | x | x | x | x | x | ICS3 |
| CASE4 | H | L | H | H | H | x | x | x | x | x | ICS4 |
| CASE5 | H | H | L | H | L | x | x | x | x | x | ICS5 |
| CASE6 | H | H | L | L | H | x | x | x | x | x | ICS6 |
| CASE7 | H | H | H | L | L | x | x | x | x | x | ICS7 |
| CASE8 | H | H | H | L | H | x | x | x | x | x | ICS8 |
| CASE9 | H | H | H | H | DC | x | x | x | x | x | NONE |

FIG. 18B

| | CS1 | CS2 | CS3 | CS4 | CID1 | CID2 | CID3 | An | An+1 | An+2 | ACTIVATED ICS |
|---|---|---|---|---|---|---|---|---|---|---|---|
| CASE1 | L | H | X | X | L | L | X | X | X | X | ICS1 |
| CASE2 | L | H | X | X | H | L | X | X | X | X | ICS2 |
| CASE3 | H | L | X | X | L | H | X | X | X | X | ICS3 |
| CASE4 | H | L | X | X | H | H | X | X | X | X | ICS4 |
| CASE5 | L | H | X | X | L | L | X | X | X | X | ICS5 |
| CASE6 | L | H | X | X | H | L | X | X | X | X | ICS6 |
| CASE7 | H | L | X | X | L | H | X | X | X | X | ICS7 |
| CASE8 | H | L | X | X | H | H | X | X | X | X | ICS8 |
| CASE9 | H | H | X | X | DC | DC | X | X | X | X | NONE |

FIG. 18C

| | CS1 | CS2 | CS3 | CS4 | CID1 | CID2 | CID3 | An | An+1 | An+2 | ACTIVATED ICS |
|---|---|---|---|---|---|---|---|---|---|---|---|
| CASE1 | L | X | X | X | L | L | L | X | X | X | ICS1 |
| CASE2 | L | X | X | X | H | L | L | X | X | X | ICS2 |
| CASE3 | L | X | X | X | L | H | L | X | X | X | ICS3 |
| CASE4 | L | X | X | X | H | H | L | X | X | X | ICS4 |
| CASE5 | L | X | X | X | L | L | H | X | X | X | ICS5 |
| CASE6 | L | X | X | X | H | L | H | X | X | X | ICS6 |
| CASE7 | L | X | X | X | L | H | H | X | X | X | ICS7 |
| CASE8 | L | X | X | X | H | H | H | X | X | X | ICS8 |
| CASE9 | H | X | X | X | DC | DC | DC | X | X | X | NONE |

FIG. 18D

| | CS1 | CS2 | CS3 | CS4 | CID1 | CID2 | CID3 | An | An+1 | An+2 | ACTIVATED ICS |
|---|---|---|---|---|---|---|---|---|---|---|---|
| CASE1 | L | H | H | H | X | X | X | L | X | X | ICS1 |
| CASE2 | L | H | H | H | X | X | X | H | X | X | ICS2 |
| CASE3 | H | L | H | H | X | X | X | L | X | X | ICS3 |
| CASE4 | H | L | H | H | X | X | X | H | X | X | ICS4 |
| CASE5 | H | H | L | H | X | X | X | L | X | X | ICS5 |
| CASE6 | H | H | L | L | X | X | X | H | X | X | ICS6 |
| CASE7 | H | H | H | L | X | X | X | L | X | X | ICS7 |
| CASE8 | H | H | H | L | X | X | X | H | X | X | ICS8 |
| CASE9 | H | H | H | H | X | X | X | DC | X | X | NONE |

FIG. 18E

| | CS1 | CS2 | CS3 | CS4 | CID1 | CID2 | CID3 | An | An+1 | An+2 | ACTIVATED ICS |
|---|---|---|---|---|---|---|---|---|---|---|---|
| CASE1 | L | H | X | X | X | X | X | L | L | X | ICS1 |
| CASE2 | L | H | X | X | X | X | X | H | L | X | ICS2 |
| CASE3 | H | L | X | X | X | X | X | L | H | X | ICS3 |
| CASE4 | H | L | X | X | X | X | X | H | H | X | ICS4 |
| CASE5 | L | H | X | X | X | X | X | L | L | X | ICS5 |
| CASE6 | L | H | X | X | X | X | X | H | L | X | ICS6 |
| CASE7 | H | L | X | X | X | X | X | L | H | X | ICS7 |
| CASE8 | H | L | X | X | X | X | X | H | H | X | ICS8 |
| CASE9 | H | H | X | X | X | X | X | DC | DC | X | NONE |

FIG. 18F

| | CS1 | CS2 | CS3 | CS4 | CID1 | CID2 | CID3 | An | An+1 | An+2 | ACTIVATED ICS |
|---|---|---|---|---|---|---|---|---|---|---|---|
| CASE1 | L | X | X | X | X | X | X | L | L | L | ICS1 |
| CASE2 | L | X | X | X | X | X | X | H | L | L | ICS2 |
| CASE3 | L | X | X | X | X | X | X | L | H | L | ICS3 |
| CASE4 | L | X | X | X | X | X | X | H | H | L | ICS4 |
| CASE5 | L | X | X | X | X | X | X | L | L | H | ICS5 |
| CASE6 | L | X | X | X | X | X | X | H | L | H | ICS6 |
| CASE7 | L | X | X | X | X | X | X | L | H | H | ICS7 |
| CASE8 | L | X | X | X | X | X | X | H | H | H | ICS8 |
| CASE9 | H | X | X | X | X | X | X | DC | DC | DC | NONE |

FIG. 18G

| | CS1 | CS2 | CS3 | CS4 | CID1 | CID2 | CID3 | An | An+1 | An+2 | ACTIVATED ICS |
|---|---|---|---|---|---|---|---|---|---|---|---|
| CASE1 | L | H | X | X | L | X | X | L | X | X | ICS1 |
| CASE2 | L | H | X | X | H | X | X | L | X | X | ICS2 |
| CASE3 | H | L | X | X | L | X | X | H | X | X | ICS3 |
| CASE4 | H | L | X | X | H | X | X | H | X | X | ICS4 |
| CASE5 | L | H | X | X | L | X | X | L | X | X | ICS5 |
| CASE6 | L | H | X | X | H | X | X | L | X | X | ICS6 |
| CASE7 | H | L | X | X | L | X | X | H | X | X | ICS7 |
| CASE8 | H | L | X | X | H | X | X | H | X | X | ICS8 |
| CASE9 | H | H | X | X | DC | X | X | DC | X | X | NONE |

FIG. 18H

| | CS1 | CS2 | CS3 | CS4 | CID1 | CID2 | CID3 | An | An+1 | An+2 | ACTIVATED ICS |
|---|---|---|---|---|---|---|---|---|---|---|---|
| CASE1 | L | X | X | X | L | L | X | L | X | X | ICS1 |
| CASE2 | L | X | X | X | H | L | X | L | X | X | ICS2 |
| CASE3 | L | X | X | X | L | H | X | L | X | X | ICS3 |
| CASE4 | L | X | X | X | H | H | X | L | X | X | ICS4 |
| CASE5 | L | X | X | X | L | L | X | H | X | X | ICS5 |
| CASE6 | L | X | X | X | H | L | X | H | X | X | ICS6 |
| CASE7 | L | X | X | X | L | H | X | H | X | X | ICS7 |
| CASE8 | L | X | X | X | H | H | X | H | X | X | ICS8 |
| CASE9 | H | X | X | X | DC | DC | X | DC | X | X | NONE |

FIG. 18I

| | CS1 | CS2 | CS3 | CS4 | CID1 | CID2 | CID3 | An | An+1 | An+2 | ACTIVATED ICS |
|---|---|---|---|---|---|---|---|---|---|---|---|
| CASE1 | L | X | X | X | L | X | X | L | L | X | ICS1 |
| CASE2 | L | X | X | X | H | X | X | L | L | X | ICS2 |
| CASE3 | L | X | X | X | L | X | X | H | L | X | ICS3 |
| CASE4 | L | X | X | X | H | X | X | H | L | X | ICS4 |
| CASE5 | L | X | X | X | L | X | X | L | H | X | ICS5 |
| CASE6 | L | X | X | X | H | X | X | L | H | X | ICS6 |
| CASE7 | L | X | X | X | L | X | X | H | H | X | ICS7 |
| CASE8 | L | X | X | X | H | X | X | H | H | X | ICS8 |
| CASE9 | H | X | X | X | DC | X | X | DC | DC | X | NONE |

MEMORY ADDRESS REMAPPING SYSTEM, DEVICE AND METHOD OF PERFORMING ADDRESS REMAPPING OPERATION

CROSS-REFERENCE TO RELATED APPLICATION

This U.S. Non-provisional application claims priority under 35 USC § 119 to Korean Patent Application No. 10-2014-0173816, filed on Dec. 5, 2014, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a stacked memory device of performing an address remapping operation, a memory system including the stacked memory device and a method of performing an address remapping operation.

2. Discussion of the Related Art

A memory capacity and an operation speed demanded for a main memory are increasing according to developments of hardware and software. In contrast, design related with address scenario of a memory controller tends to be simplified for high-speed operation and efficiency. Even though the memory controller provides a generic address management scheme, it may be difficult to optimize a real memory structure to the provided address management scheme so as to maximize performance of a memory system.

SUMMARY

Some example embodiments of the present disclosure provide a stacked memory device capable of adaptively performing an address remapping operation.

Some example embodiments of the present disclosure provide a memory chip, a memory module and a memory system capable of adaptively performing an address remapping operation.

Some example embodiments of the present disclosure provide a method of performing an address remapping operation.

According to example embodiments, a stacked memory device includes an address remapping circuit and a plurality of semiconductor dies. The address remapping circuit includes a plurality of input terminals for receiving a plurality of chip selection signals and a plurality of chip identification signals from an external device. The address remapping circuit receives input signals corresponding to a portion of the plurality of chip selection signals and the plurality of chip identification signals through valid input terminals corresponding to a portion of the plurality of input terminals and generates a plurality of internal chip selection signals based on the input signals and a remapping control signal. The semiconductor dies are stacked vertically and each of the semiconductor dies includes a memory device that receives each of the internal chip selection signals.

The remapping control signal may have a control value that is changed depending on different combinations of the input signals received through the valid input terminals.

The stacked memory device may further include a register configured to store interface mode information representing a combination of the input signals received through the valid input signals. The remapping control signal may be generated based on the interface mode information stored in the register.

The address remapping circuit may activate one of the internal chip selection signals, when the stacked memory device is accessed, to select one of the semiconductor dies in the stacked memory device.

Each of the internal chip selection signals is transferred to a corresponding one of the semiconductor dies.

The internal chip selection signals may be transferred commonly to the semiconductor dies, and each of the semiconductor dies may further include a selection circuit configured to select one of the internal chip selection signals and transfer the selected internal chip selection signal to the memory device in each of the semiconductor dies.

One of the semiconductor dies may correspond to a master semiconductor die configured to buffer command-address signals received from an external device and the other semiconductor dies may correspond to slave semiconductor dies configured to receive the buffered command-address signals from the master semiconductor die.

The address remapping circuit may be included only in the master semiconductor die.

The master semiconductor die and the slave semiconductor dies may have a same configuration including the address remapping circuit, respectively, and the address remapping circuit in the master semiconductor die may be enabled to receive the input signals and the address remapping circuits in the slave semiconductor dies are disabled ('X').

The stacked memory device may further include an interface semiconductor die stacked with the plurality of semiconductor dies, and the interface semiconductor die may buffer command-address signals received from an external device to transfer the buffered command address signals to the plurality of semiconductor dies.

The address remapping circuit may be included only in the interface semiconductor die.

The stacked memory device may selectively perform one of a plurality of interface modes corresponding to different combinations of the input signals.

The address remapping circuit may generate a first internal chip selection signal, a second internal chip selection signal, a third internal chip selection signal and a fourth internal chip selection signal, and the semiconductor dies may include a first semiconductor die that is accessed when the first internal chip selection signal is activated, a second semiconductor die that is accessed when the second internal chip selection signal is activated, a third semiconductor die that is accessed when the third internal chip selection signal is activated and a fourth semiconductor die that is accessed when the fourth internal chip selection signal is activated.

The input terminals may include four input terminals for receiving a first chip selection signal, a second chip selection signal, a first chip identification signal and a second chip identification signal, respectively.

The stacked memory device may selectively perform one of a first interface mode receiving the first chip selection signal, the second chip selection signal and the first chip identification signal as the input signals and a second interface mode receiving the first chip selection signal, the first chip identification signal and the second chip identification signal as the input signal.

The address remapping circuit may include a first inverter configured to invert the first chip selection signal, a second inverter configured to invert the second chip selection signal, a chip selection multiplexer configured to select one of an inversion signal of the first chip selection signal and an inversion signal of the second chip selection signal in response to the remapping control signal, a first AND gate configured to perform an AND logic operation on the first chip identification signal and the second chip identification signal, a second AND gate configured to perform an AND logic operation on an inversion signal of the first chip identification signal and the second chip identification signal, a third AND gate configured to perform an AND logic operation on the first chip identification signal and an inversion signal of the second chip identification signal, a fourth AND gate configured to perform an AND logic operation on the inversion signal of the first chip identification signal and the inversion signal of the second chip identification signal, a first multiplexer configured to select one of an output signal of the first AND gate and the first chip identification signal in response to the remapping control signal, a second multiplexer configured to select one of an output signal of the second AND gate and the inversion signal of the first chip identification signal in response to the remapping control signal, a third multiplexer configured to select one of an output signal of the third AND gate and the first chip identification signal in response to the remapping control signal, a fourth multiplexer configured to select one of an output signal of the fourth AND gate and the inversion signal of the first chip identification signal in response to the remapping control signal, a fifth AND gate configured to perform an AND logic operation on an output signal of the chip selection multiplexer and an output signal of the first multiplexer to generate a fourth internal chip selection signal, a sixth AND gate configured to perform an AND logic operation on the output signal of the chip selection multiplexer and an output signal of the second multiplexer to generate a third internal chip selection signal, a seventh AND gate configured to perform an AND logic operation on the inversion signal of the first chip selection signal and an output signal of the third multiplexer to generate a second internal chip selection signal, and an eighth AND gate configured to perform an AND logic operation on the inversion signal of the first chip selection signal and an output signal of the fourth multiplexer to generate a first internal chip selection signal.

The input terminals may include five input terminals for receiving a first chip selection signal, a second chip selection signal, a first chip identification signal, a second chip identification signal and an address bit signal, respectively.

The stacked memory device may selectively perform one of a first interface mode receiving the first chip selection signal, the first chip identification signal and the second chip identification signal as the input signals, a second interface mode receiving the first chip selection signal, the second chip selection signal and the first chip identification signal as the input signals, a third interface mode receiving the first chip selection signal, the second chip selection signal and the address bit signal as the input signals, and a fourth interface mode receiving the first chip selection signal, the first chip identification signal and the address bit signal.

The address remapping circuit may include a first inverter configured to invert the first chip selection signal, a second inverter configured to invert the second chip selection signal, a chip selection multiplexer configured to select one of an inversion signal of the first chip selection signal and an inversion signal of the second chip selection signal in response to the remapping control signal, a first AND gate configured to perform an AND logic operation on the first chip identification signal and the second chip identification signal, a second AND gate configured to perform an AND logic operation on the first chip identification signal and the address bit signal, a third AND gate configured to perform an AND logic operation on an inversion signal of the first chip identification signal and the second chip identification signal, a fourth AND gate configured to perform an AND logic operation on the inversion signal of the first chip identification signal and the address bit signal, a fifth AND gate configured to perform an AND logic operation on the first chip identification signal and an inversion signal of the second chip identification signal, a sixth AND gate configured to perform an AND logic operation on the first chip identification signal and an inversion signal of the address bit signal, a seventh AND gate configured to perform an AND logic operation on the inversion signal of the first chip identification signal and the inversion signal of the second chip identification signal, an eighth AND gate configured to perform an AND logic operation on the inversion signal of the first chip identification signal and the inversion signal of the address bit signal, a first multiplexer configured to select one of an output signal of the first AND gate, an output signal of the second AND gate, the first chip identification signal and the address bit signal in response to the remapping control signal, a second multiplexer configured to select one of an output signal of the third AND gate, an output signal of the fourth AND gate, the inversion signal of the first chip identification signal and the inversion signal of the address bit signal in response to the remapping control signal, a third multiplexer configured to select one of an output signal of the fifth AND gate, an output signal of the sixth AND gate, the first chip identification signal and the address bit signal in response to the remapping control signal, a fourth multiplexer configured to select one of an output signal of the seventh AND gate, an output signal of the eighth AND gate, the inversion signal of the first chip identification signal and the inversion signal of the address bit signal in response to the remapping control signal, a ninth AND gate configured to perform an AND logic operation on an output signal of the chip selection multiplexer and an output signal of the first multiplexer to generate a fourth internal chip selection signal, a tenth AND gate configured to perform an AND logic operation on the output signal of the chip selection multiplexer and an output signal of the second multiplexer to generate a third internal chip selection signal, an eleventh AND gate configured to perform an AND logic operation on the inversion signal of the first chip selection signal and an output signal of the third multiplexer to generate a second internal chip selection signal, and a twelfth AND gate configured to perform an AND logic operation on the inversion signal of the first chip selection signal and an output signal of the fourth multiplexer to generate a first internal chip selection signal.

The address remapping circuit may generate a first internal chip selection signal and a second internal chip selection signal, and the semiconductor dies may include a first semiconductor die that is accessed when the first internal chip selection signal is activated and a second semiconductor die that is accessed when the second internal chip selection signal is activated.

The input terminals may include four input terminals for receiving a first chip selection signal, a second chip selection signal, a chip identification signal an address bit signal, respectively, and the stacked memory device may selectively perform one of a first interface mode receiving the first chip selection signal and the second chip selection signal as the input signals, a second interface mode receiving the first chip selection signal and the chip identification signal as the input signals, and a third interface mode receiving the first chip selection signal and the address bit signal as the input signals.

The address remapping circuit may include a first inverter configured to invert the first chip selection signal, a second inverter configured to invert the second chip selection signal, a chip selection multiplexer configured to select one of an inversion signal of the first chip selection signal and an inversion signal of the second chip selection signal in response to the remapping control signal, a first multiplexer configured to select one of a power supply voltage, the chip identification signal and the address bit signal in response to the remapping control signal, a second multiplexer configured to select one of the power supply voltage, an inversion signal of the chip identification signal and an inversion signal of the address bit signal in response to the remapping control signal, a first AND gate configured to perform an AND logic operation on an output signal of the chip selection multiplexer and an output signal of the first multiplexer to generate a second internal chip selection signal, and a second AND gate configured to perform an AND logic operation on the inversion signal of the first chip selection signal and an output signal of the second multiplexer to generate a first internal chip selection signal.

The address remapping circuit may generate first through eighth internal chip selection signals, and the semiconductor dies may include first through eighth semiconductor dies that are accessed respectively when a corresponding one of the first through eighth internal chip selection signals is activated.

The input terminals may include seven input terminals for receiving a first chip selection signal, a second chip selection signal, a third chip selection signal, a fourth chip selection signal, a first chip identification signal, a second chip identification signal and a third chip identification signal, respectively.

The stacked memory device may selectively perform one of a first interface mode receiving the first chip selection signal, the second chip selection signal, the third chip selection signal, the fourth chip selection signal and the first chip identification signal as the input signals, a second interface mode receiving the first chip selection signal, the second chip selection signal, the first chip identification signal and the second chip identification signal as the input signals, and a third interface mode receiving the first chip selection signal, the first chip identification signal, the second chip identification signal and the third chip identification signal as the input signals.

The input terminals may further include three input terminals for receiving a first address bit signal, a second address bit signal and a third address bit signal, respectively.

The stacked memory device may be further configured to selectively perform one of a fourth interface mode receiving the first chip selection signal, the second chip selection signal, the third chip selection signal, the fourth chip selection signal and the first address bit signal as the input signals, a fifth interface mode receiving the first chip selection signal, the second chip selection signal, the first address bit signal and the second address bit signal as the input signals, and a sixth interface mode receiving the first chip selection signal, the first address bit signal, the second address bit signal and the third address bit signal as the input signals.

The stacked memory device may be further configured to selectively perform one of a seventh interface mode receiving the first chip selection signal, the second chip selection signal, the first chip identification signal and the first address bit signal as the input signals, an eighth interface mode receiving the first chip selection signal, the first chip identification signal, the second chip identification signal and the first address bit signal as the input signals, and a ninth interface mode receiving the first chip selection signal, the first chip identification signal, the first address bit signal and the second address bit signal as the input signals.

According to example embodiments, a memory system includes an address remapping circuit and a first set of memory devices. The address remapping circuit includes a plurality of input terminals for receiving a plurality of chip selection signals and a plurality of chip identification signals, and the address remapping circuit is configured to receive input signals corresponding to a portion of the plurality of chip selection signals and the plurality of chip identification signals through corresponding input terminals of the plurality of input terminals and configured to generate a plurality of internal chip selection signals based on the input signals and a remapping control signal. Each of the first set of memory devices is configured to be selected in response to a corresponding internal chip selection signal of the plurality of internal chip selection signals.

According to example embodiments, a memory system includes a base substrate, a master semiconductor die stacked on the base substrate and a plurality of slave semiconductor dies stacked on the master semiconductor die. The master semiconductor die includes an address remapping circuit and the address remapping circuit includes a plurality of input terminals for receiving a plurality of chip selection signals and a plurality of chip identification signals from an external device. The address remapping circuit receives input signals corresponding to a portion of the plurality of chip selection signals and the plurality of chip identification signals through valid input terminals corresponding to a portion of the plurality of input terminals and generates a plurality of internal chip selection signals based on the input signals and a remapping control signal. Each of the master semiconductor die and the slave semiconductor dies includes a memory device that receives each of the internal chip selection signals.

According to example embodiments, a memory system includes a base substrate, an interface semiconductor die stacked on the base substrate, and a plurality of memory semiconductor dies stacked on the interface semiconductor die. The interface semiconductor die buffers command-address signals received from an external device and the memory semiconductor dies receive the buffered command-address signals from the interface semiconductor die. The master semiconductor die includes an address remapping circuit and the address remapping circuit includes a plurality of input terminals for receiving a plurality of chip selection signals and a plurality of chip identification signals from the external device. The address remapping circuit receives input signals corresponding to a portion of the plurality of chip selection signals and the plurality of chip identification signals through valid input terminals corresponding to a portion of the plurality of input terminals and generates a plurality of internal chip selection signals based on the input signals and a remapping control signal. Each of the semiconductor dies includes a memory device that receives each of the internal chip selection signals.

According to example embodiments, a memory module includes a module substrate, a plurality of stacked memory chips mounted on the module substrate, a buffer chip mounted on the module substrate, and an address remapping circuit. The buffer chip buffers command-address signals from an external device and transfer the buffered command-address signals to the memory chips and configured to transfer a remapping control signal based on interface mode information. The address remapping circuit includes a plurality of input terminals for receiving a plurality of input signals from an external device. The address remapping circuit receives a first set of input signals corresponding to a portion of the plurality of input signals through a first set of input terminals corresponding to a portion of the plurality of input terminals and generates a plurality of internal chip selection signals based on the first set of input signals and the remapping control signal. Each memory chip of the plurality of stacked memory chips is selected by at least one of the plurality of internal chip selection signals. The first set of input signals is selected from the plurality of input signals in response to the remapping control signal.

The first set of input signals corresponding to the first set of input terminals includes at least one of chip selection signals and at least one of chip identification signals.

The first set of input signals further includes at least one of address bit signal.

According to example embodiments, a memory system includes a memory controller; and at least one stacked memory device controlled by the memory controller. The stacked memory device includes an address remapping circuit and a plurality of semiconductor dies stacked vertically. The address remapping circuit includes a plurality of input terminals for receiving a plurality of chip selection signals and a plurality of chip identification signals from the memory controller. The address remapping circuit receives input signals corresponding to a portion of the plurality of chip selection signals and the plurality of chip identification signals through valid input terminals corresponding to a portion of the plurality of input terminals and generates a plurality of internal chip selection signals based on the input signals and a remapping control signal. Each of the semiconductor dies includes a memory device that receives each of the internal chip selection signals.

According to example embodiments, there is provided a method of performing an address remapping operation in a stacked memory device including a plurality of semiconductor dies stacked vertically. The method includes connecting the stacked memory device to a memory controller, providing product information of the stacked memory device to the memory controller, determining input signals for interfacing between the stacked memory device and the memory controller, the input signals corresponding to a portion of a plurality of chip selection signals and a plurality of chip identification signals, providing interface mode information to the stacked memory device, the interface mode information representing a combination of the input signals, generating a remapping control signal based on the interface mode information and generating a plurality of internal chip selection signals for selectively accessing the semiconductor dies based on the remapping control signal and the input signals.

The internal chip selection signals may be generated by an address remapping circuit including a plurality of input terminals for receiving the plurality of chip selection signals and the plurality of chip identification signals from the memory controller. The address remapping circuit receives the input signals through valid input terminals corresponding to a portion of the plurality of input terminals and generates the plurality of internal chip selection signals based on the input signals and the remapping control signal.

Generating the remapping control signal may include changing a control value of the remapping control signal depending on different combinations of the input signals received through the valid input terminals.

Generating the plurality of internal chip selection signals may include activating one of the internal chip selection signals, when the stacked memory device is accessed, to select one of the semiconductor dies in the stacked memory device.

The stacked memory device, the memory chip, the memory module, the memory system and the address remapping method may be applied adaptively to various devices and systems to enhance performance of the devices and the systems by performing an optimized address remapping operation depending on the provided address management scheme.

According to example embodiments, a memory system includes a register, an address remapping circuit address remapping circuit, and a plurality of memory devices. The register may be programmable to store interface mode information. The address remapping circuit includes a plurality of input terminals for receiving a plurality of input signals, is configured to receive input signals from a first set of the plurality of input terminals in response to a first value of the interface mode information stored in the register. The address remapping circuit is configured to receive input signals from a second set of the plurality of input terminals in response to a second value of the interface mode information stored in the register. The address remapping circuit is configured to generate a plurality of internal chip selection signals based on the input signals. Each of the plurality of memory devices is configured to be selected in response to a corresponding internal chip selection signal of the plurality of internal chip selection signals.

BRIEF DESCRIPTION OF THE DRAWINGS

Example embodiments of the inventive concept will be more clearly understood from the following detailed description taken in conjunction with the accompanying drawings.

FIGS. 18A through 18I are diagram illustrating truth tables for describing interface modes performed by the memory system of FIG. 17 according to example embodiments.

DETAILED DESCRIPTION OF THE EMBODIMENTS

Figure 1:
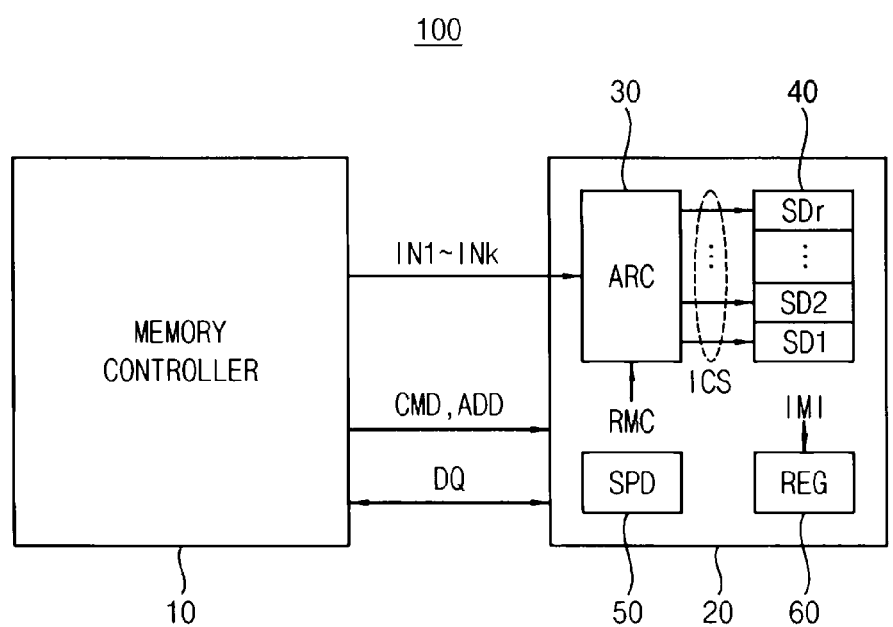
FIG. 1 is a block diagram illustrating a memory system according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unlesss indicated otherwise, these terms are only used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In this disclosure, the chip selection signals may be signals for selecting one semiconductor die (e.g., one memory chip) and the chip identification signals may be signals for selecting one rank in each semiconductor die. Accordingly, each semiconductor die may receive one chip selection signal and one or more chip identification signals in a conventional stacked memory device.

Figure 2:
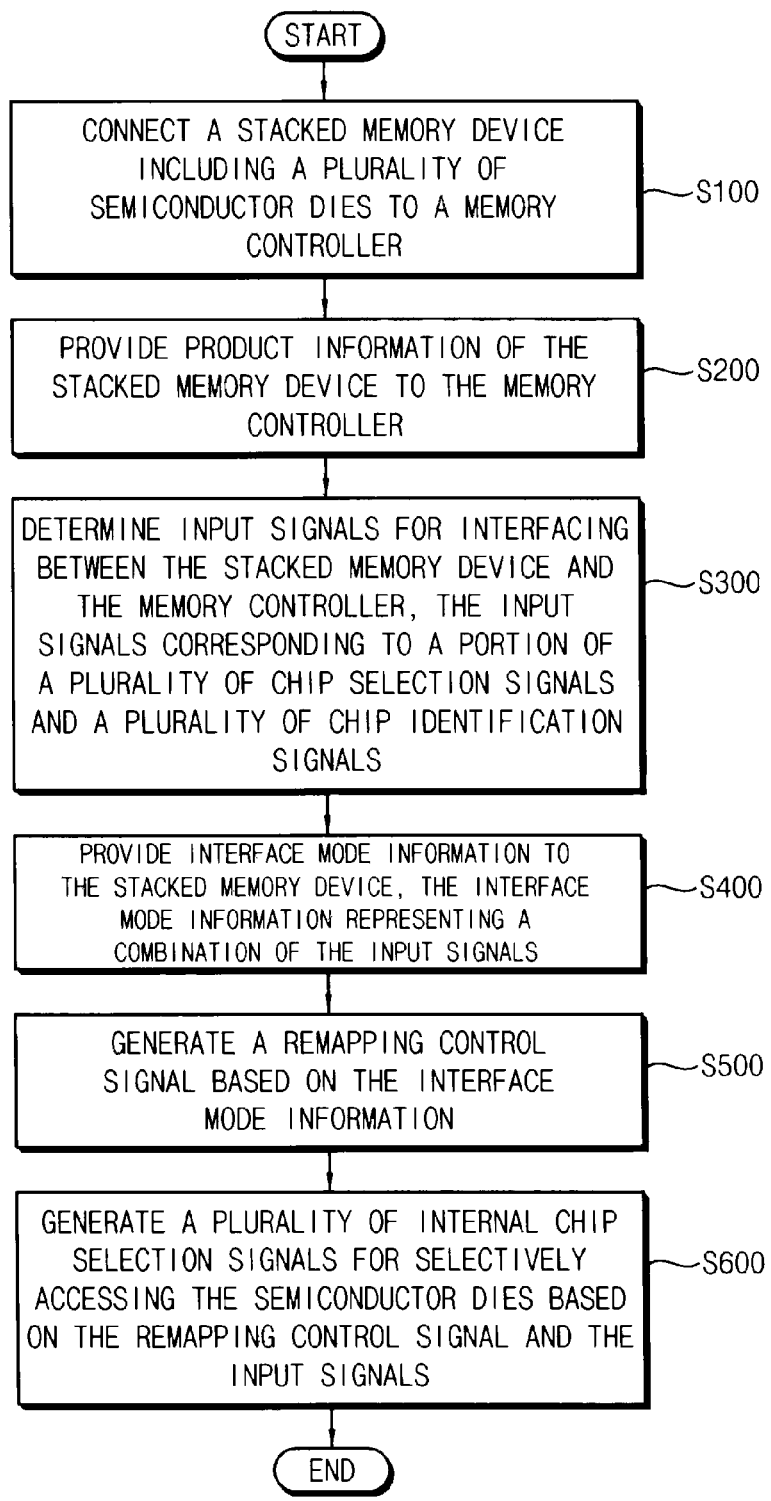
FIG. 2 is a flow chart illustrating an address remapping method according to example embodiments.

FIG. 1 is a block diagram illustrating a memory system according to example embodiments, and FIG. 2 is a flow chart illustrating an address remapping method according to example embodiments.

Referring to FIG. 1, a memory system includes a memory controller 10 and a stacked memory device 20. The stacked memory device 20 includes an address remapping circuit ARC 30 and a plurality of semiconductor dies SD1~SDr 40 (e.g., a set of semiconductor dies). In one embodiment, the semiconductor dies 40 may be stacked vertically and each of the semiconductor dies 40 may correspond to a memory device or a memory chip. In some example embodiments, the stacked memory device 20 may further include a serial-presence detect (SPD) device 50 and/or a register REG 60. The memory controller 10 may transmit input signals IN1~INk, a command signal CMD and address signals ADD to the stacked memory device 20, and data DQ may be transferred between the memory controller 10 and the stacked memory device 20 based on the signals IN1~INk, CMD and ADD. The k is a positive integer.

As used herein, a semiconductor memory device may refer to various items such as a memory array with one or more logic devices or memory cells formed in or on a semiconductor substrate, a semiconductor chip, a memory chip, a memory die, a semiconductor die, a logic chip, a package, or combinations thereof. A semiconductor chip, such as a memory chip, or a logic chip may be formed from a wafer. A semiconductor memory device may comprise a package which may include one or more chips stacked on a package substrate, or a package-on-package device including a plurality of packages.

An electronic device or a memory system, as used herein, may refer to one of these devices and may also include products that include these devices, such as a memory card, a memory module, a hard drive including additional components, a mobile phone, laptop, tablet, desktop, camera, server, computing system, or other consumer electronic device.

Referring to FIGS. 1 and 2, the stacked memory device 20 may be connected to a memory controller 10 (S100). In some example embodiments, the stacked memory device 20 may be packaged with the memory controller 10 in a chip-on-chip structure and the stacked memory device 20 and the memory controller 10 may be electrically connected through, for example, bonding wires and/or through-substrate vias (e.g., through-silicon vias) TSVs. In other example embodiments, the memory controller 10 is mounted on a printed circuit board. The stacked memory device 20 may be mounted on a module substrate and the module substrate may be inserted in a module slot that is mounted on the printed circuit board. The stacked memory device 20 and the memory controller 10 may be electrically connected through signal path of the printed circuit board.

Product information of the stacked memory device 20 may be provided to the memory controller 10 (S200). For example, the product information may be stored in the SPD device 50 or an electrically-erasable-programmable read-only memory (EEPROM) device. The SPD device 50 may store data for representing various attributes of a memory device or a memory module. For example, the SPD device 50 may store data for representing a number of row addresses, a number of column addresses, data width, a number of ranks, a memory density per rank, a number of the semiconductor dies, a memory density per semiconductor die, etc. The SPD device 50 may provide the product information to the memory controller 10 or a basic input-output system (BIOS) of a computing system including the memory system 100.

The memory controller 10 or the BIOS may determine a first set of input signals among a plurality of possible input signals IN1~INk corresponding to a portion of a plurality of chip selection signals and a plurality of chip identification signals for interfacing between the stacked memory device 20 and the memory controller 10 (S300). In one embodiment, the plurality of input signals IN1~INk may further correspond to a portion of a plurality of address bit signals. The command signal CMD and the address signals ADD may be distinct from and may be received via different input terminals from the input signals IN1~Ink. The chip selection signals, the chip identification signals, the command address signal CMD and the address signals ADD may be distinct from each other. For example, the command signal CMD may include an clock enable signal (CKE), a row address strobe signal (/RAS), a column address strobe signal (/CAS), a write enable signal (/WE), etc. The address signals ADD may include a row address ROW_ADDR, a column address COL_ADDR, and a bank address BANK_ADDR. In some example embodiments, the input signals IN1~INk may further include at least one address bit signal that is distinct from the address signals ADD. The address bit signal in the input signals IN1~INk may be a most significant address bit signal that is reserved for other uses.

The memory controller 10 or the BIOS may provide interface mode information IMI to the stacked memory device 20 (S400). The interface mode information IMI may indicate which set of terminals 70 of the stacked memory device 20 are used to receive the input signals IN1~INk and which terminals 70 of the stacked memory device 20 are unused. In some example embodiments, the interface mode information IMI may be stored in the register 60. The register 60 may be a register of a mode register set 212 included in a memory device 201 of FIG. 4 or a register REG of a buffer chip BC included in a memory module 501 of FIG. 23.

In one embodiment, the register 60 may generate a remapping control signal RMC based on the interface mode information IMI (S500). The remapping control signal RMC may have a control value that is changed depending on different combinations of the input signals IN1~INk. In some examples, the control logic (e.g., control logic 210 included in the memory device 201 of FIG. 4) or an external source (such as the buffer chip BC included in the memory module 501 of FIG. 23) may generate the remapping control signal RMC. In some examples, the interface mode information IMI and the remapping control signal RMC may be the same logic values (e.g., both 0,0, or both 1,0, etc.).

The address remapping circuit 30 in the stacked memory device 20 may generate a plurality of internal chip selection signals ICS for selectively accessing the semiconductor dies SD1~SDr based on the remapping control signal RMC and the input signals IN1~INk (S600).

The memory controller 10 or the BIOS may optimize the combination of the input signals IN1~INk according to a provided address remapping scheme (e.g., interface mode information). The memory controller 10 or the BIOS may consider the layout restrictions of the memory system 100, the control resource restrictions of the memory controller 10, the status control of the respective semiconductor dies SD1~SDr, etc. to optimize the combination of the input signals IN1~INk.

As such, the stacked memory device, the memory system including the stacked memory device and the address remapping method may be applied adaptively to various devices and systems to enhance performance of the devices and the systems by performing an optimized address remapping operation depending on the provided address management scheme.

Figure 3:
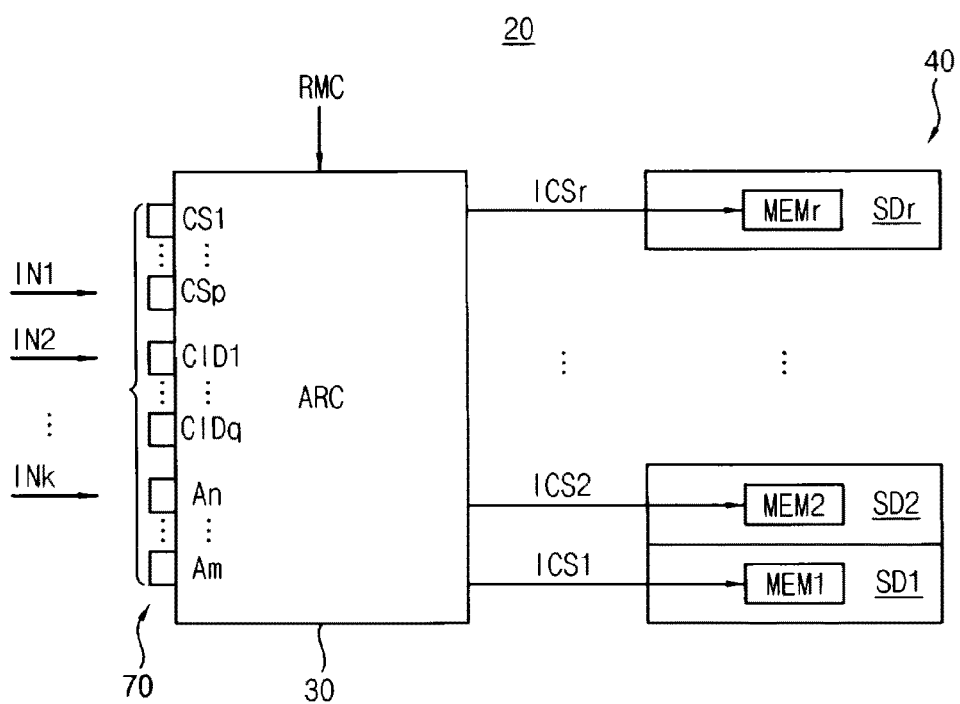
FIG. 3 is a block diagram illustrating a stacked memory device according to example embodiments.

FIG. 3 is a block diagram illustrating a stacked memory device according to example embodiments.

Referring to FIG. 3, a stacked memory device 20 may include an address remapping circuit ARC 30 and a plurality of semiconductor dies SD1~SDr 40.

The address remapping circuit 30 may include a plurality of input terminals 70 for receiving a plurality of chip selection signals CS1~CSp and a plurality of chip identification signals CID1~CIDq. In some example embodiments, the address remapping circuit 30 may further include the input terminals 70 that may be used for receiving one or more address bit signals An~Am.

The address remapping circuit 30 may receive input signals IN1~INk corresponding to a portion of the plurality of chip selection signals CS1~CSp and the plurality of chip identification signals CID1~CIDq through valid input terminals (e.g., a first set of input terminals) corresponding to a portion of the plurality of input terminals 70. When the address remapping circuit 30 further includes the input terminals 70 for receiving the address bit signals An~Am, the input signals IN1~INk may correspond to a portion of the plurality of chip selection signals CS1~CSp, the plurality of chip identification signals CID1~CIDq and the address bit signals An~Am. Other input terminals 70 of the remapping circuit 30 that are accessible to sources external to the stacked memory device 20 (e.g., external terminals of the stacked memory device 20) may be unused. These unused input terminals may be designed to receive chip select signal(s), chip identification signal(s) and/or address bit signal(s).

The address remapping circuit 30 may generate a plurality of internal chip selection signals ICS1~ICSr based on the input signals IN1~INk and the remapping control signal RMC. As described herein, the address remapping circuit 30 may activate one of the internal chip selection signals ICS1~ICSr, when the stacked memory device 20 is accessed, to select one of the semiconductor dies SD1~SDr in the stacked memory device 20. When the stacked memory device 20 is not accessed, all of the internal chip selection signals ICS1~ICSr may be deactivated and any of the semiconductor dies SD1~SDr may not be selected.

The semiconductor dies SD1~SDr may be stacked vertically and include memory devices MEM1~MEMr, respectively. The memory devices MEM1~MEMr may receive the internal chip selection signals ICS1~ICSr, respectively.

The address remapping circuit 30 may include the redundant number of the input terminals 70. The address remapping circuit 30 may include one or more unused terminals 70 that may be configured to receive input signals but remain unused. Thus, the number of input terminals 70 may be more than the number used to receive input signals IN1~INk, to implement the adaptive address remapping according to example embodiments. The adaptive address remapping may be implemented by providing the redundant number of the input terminals 70 that may be configured to receive the different combinations of the input signals IN1~INk and by changing the control value of the remapping control signal RMC depending on the connections made to the input terminals 70 of the stacked memory device 20 to receive the input signals IN1~INk. Example configurations and operations of the address remapping circuit 30 will be described below with reference to FIGS. 5 through 18I.

Figure 4:
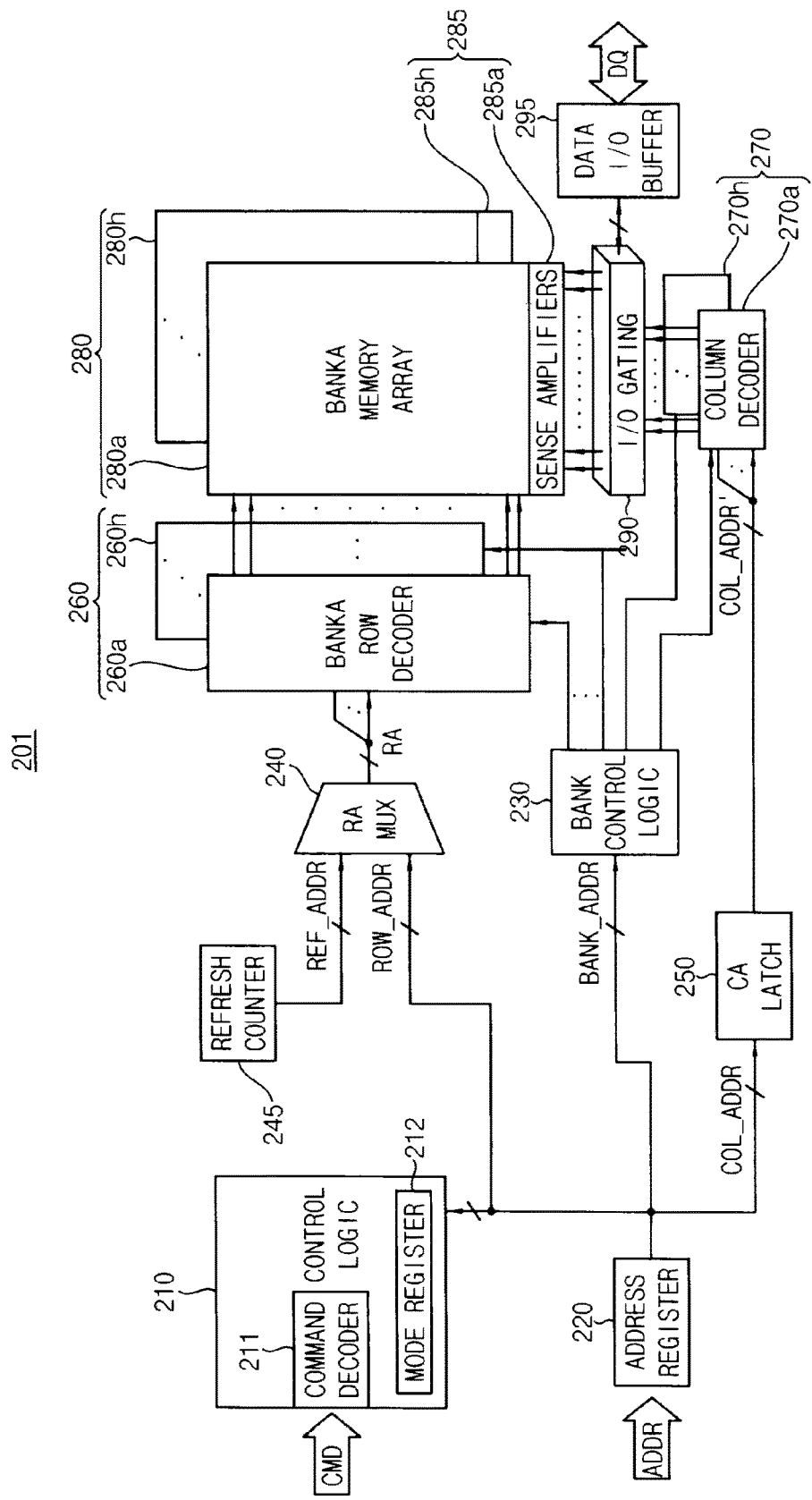
FIG. 4 is a block diagram illustrating an example of a memory device that is formed in each semiconductor die in the stacked memory device of FIG. 3 according to example embodiments.

FIG. 4 is a block diagram illustrating an example of a memory device that is formed in each semiconductor die in the stacked memory device of FIG. 3 according to example embodiments.

Referring to FIG. 4, a memory device 201 may include a control logic 210, an address register 220, a bank control logic 230, a row address multiplexer 240, a column address latch 250, a row decoder 260, a column decoder 270, a memory cell array 280, a sense amplifier unit 285, an input/output (I/O) gating circuit 290, a data input/output (I/O) buffer 295, and a refresh counter 245.

The memory cell array 280 may include a plurality of bank arrays, e.g., first through eighth bank arrays 280a~280h. The row decoder 260 may include first through eighth bank row decoders 260a~260h respectively coupled to the first through eighth bank arrays 280a~280h, the column decoder 270 may include first through eighth bank column decoders 270a~270h respectively coupled to the first through eighth bank arrays 280a~280h, and the sense amplifier unit 285 may include first through eighth bank sense amplifiers 285a~285h respectively coupled to the first through eighth bank arrays 280a~280h. The first through eighth bank arrays 280a~280h, the first through eighth bank row decoders 260a~260h, the first through eighth bank column decoders 270a~270h and first through eighth bank sense amplifiers 285a~285h may form first through eighth banks. Although the memory device 201 is illustrated in FIG. 4 as including eight banks, the memory device 201 may include any number of banks.

The address register 220 may receive an address ADDR including a bank address BANK_ADDR, a row address ROW_ADDR and a column address COL_ADDR from the memory controller. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address COL_ADDR' to the first through eighth bank column decoders 270a~270h.

The activated one of the first through eighth bank column decoders 270a~270h may decode the column address COL_ADDR' that is output from the column address latch 250, and may control the input/output gating circuit 290 in order to output data corresponding to the column address COL_ADDR'.

The I/O gating circuit 290 may include a circuitry for gating input/output data. The I/O gating circuit 290 may further include read data latches for storing data that is output from the first through eighth bank arrays 280a~280h, and write drivers for writing data to the first through eighth bank arrays 280a~280h.

Data DQ to be read from one bank array of the first through eighth bank arrays 280a~280h may be sensed by a sense amplifier coupled to the one bank array from which the data is to be read, and may be stored in the read data latches. The data stored in the read data latches may be provided to the memory controller 15 via the data I/O buffer 295. Data DQ to be written in one bank array of the first through eighth bank arrays 280a~280h may be provided to the data I/O buffer 295 from the memory controller 10. The write driver may write the data DQ in one bank array of the first through eighth bank arrays 280a~280h.

The control logic 210 may control operations of the memory device 201. For example, the control logic 210 may generate control signals for the memory device 201 in order to perform a write operation or a read operation. The control logic 210 may include a command decoder 211 that decodes a command CMD received from the memory controller and a mode register set 212 that sets an operation mode of the memory device 201.

For example, the command decoder 211 may generate the control signals corresponding to the command CMD by decoding a write enable signal (/WE), a row address strobe signal (/RAS), a column address strobe signal (/CAS), a chip selection signal (/CS), etc.

The chip selection signal /CS, which is received by the command decoder 211, may be the internal chip selection signal ICSi among the internal chip selection signals ICS1~ICSr generated by the address remapping circuit 30 or the inverted internal chip selection signal /ICSi, which corresponds to the semiconductor die SDi including the memory device 201 of FIG. 4. For example, each of the semiconductor dies SD1~SDr in FIG. 3 may include the memory device 201 of FIG. 4 that receives the corresponding internal chip selection signal ICSi or the inverted internal chip selection signal /ICSi.

As mentioned above, the input signals IN1~INk received by the address remapping circuit 30 may include one or more address bit signals An~Am. In this case, the address register 220 of the memory device 201 may receive lower address bit signals A0~An−1 (e.g., of lesser significance) and the address remapping circuit 30 in FIG. 3 may receive upper address bit signals An~Am (e.g., of more significance) that are distinct from the lower address bit signals A0~An−1 received by the memory device 201.

Hereinafter, example configurations and operations of the address remapping circuit 30 will be described below with reference to FIGS. 5 through 18I, in which 'H' represents a logic high level, 'L' represents a logic low level, 'X' represents a disabled state and 'DC' represents 'don't care the logic level'.

In example embodiments of FIGS. 5 through 18I, chip selection signals CS1~CSp may be low active signals, and chip identification signals CID1~CIDq and internal chip selection signals ICS1~ICSr may be high active signals. The activation logic levels of the signals may be changed depending on circuit configurations. As described above, the internal chip selection signal ICS1~ICSr or the inverted internal chip selection signals may be provided to the memory devices MEM1~MEMr in the semiconductor dies SD1~SDr, respectively.

Figure 5:
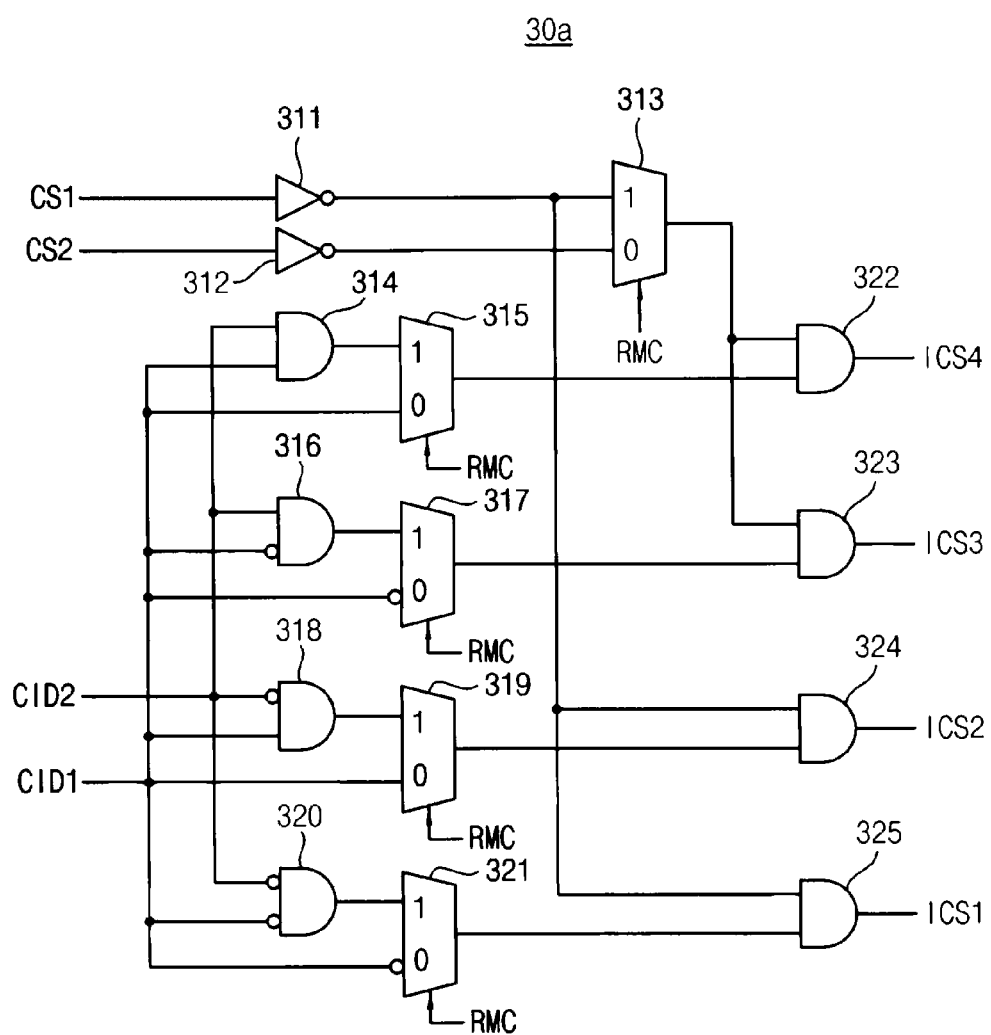
FIG. 5 is a circuit diagram illustrating an address remapping circuit according to example embodiments.

FIG. 5 is a circuit diagram illustrating an address remapping circuit according to example embodiments.

Referring to FIG. 5, an address remapping circuit 30a may include four input terminals for receiving a first chip selection signal CS1, a second chip selection signal CS2, a first chip identification signal CID1 and a second chip identification signal CID2, respectively. The address remapping circuit 30a may generate a first internal chip selection signal ICS1, a second internal chip selection signal ICS2, a third internal chip selection signal ICS3 and a fourth internal chip selection signal ICS4 based on the remapping control signal RMC. In one embodiment, a portion of the first chip selection signal CS1, the second chip selection signal CS2, the first chip identification signal CID1 and the second chip identification signal CID2 may be provided to the address remapping circuit 30a as the input signals, and the remapping control signal RMC may have a control value that is changed depending on the different combinations of the input signals.

The address remapping circuit 30a may include first and second inverters 311 and 312, a chip selection multiplexer 313, first through eighth AND gates 314, 316, 318, 320, 322, 323, 324 and 325, and first through fourth multiplexers 315, 317, 319 and 321.

The first inverter 311 may invert the first chip selection signal CS1 and the second inverter 312 may invert the second chip selection signal CS2. The chip selection multiplexer may select one of an inversion signal of the first chip selection signal CS1 and an inversion signal of the second chip selection signal CS2 in response to the remapping control signal RMC.

The first AND gate 314 may perform an AND logic operation on the first chip identification signal CID1 and the second chip identification signal CID2. The second AND gate 316 may perform an AND logic operation on an inversion signal of the first chip identification signal CID1 and the second chip identification signal CID2. The third AND gate 318 may perform an AND logic operation on the first chip identification signal CID1 and an inversion signal of the second chip identification signal CID2. The fourth AND gate 320 may perform an AND logic operation on the inversion signal of the first chip identification signal CID1 and the inversion signal of the second chip identification signal CID2.

The first multiplexer 315 may select one of an output signal of the first AND gate 314 and the first chip identification signal CID in response to the remapping control signal RMC. The second multiplexer 317 may select one of an output signal of the second AND gate 316 and the inversion signal of the first chip identification signal CID1 in response to the remapping control signal RMC. The third multiplexer 319 may select one of an output signal of the third AND gate 318 and the first chip identification signal CID1 in response to the remapping control signal RMC. The fourth multiplexer 321 may select one of an output signal of the fourth AND gate 320 and the inversion signal of the first chip identification signal CID1 in response to the remapping control signal RMC.

The fifth AND gate 322 may perform an AND logic operation on an output signal of the chip selection multiplexer 313 and an output signal of the first multiplexer 315 to generate a fourth internal chip selection signal ICS4. The sixth AND gate 323 may perform an AND logic operation on the output signal of the chip selection multiplexer 313 and an output signal of the second multiplexer 317 to generate a third internal chip selection signal ICS3. The seventh AND gate 324 may perform an AND logic operation on the inversion signal of the first chip selection signal CS1 and an output signal of the third multiplexer 319 to generate a second internal chip selection signal ICS2. The eighth AND gate 325 may perform an AND logic operation on the inversion signal of the first chip selection signal CS1 and an output signal of the fourth multiplexer 321 to generate a first internal chip selection signal ICS1.

The remapping control signal RMC provided to the address remapping circuit 30a of FIG. 5 may be a one-bit signal. The terminals '0' of the chip selection multiplexer 313 and the first through multiplexers 315, 317, 219 and 321 may be selected when the remapping control signal RMC has a first control value (e.g. a logic low value '0'), and the terminals '1 of the chip selection multiplexer 313 and the first through multiplexers 315, 317, 219 and 321 may be selected when the remapping control signal RMC has a second control value (e.g. a logic high value '1'). As a result, the first chip selection signal CS1, the second chip selection signal CS2 and the first chip identification signal CID1 may be received as the three input signals IN1, IN2 and IN3 when the remapping control signal RMC has the first control value (e.g. '0'), and the first chip selection signal CS1, the first chip identification signal CID1 and the second chip identification signal CID2 may be received as the three input signals IN1, IN2 and IN3 when the remapping control signal RMC has the second control value (e.g. '1').

In one embodiment, a first interface mode may refer to the case that the remapping control signal RMC has the first control value (e.g., '0'), that is, when the first chip selection signal CS1, the second chip selection signal CS2 and the first chip identification signal CID1 are received as the three input signals IN1, IN2 and IN3, and a second interface mode may refer to the case that the remapping control signal RMC has the second control value (e.g., '1'), that is, when the first chip selection signal CS1, the first chip identification signal CID1 and the second chip identification signal CID2 are received as the three input signals IN1, IN2 and IN3. For example, a first set of input signals (e.g., CS1, CS2, and CID1) may be selected from the plurality of input signals (e.g., CS1, CS2, CID1, and CID2) in response to the remapping control signal RMC having the first control value '0', and a second set of input signals (e.g., CS1, CID1, and CID2) may be selected from the plurality of input signals (e.g., CS1, CS2, CID1, and CID2) in response to the remapping control signal RMC having the second control value '1'. A logic value of each of the plurality of input signals (e.g., CS1, CS2, CID1, and CID2) and the remapping control signal RMC may be determined by interface mode information.

As such, the remapping control signal RMC may have the control value '0' or '1' that is changed depending on the different combinations of the first set of input signals IN1, IN2 and IN3 that are received through three valid input terminals among the four input terminals.

Figures 6A, 6B:
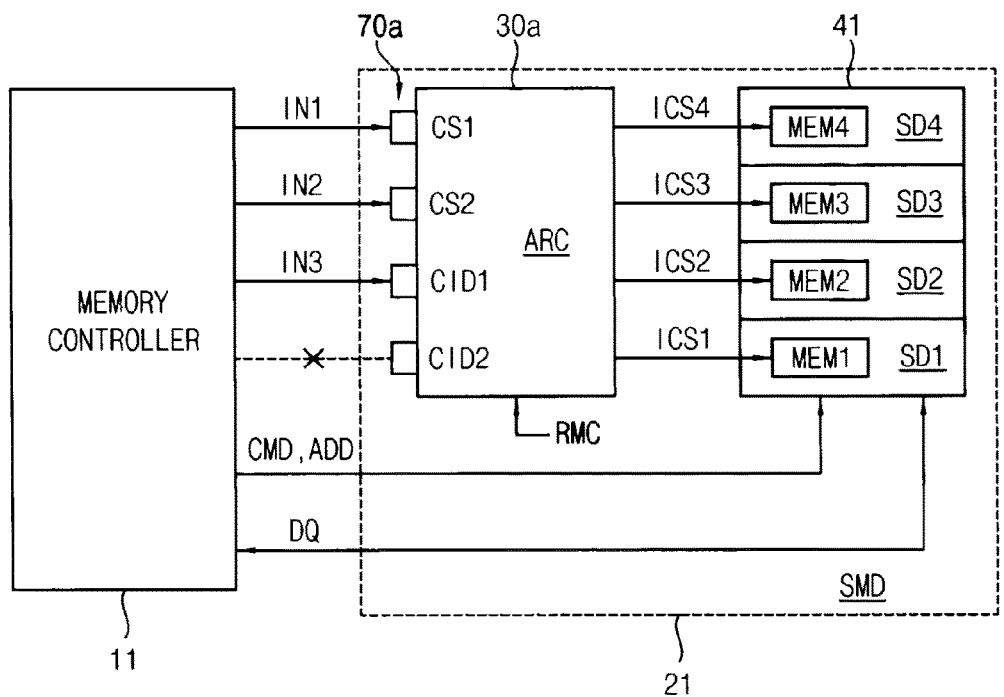
FIG. 6A is a block diagram illustrating an operation of a memory system in a first interface mode using the address remapping circuit of FIG. 5 according to an exemplary embodiment.
FIG. 6B is a diagram illustrating a truth table for describing the first interface mode performed by the memory system of FIG. 6A according to an exemplary embodiment.

FIG. 6A is a block diagram illustrating an operation of a memory system in a first interface mode using the address remapping circuit of FIG. 5 according to an exemplary embodiment, and FIG. 6B is a diagram illustrating a truth table for describing the first interface mode performed by the memory system of FIG. 6A according to an exemplary embodiment.

Referring to FIG. 6A, a memory system 101 may include a memory controller 11 and a stacked memory device 21. The stacked memory device 21 may include an address remapping circuit 30a and a plurality of semiconductor dies SD1~SD4 41.

The address remapping circuit 30a may include four input terminals for receiving a first chip selection signal CS1, a second chip selection signal CS2, a first chip identification signal CID1 and a second chip identification signal CID2. The address remapping circuit 30a may receive three input signals, for example, the first chip selection signal CS1, the second chip selection signal CS2 and the first chip identification signal CID1 as the input signals IN1, IN2 and IN3 through three valid input terminals among the four input terminals.

The address remapping circuit 30a may generate a first internal chip selection signal ICS1, a second internal chip selection signal ICS2, a third internal chip selection signal ICS3 and a fourth internal chip selection signal ICS4 based on the first chip selection signal CS1, the second chip selection signal CS2, the first chip identification signal CID1 and the remapping control signal RMC having the first control value '0'.

The semiconductor dies 41 may include a first semiconductor die SD1 that is accessed when the first internal chip selection signal ICS1 is activated, a second semiconductor die SD2 that is accessed when the second internal chip selection signal ICS2 is activated, a third semiconductor die SD3 that is accessed when the third internal chip selection signal ICS3 is activated and a fourth semiconductor die SD4 that is accessed when the fourth internal chip selection signal ICS4 is activated.

Referring to FIG. 6B, the first chip selection signal CS1, the second chip selection signal CS2 and the first chip identification signal CID1 may be enabled as the input signals IN1, IN2 and IN3, and the second chip identification signal CID2 may be disabled ('X'). In the truth table of FIG. 6B, the first through fourth cases represent that the stacked memory device 21 is accessed and the fifth case represents that the stacked memory device 21 is not accessed.

One of the first chip selection signal CS1 and the second chip selection signal CS2 may be activated in the logic low level L when the stacked memory device 21 is accessed. According to the logic levels of the first chip selection signal CS1, the second chip selection signal CS2 and the first chip identification signal CID1, only one of the first through fourth internal chip selection signals ICS1~ICS4 may be activated in the logic high level H. As described above, only one of the first through fourth semiconductor dies SD1~SD4 may be accessed in response to the first through fourth internal chip selection signals ICS1~ICS4 that are selectively activated.

When the stacked memory device 21 is not accessed, both of the first and second chip selection signals CS1 and CS2 may be deactivated in the logic high level H. All of the first through fourth internal chip selection signal ICS1~ICS4 may be deactivated in the logic low high level L regardless of the logic level of the first chip identification signal CID1 (e.g., 'DC').

Figures 7A, 7B:
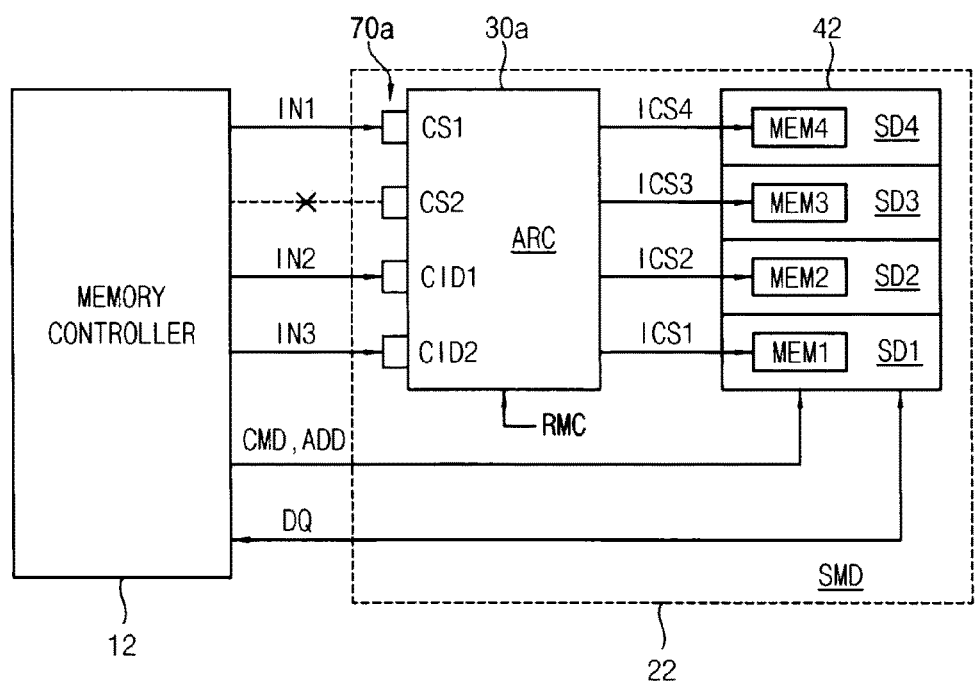
FIG. 7A is a block diagram illustrating an operation of a memory system in a second interface mode using the address remapping circuit of FIG. 5 according to an exemplary embodiment.
FIG. 7B is a diagram illustrating a truth table for describing the second interface mode performed by the memory system of FIG. 7A according to an exemplary embodiment.

FIG. 7A is a block diagram illustrating an operation of a memory system in a second interface mode using the address remapping circuit of FIG. 5 according to an exemplary embodiment, and FIG. 7B is a diagram illustrating a truth table for describing the second interface mode performed by the memory system of FIG. 7A according to an exemplary embodiment.

Referring to FIG. 7A, a memory system 102 may include a memory controller 12 and a stacked memory device 22. The stacked memory device 22 may include an address remapping circuit 30a and a plurality of semiconductor dies SD1~SD4 42.

The address remapping circuit 30a may include four input terminals for receiving a first chip selection signal CS1, a second chip selection signal CS2, a first chip identification signal CID1 and a second chip identification signal CID2. The address remapping circuit 30a may receive three input signals, for example, the first chip selection signal CS1, the first chip identification signal CID1 and the second chip identification signal CID2 as the input signals IN1, IN2 and IN3 through three valid input terminals among the four input terminals.

The address remapping circuit 30a may generate a first internal chip selection signal ICS1, a second internal chip selection signal ICS2, a third internal chip selection signal ICS3 and a fourth internal chip selection signal ICS4 based on the first chip selection signal CS1, the first chip identification signal CID1, the second chip identification signal CID2 and the remapping control signal RMC having the second control value '1'.

The semiconductor dies 42 may include a first semiconductor die SD1 that is accessed when the first internal chip selection signal ICS1 is activated, a second semiconductor die SD2 that is accessed when the second internal chip selection signal ICS2 is activated, a third semiconductor die SD3 that is accessed when the third internal chip selection signal ICS3 is activated and a fourth semiconductor die SD4 that is accessed when the fourth internal chip selection signal ICS4 is activated.

Referring to FIG. 7B, the first chip selection signal CS1, the first chip identification signal CID1 and the second chip identification signal CID2 may be enabled as the input signals IN1, IN2 and IN3, and the second chip selection signal CS2 may be disabled ('X'). In the truth table of FIG. 7B, the first through fourth cases represent that the stacked memory device 22 is accessed and the fifth case represents that the stacked memory device 22 is not accessed.

The first chip selection signal CS1 may be activated in the logic low level L when the stacked memory device 22 is accessed. According to the logic levels of the first chip selection signal CS1, the first chip identification signal CID1 and the second chip identification signal CID2, only one of the first through fourth internal chip selection signals ICS1~ICS4 may be activated in the logic high level H. As described above, only one of the first through fourth semiconductor dies SD1~SD4 may be accessed in response to the first through fourth internal chip selection signals ICS1~ICS4 that are selectively activated.

When the stacked memory device 22 is not accessed, the first chip selection signal CS1 may be deactivated in the logic high level H. All of the first through fourth internal chip selection signal ICS1~ICS4 may be deactivated in the logic low high level L regardless of the logic level of each of the first chip identification signal CID1 and the second chip identification signal CID2 (e.g., 'DC').

Figure 8:
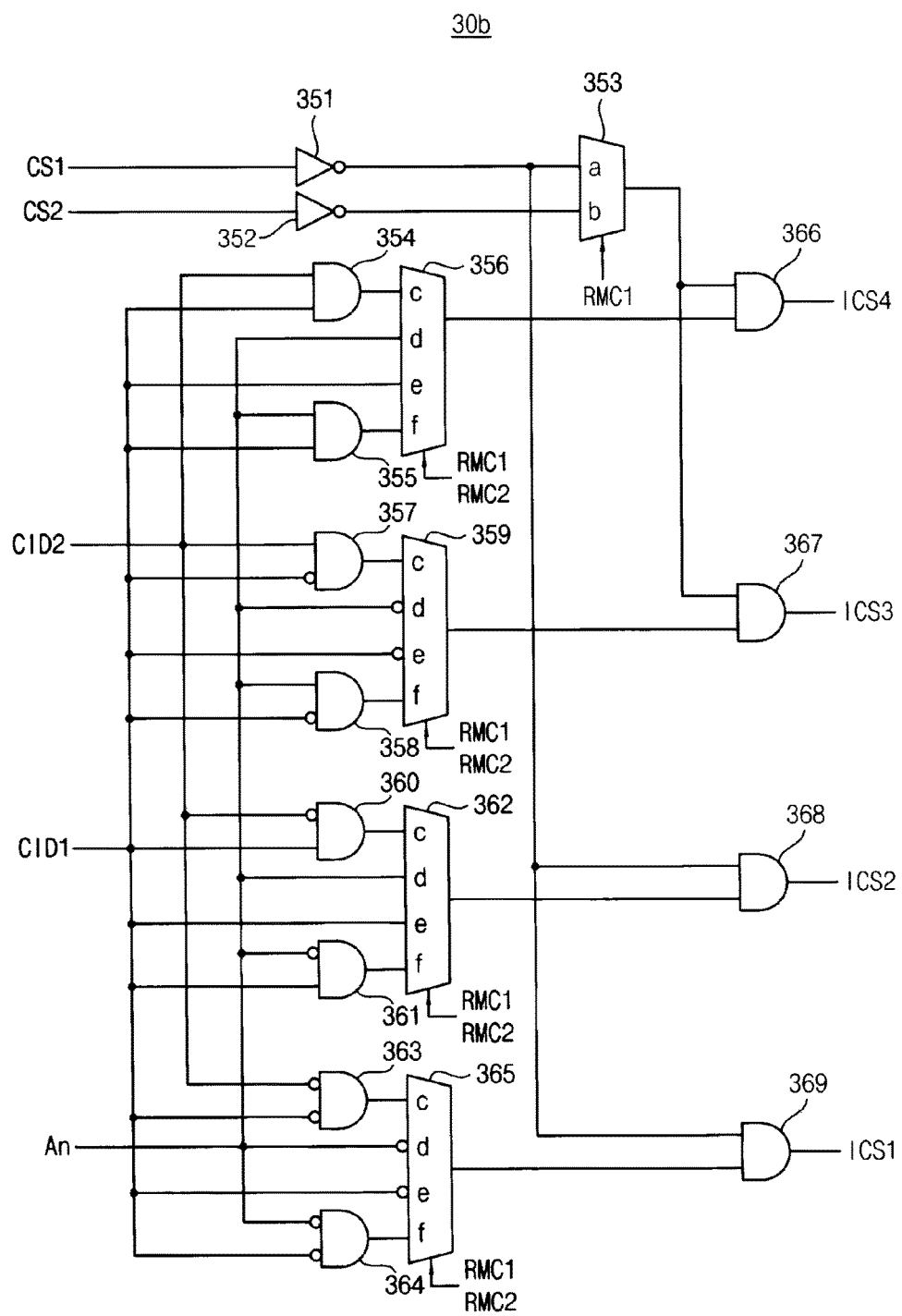
FIG. 8 is a circuit diagram illustrating an address remapping circuit according to example embodiments.

FIG. 8 is a circuit diagram illustrating an address remapping circuit according to example embodiments.

Referring to FIG. 8, an address remapping circuit 30b may include five input terminals for receiving a first chip selection signal CS1, a second chip selection signal CS2, a first chip identification signal CID1, a second chip identification signal CID2 and an address bit signal An, respectively. The address remapping circuit 30b may generate a first internal chip selection signal ICS1, s second internal chip selection signal ICS2, a third internal chip selection signal ICS3 and a fourth internal chip selection signal ICS4 based on the remapping control signal RMC. In one embodiment, a portion of the first chip selection signal CS1, the second chip selection signal CS2, the first chip identification signal CID1, the second chip identification signal CID2 and the address bit signal An may be provided to the address remapping circuit 30b as the input signals, and the remapping control signal RMC may have a control value that is changed depending on the different combinations of the input signals. The remapping control signal RMC may include a first bit signal RMC1 and a second bit signal RMC2.

The address remapping circuit 30b may include first and second inverters 351 and 352, a chip selection multiplexer 353, first through twelfth AND gates 354, 355, 357, 358, 360, 361, 363, 364, 366, 367, 368 and 369 and first through fourth multiplexers 356, 359, 362 and 365.

The first inverter 351 may invert the first chip selection signal CS1 and the second inverter 352 may invert the second chip selection signal CS2. The chip selection multiplexer 353 may select one of an inversion signal of the first chip selection signal CS1 and an inversion signal of the second chip selection signal CS2 in response to the first bit signal RMC1 of the remapping control signal RMC.

The first AND gate 354 may perform an AND logic operation on the first chip identification signal CID1 and the second chip identification signal CID2. The second AND gate 355 may perform an AND logic operation on the first chip identification signal CID1 and the address bit signal An. The third AND gate 357 may perform an AND logic operation on an inversion signal of the first chip identification signal CID1 and the second chip identification signal CID2. The fourth AND gate 358 may perform an AND logic operation on the inversion signal of the first chip identification signal CID1 and the address bit signal An. The fifth AND gate 360 may perform an AND logic operation on the first chip identification signal CID1 and an inversion signal of the second chip identification signal CID2. The sixth AND gate 361 may perform an AND logic operation on the first chip identification signal CID1 and an inversion signal of the address bit signal An. The seventh AND gate 363 may perform an AND logic operation on the inversion signal of the first chip identification signal CID1 and the inversion signal of the second chip identification signal CID2. The eighth AND gate 364 may perform an AND logic operation on the inversion signal of the first chip identification signal CID1 and the inversion signal of the address bit signal An.

The first multiplexer 356 may select one of an output signal of the first AND gate 354, an output signal of the second AND gate 355, the first chip identification signal CID1 and the address bit signal An in response to the first bit signal RMC1 and the second bit signal RMC2 of the remapping control signal RMC. The second multiplexer 359 may select one of an output signal of the third AND gate 357, an output signal of the fourth AND gate 358, the inversion signal of the first chip identification signal CID1 and the inversion signal of the address bit signal An in response to the first bit signal RMC1 and the second bit signal RMC2 of the remapping control signal RMC. The third multiplexer 362 may select one of an output signal of the fifth AND gate 360, an output signal of the sixth AND gate 361, the first chip identification signal CID1 and the address bit signal An in response to the first bit signal RMC1 and the second bit signal RMC2 of the remapping control signal RMC. The fourth multiplexer 365 may select one of an output signal of the seventh AND gate 363, an output signal of the eighth AND gate 364, the inversion signal of the first chip identification signal CID1 and the inversion signal of the address bit signal An in response to the first bit signal RMC1 and the second bit signal RMC2 of the remapping control signal RMC.

The ninth AND gate 366 may perform an AND logic operation on an output signal of the chip selection multiplexer 353 and an output signal of the first multiplexer 356 to generate a fourth internal chip selection signal ICS4. The tenth AND gate 367 may perform an AND logic operation on the output signal of the chip selection multiplexer 353 and an output signal of the second multiplexer 359 to generate a third internal chip selection signal ICS3. The eleventh AND gate 368 may perform an AND logic operation on the inversion signal of the first chip selection signal CS1 and an output signal of the third multiplexer 362 to generate a second internal chip selection signal ICS2. The twelfth AND gate 369 may perform an AND logic operation on the inversion signal of the first chip selection signal CS1 and an output signal of the fourth multiplexer 365 to generate a first internal chip selection signal ICS1.

The remapping control signal RMC provided to the address remapping circuit 30b of FIG. 8 may be a two-bit signal including the first bit signal RMC1 and the second bit signal RMC2. Hereinafter, the logic value or the control value of the remapping control signal RMC may be represented by 'yx' when the logic value of the first bit signal RMC1 is 'x' and the logic value of the second bit signal RMC2 is 'y'. The terminal 'a' of the chip selection multiplexer 353 and the terminals 'c' of the first through fourth multiplexers 356, 358, 362 and 365 may be selected when the remapping control signal RMC has a first control value (e.g., '00'). The terminal 'b' of the chip selection multiplexer 353 and the terminals 'e' of the first through fourth multiplexers 356, 358, 362 and 365 may be selected when the remapping control signal RMC has a second control value (e.g., '01'). The terminal 'b' of the chip selection multiplexer 353 and the terminals 'd' of the first through fourth multiplexers 356, 358, 362 and 365 may be selected when the remapping control signal RMC has a third control value (e.g., '11'). The terminal 'a' of the chip selection multiplexer 353 and the terminals 'f' of the first through fourth multiplexers 356, 358, 362 and 365 may be selected when the remapping control signal RMC has a fourth control value (e.g., '10').

As a result, the first chip selection signal CS1, the first chip identification signal CID1 and the second chip identification signal CID2 may be received as the three input signals IN1, IN2 and IN3 when the remapping control signal RMC has the first control value (e.g., '00'). The first chip selection signal CS1, the second chip selection signal CS2 and the first chip identification signal CID1 may be received as the three input signals IN1, IN2 and IN3 when the remapping control signal RMC has the second control value (e.g., '01'). The first chip selection signal CS1, the second chip selection signal CS2 and the address bit signal An may be received as the three input signals IN1, IN2 and IN3 when the remapping control signal RMC has the third control value (e.g., '11'). The first chip selection signal CS1, the first chip identification signal CID1 and the address bit signal An may be received as the three input signals IN1, IN2 and IN3 when the remapping control signal RMC has the fourth control value (e.g., '10').

In one embodiment, a first interface mode may refer to the case that the remapping control signal RMC has the first control value (e.g., '00'), that is, when the first chip selection signal CS1, the first chip identification signal CID1 and the second chip identification signal CID2 are received as the three input signals IN1, IN2 and IN3. A second interface mode may refer to the case that the remapping control signal RMC has the second control value (e.g., '01'), that is, when the first chip selection signal CS1, the second chip selection signal CS2 and the first chip identification signal CID1 are received as the three input signals IN1, IN2 and IN3. A third interface mode may refer to the case that the remapping control signal RMC has the third control value (e.g., '11'), that is, when the first chip selection signal CS1, the second chip selection signal CS2 and the address bit signal An are received as the three input signals IN1, IN2 and IN3. A fourth interface mode may refer to the case that the remapping control signal RMC has the fourth control value (e.g., '10'), that is, when the first chip selection signal CS1, the first chip identification signal CID1 and the address bit signal An are received as the three input signals IN1, IN2 and IN3. For example, a first set of input signals (e.g., CS1, CID1, and CID2) may be selected from the plurality of input signals (e.g., CS1, CS2, CID1, CID2, and An) in response to the remapping control signal RMC having the first control value '00', a second set of input signals (e.g., CS1, CS2, and CID1) may be selected from the plurality of input signals (e.g., CS1, CS2, CID1, CID2, and An) in response to the remapping control signal RMC having the second control value '01', a third set of input signals (e.g., CS1, CS2, and An) may be selected from the plurality of input signals (e.g., CS1, CS2, CID1, CID2, and An) in response to the remapping control signal RMC having the third control value '11', and a fourth set of input signals (e.g., CS1, CID1, and An) may be selected from the plurality of input signals (e.g., CS1, CS2, CID1, CID2, and An) in response to the remapping control signal RMC having the fourth control value '10'. A logic value of each of the plurality of input signals (e.g., CS1, CS2, CID1, CID2, and An) and the remapping control signal RMC may be determined by interface mode information.

As such, the remapping control signal RMC may have the control value '00', '01', '11' or '10' that is changed depending on the different combinations of the input signals IN1, IN2 and IN3 that are received through three valid input terminals among the five input terminals.

Figures 9A, 9B:
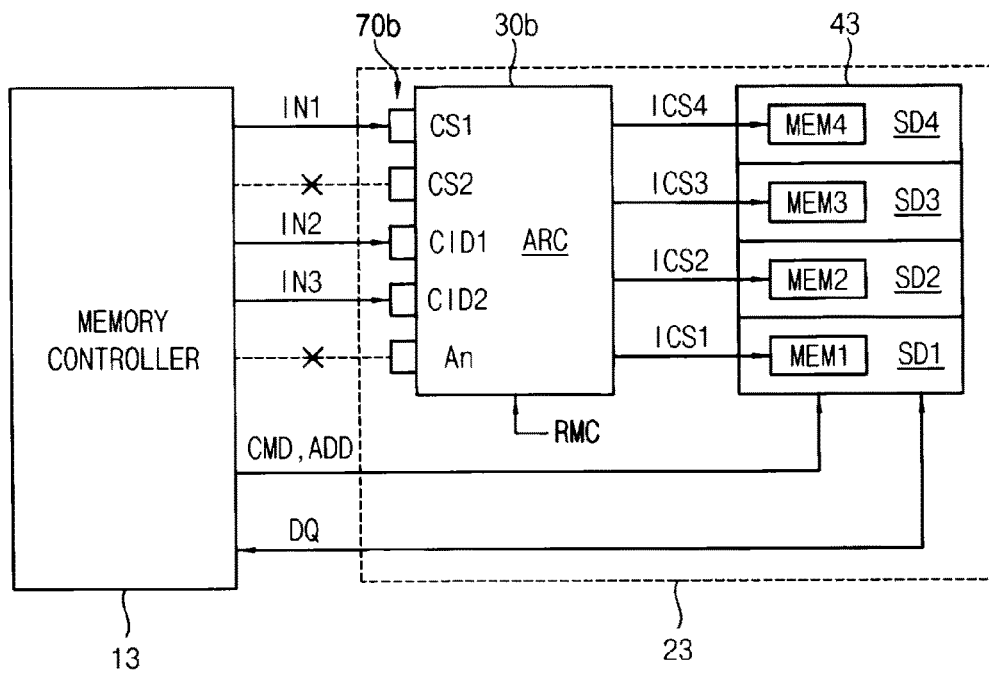
FIG. 9A is a block diagram illustrating an operation of a memory system in a first interface mode using the address remapping circuit of FIG. 8 according to an exemplary embodiment.
FIG. 9B is a diagram illustrating a truth table for describing the first interface mode performed by the memory system of FIG. 9A according to an exemplary embodiment.

FIG. 9A is a block diagram illustrating an operation of a memory system operating in a first interface mode using the address remapping circuit of FIG. 8 according to an exemplary embodiment, and FIG. 9B is a diagram illustrating a truth table for describing the first interface mode performed by the memory system of FIG. 9A according to an exemplary embodiment.

Referring to FIG. 9A, a memory system 103 may include a memory controller 13 and a stacked memory device 23.

The stacked memory device 23 may include an address remapping circuit 30b and a plurality of semiconductor dies SD1~SD4 43.

The address remapping circuit 30b may include five input terminals for receiving a first chip selection signal CS1, a second chip selection signal CS2, a first chip identification signal CID1, a second chip identification signal CID2 and an address bit signal An. The address remapping circuit 30b may receive three input signals, for example, the first chip selection signal CS1, the first chip identification signal CID1 and the second chip identification signal CID2 as the input signals IN1, IN2 and IN3 through three valid input terminals among the five input terminals. For example, the three input signals (e.g., CS1, CID1, and CID2) may be selected from the plurality of input signals (e.g., CS1, CS2, CID1, CID2, and An) in response to the remapping control signal RMC having the first control value '00'.

The address remapping circuit 30b may generate a first internal chip selection signal ICS1, a second internal chip selection signal ICS2, a third internal chip selection signal ICS3 and a fourth internal chip selection signal ICS4 based on the first chip selection signal CS1, the first chip identification signal CID1, the second chip identification signal CID2 and the remapping control signal RMC having the first control value '00'.

The semiconductor dies 43 may include a first semiconductor die SD1 that is accessed when the first internal chip selection signal ICS1 is activated, a second semiconductor die SD2 that is accessed when the second internal chip selection signal ICS2 is activated, a third semiconductor die SD3 that is accessed when the third internal chip selection signal ICS3 is activated and a fourth semiconductor die SD4 that is accessed when the fourth internal chip selection signal ICS4 is activated.

Referring to FIG. 9B, the first chip selection signal CS1, the first chip identification signal CID1 and the second chip identification signal CID2 may be enabled as the input signals IN1, IN2 and IN3, and the second chip selection signal CS2 and the address bit signal An may be disabled (e.g., 'X'). In the truth table of FIG. 9B, the first through fourth cases represent that the stacked memory device 23 is accessed and the fifth case represents that the stacked memory device 23 is not accessed.

The first chip selection signal CS1 may be activated in the logic low level L when the stacked memory device 23 is accessed. According to the logic levels of the first chip selection signal CS1, the first chip identification signal CID1 and the second chip identification signal CID2, only one of the first through fourth internal chip selection signals ICS1~ICS4 may be activated in the logic high level H. As described above, only one of the first through fourth semiconductor dies SD1~SD4 may be accessed in response to the first through fourth internal chip selection signals ICS1~ICS4 that are selectively activated.

When the stacked memory device 23 is not accessed, the first chip selection signal CS1 may be deactivated in the logic high level H. All of the first through fourth internal chip selection signal ICS1~ICS4 may be deactivated in the logic low high level L regardless of the logic level of each of the first and second chip identification signals CID1 and CID2 (e.g., 'DC').

Figures 10A, 10B:
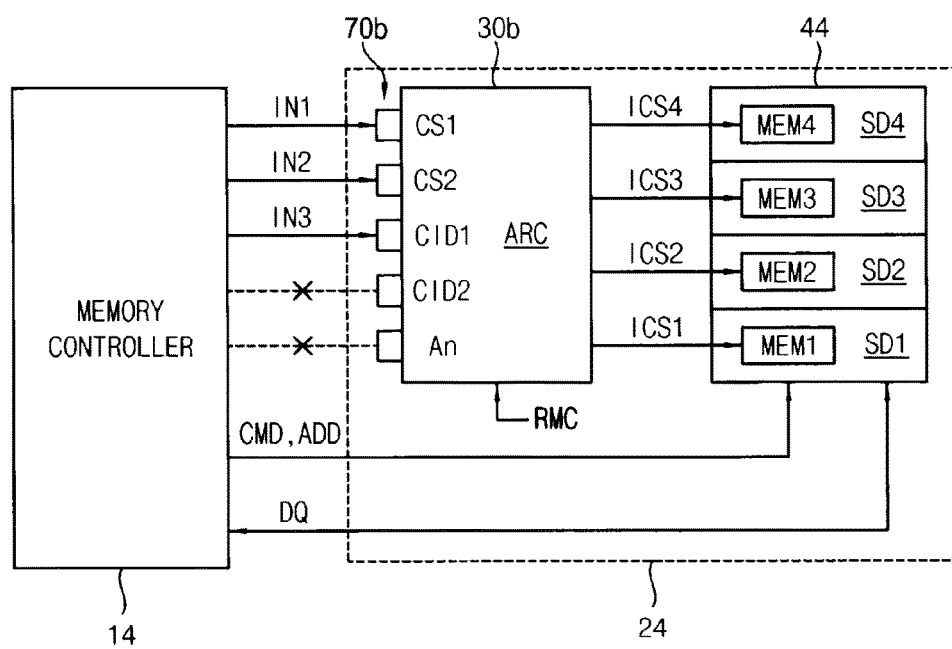
FIG. 10A is a block diagram illustrating an operation of a memory system in a second interface mode using the address remapping circuit of FIG. 8 according to an exemplary embodiment.
FIG. 10B is a diagram illustrating a truth table for describing the second interface mode performed by the memory system of FIG. 10A according to an exemplary embodiment.

FIG. 10A is a block diagram illustrating an operation of a memory system in a second interface mode using the address remapping circuit of FIG. 8 according to an exemplary embodiment, and FIG. 10B is a diagram illustrating a truth table for describing the second interface mode performed by the memory system of FIG. 10A according to an exemplary embodiment.

Referring to FIG. 10A, a memory system 104 may include a memory controller 14 and a stacked memory device 24. The stacked memory device 24 may include an address remapping circuit 30b and a plurality of semiconductor dies SD1~SD4 44.

The address remapping circuit 30b may include five input terminals for receiving a first chip selection signal CS1, a second chip selection signal CS2, a first chip identification signal CID1, a second chip identification signal CID2 and an address bit signal An. The address remapping circuit 30b may receive three input signals, for example, the first chip selection signal CS1, the second chip selection signal CS2 and the first chip identification signal CID1 as the input signals IN1, IN2 and IN3 through three valid input terminals among the five input terminals. For example, the three input signals (e.g., CS1, CS2, and CID1) may be selected from the plurality of input signals (e.g., CS1, CS2, CID1, CID2, and An) in response to the remapping control signal RMC having the second control value '01'.

The address remapping circuit 30b may generate a first internal chip selection signal ICS1, a second internal chip selection signal ICS2, a third internal chip selection signal ICS3 and a fourth internal chip selection signal ICS4 based on the first chip selection signal CS1, the second chip selection signal CS2, the first chip identification signal CID1 and the remapping control signal RMC having the second control value '01'.

The semiconductor dies 44 may include a first semiconductor die SD1 that is accessed when the first internal chip selection signal ICS1 is activated, a second semiconductor die SD2 that is accessed when the second internal chip selection signal ICS2 is activated, a third semiconductor die SD3 that is accessed when the third internal chip selection signal ICS3 is activated and a fourth semiconductor die SD4 that is accessed when the fourth internal chip selection signal ICS4 is activated.

Referring to FIG. 10B, the first chip selection signal CS1, the second chip selection signal CS2 and the first chip identification signal CID1 may be enabled as the input signals IN1, IN2 and IN3, and the second chip identification signal CID2 and the address bit signal An may be disabled (e.g., 'X'). In the truth table of FIG. 10B, the first through fourth cases represent that the stacked memory device 24 is accessed and the fifth case represents that the stacked memory device 24 is not accessed.

One of the first chip selection signal CS1 and the second chip selection signal CS2 may be activated in the logic low level L when the stacked memory device 24 is accessed. According to the logic levels of the first chip selection signal CS1, the second chip selection signal CS2 and the first chip identification signal CID1, only one of the first through fourth internal chip selection signals ICS1~ICS4 may be activated in the logic high level H. As described above, only one of the first through fourth semiconductor dies SD1~SD4 may be accessed in response to the first through fourth internal chip selection signals ICS1~ICS4 that are selectively activated.

When the stacked memory device 24 is not accessed, both of the first chip selection signal CS1 and the second chip selection signal CS2 may be deactivated in the logic high level H. All of the first through fourth internal chip selection signal ICS1~ICS4 may be deactivated in the logic low high level L regardless of the logic level of the first chip identification signal CID1 (e.g., 'DC').

Figures 11A, 11B:
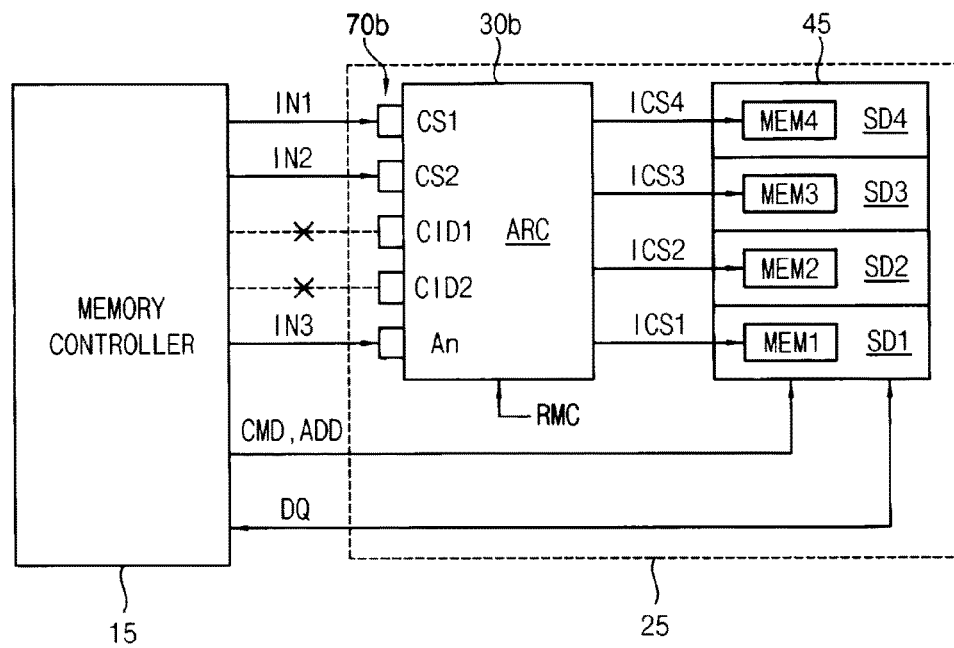
FIG. 11A is a block diagram illustrating an operation of a memory system in a third interface mode using the address remapping circuit of FIG. 8 according to an exemplary embodiment.
FIG. 11B is a diagram illustrating a truth table for describing the third interface mode performed by the memory system of FIG. 11A according to an exemplary embodiment.

FIG. 11A is a block diagram illustrating an operation of a memory system in a third interface mode using the address remapping circuit of FIG. 8 according to an exemplary embodiment, and FIG. 11B is a diagram illustrating a truth table for describing the third interface mode performed by the memory system of FIG. 11A according to an exemplary embodiment.

Referring to FIG. 11A, a memory system 105 may include a memory controller 15 and a stacked memory device 25. The stacked memory device 25 may include an address remapping circuit 30b and a plurality of semiconductor dies SD1~SD4 45.

The address remapping circuit 30b may include five input terminals for receiving a first chip selection signal CS1, a second chip selection signal CS2, a first chip identification signal CID1, a second chip identification signal CID2 and an address bit signal An. The address remapping circuit 30b may receive three input signals, for example, the first chip selection signal CS1, the second chip selection signal CS2 and the address bit signal An as the input signals IN1, IN2 and IN3 through three valid input terminals among the five input terminals. For example, the three input signals (e.g., CS1, CS2, and An) may be selected from the plurality of input signals (e.g., CS1, CS2, CID1, CID2, and An) in response to the remapping control signal RMC having the third control value '11'. The address remapping circuit 30b may generate a first internal chip selection signal ICS1, a second internal chip selection signal ICS2, a third internal chip selection signal ICS3 and a fourth internal chip selection signal ICS4 based on the first chip selection signal CS1, the second chip selection signal CS2, the address bit signal An and the remapping control signal RMC having the third control value '11'.

The semiconductor dies 45 may include a first semiconductor die SD1 that is accessed when the first internal chip selection signal ICS1 is activated, a second semiconductor die SD2 that is accessed when the second internal chip selection signal ICS2 is activated, a third semiconductor die SD3 that is accessed when the third internal chip selection signal ICS3 is activated and a fourth semiconductor die SD4 that is accessed when the fourth internal chip selection signal ICS4 is activated.

Referring to FIG. 11B, the first chip selection signal CS1, the second chip selection signal CS2 and the address bit signal An may be enabled as the input signals IN1, IN2 and IN3, and the first chip identification signal CID1 and the second chip identification signal CID2 may be disabled (e.g., 'X'). In the truth table of FIG. 11B, the first through fourth cases represent that the stacked memory device 25 is accessed and the fifth case represents that the stacked memory device 25 is not accessed.

One of the first chip selection signal CS1 and the second chip selection signal CS2 may be activated in the logic low level L when the stacked memory device 25 is accessed. According to the logic levels of the first chip selection signal CS1, the second chip selection signal CS2 and the address bit signal An, only one of the first through fourth internal chip selection signals ICS1~ICS4 may be activated in the logic high level H. As described above, only one of the first through fourth semiconductor dies SD1~SD4 may be accessed in response to the first through fourth internal chip selection signals ICS1~ICS4 that are selectively activated.

When the stacked memory device 25 is not accessed, both of the first chip selection signal CS1 and the second chip selection signal CS2 may be deactivated in the logic high level H. All of the first through fourth internal chip selection signal ICS1~ICS4 may be deactivated in the logic low high level L regardless of the logic level of the address bit signal An (e.g., 'DC').

Figures 12A, 12B:
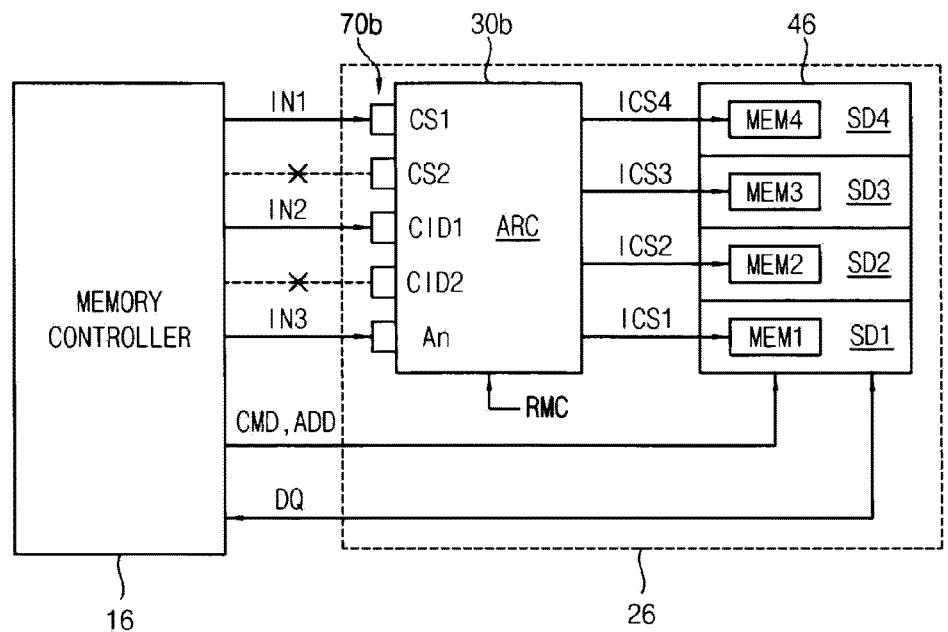
FIG. 12A is a block diagram illustrating an operation of a memory system in a fourth interface mode using the address remapping circuit of FIG. 8 according to an exemplary embodiment.
FIG. 12B is a diagram illustrating a truth table for describing the second interface mode performed by the memory system of FIG. 12A according to an exemplary embodiment.

FIG. 12A is a block diagram illustrating an operation of a memory system operating in a fourth interface mode using the address remapping circuit of FIG. 8 according to an exemplary embodiment, and FIG. 12B is a diagram illustrating a truth table for describing the second interface mode performed by the memory system of FIG. 12A according to an exemplary embodiment.

Referring to FIG. 12A, a memory system 106 may include a memory controller 16 and a stacked memory device 26. The stacked memory device 26 may include an address remapping circuit 30b and a plurality of semiconductor dies SD1~SD4 46.

The address remapping circuit 30b may include five input terminals for receiving a first chip selection signal CS1, a second chip selection signal CS2, a first chip identification signal CID1, a second chip identification signal CID2 and an address bit signal An. The address remapping circuit 30b may receive three input signals, for example, the first chip selection signal CS1, the first chip identification signal CID1 and the address bit signal An as the input signals IN1, IN2 and IN3 through three valid input terminals among the five input terminals. For example, the three input signals (e.g., CS1, CID1, and An) may be selected from the plurality of input signals (e.g., CS1, CS2, CID1, CID2, and An) in response to the remapping control signal RMC having the fourth control value '10'.

The address remapping circuit 30b may generate a first internal chip selection signal ICS1, a second internal chip selection signal ICS2, a third internal chip selection signal ICS3 and a fourth internal chip selection signal ICS4 based on the first chip selection signal CS1, the first chip identification signal CID1, the address bit signal An and the remapping control signal RMC having the fourth control value '10'.

The semiconductor dies 46 may include a first semiconductor die SD1 that is accessed when the first internal chip selection signal ICS1 is activated, a second semiconductor die SD2 that is accessed when the second internal chip selection signal ICS2 is activated, a third semiconductor die SD3 that is accessed when the third internal chip selection signal ICS3 is activated and a fourth semiconductor die SD4 that is accessed when the fourth internal chip selection signal ICS4 is activated.

Referring to FIG. 12B, the first chip selection signal CS1, the first chip identification signal CID1 and the address bit signal An may be enabled as the input signals IN1, IN2 and IN3, and the second chip selection signal CS2 and the second chip identification signal CID2 may be disabled ('X'). In the truth table of FIG. 12B, the first through fourth cases represent that the stacked memory device 26 is accessed and the fifth case represents that the stacked memory device 26 is not accessed.

The first chip selection signal CS1 may be activated in the logic low level L when the stacked memory device 26 is accessed. According to the logic levels of the first chip selection signal CS1, the first chip identification signal CID1 and the address bit signal An, only one of the first through fourth internal chip selection signals ICS1~ICS4 may be activated in the logic high level H. As described above, only one of the first through fourth semiconductor dies SD1~SD4 may be accessed in response to the first through fourth internal chip selection signals ICS1~ICS4 that are selectively activated.

When the stacked memory device 26 is not accessed, the first chip selection signal CS1 may be deactivated in the logic high level H. All of the first through fourth internal chip selection signal ICS1~ICS4 may be deactivated in the logic low high level L regardless of the logic levels of the first chip identification signal CID1 and the address bit signal An (e.g., 'DC').

Figure 13:
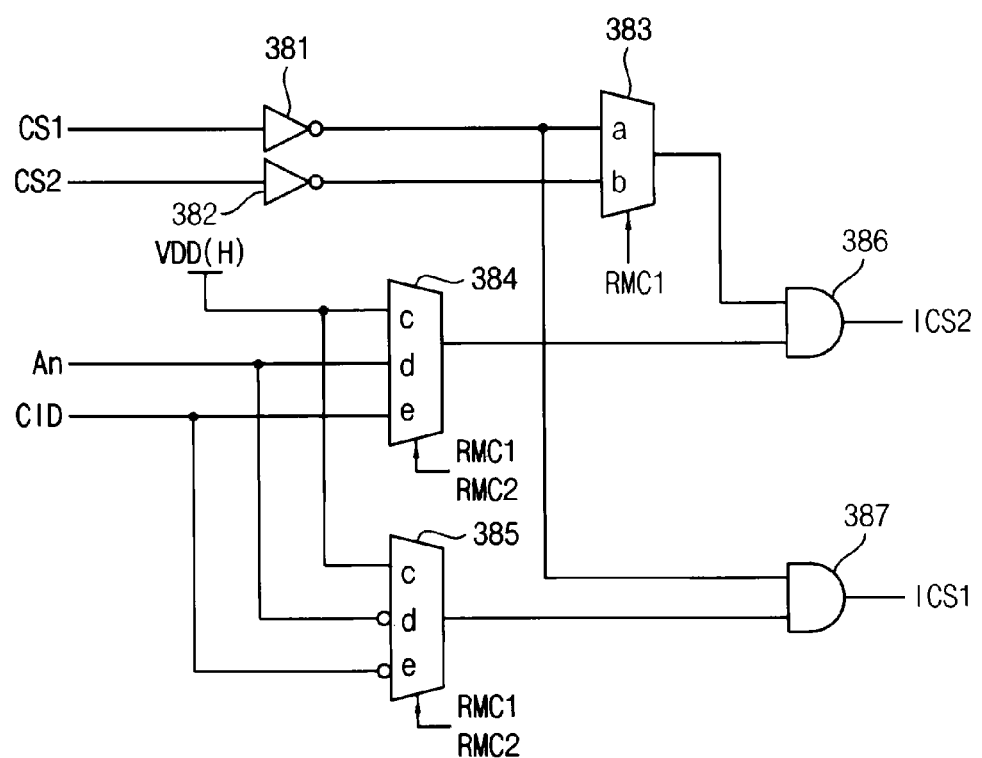
FIG. 13 is a circuit diagram illustrating an address remapping circuit according to example embodiments.

FIG. 13 is a circuit diagram illustrating an address remapping circuit according to example embodiments.

Referring to FIG. 13, an address remapping circuit 30c may include four input terminals for receiving a first chip selection signal CS1, a second chip selection signal CS2, a chip identification signal CID and an address bit signal An, respectively. The address remapping circuit 30c may generate a first internal chip selection signal ICS1 and a second internal chip selection signal ICS2 based on the remapping control signal RMC. As described above, a portion of the first chip selection signal CS1, the second chip selection signal CS2, the chip identification signal CID and the address bit signal An may be provided to the address remapping circuit 30c as the input signals, and the remapping control signal RMC may have a control value that is changed depending on the different combinations of the input signals. The remapping control signal RMC may include a first bit signal RMC1 and a second bit signal RMC2.

The address remapping circuit 30a may include first and second inverters 381 and 382, a chip selection multiplexer 383, first and second multiplexers 384 and 385 and first and second AND gates 386 and 387.

The first inverter 381 may invert the first chip selection signal CS1 and the second inverter 382 may invert the second chip selection signal CS2. The chip selection multiplexer 383 may select one of an inversion signal of the first chip selection signal CS1 and an inversion signal of the second chip selection signal CS2 in response to the first bit signal RMC1 of the remapping control signal RMC.

The first multiplexer 384 may select one of a power supply voltage VDD, the chip identification signal CID and the address bit signal An in response to the first bit signal RMC1 and the second bit signal RMC2 of the remapping control signal RMC. The second multiplexer 385 may select one of the power supply voltage VDD, an inversion signal of the chip identification signal CID and an inversion signal of the address bit signal An in response to the first bit signal RMC1 and the second bit signal RMC2 of the remapping control signal RMC.

The first AND gate 386 may perform an AND logic operation on an output signal of the chip selection multiplexer 383 and an output signal of the first multiplexer 384 to generate a second internal chip selection signal ICS2. The second AND gate 387 may perform an AND logic operation on the inversion signal of the first chip selection signal CS1 and an output signal of the second multiplexer 385 to generate a first internal chip selection signal ICS1.

The remapping control signal RMC provided to the address remapping circuit 30c of FIG. 13 may be a two-bit signal including the first bit signal RMC1 and the second bit signal RMC2. As described above, the logic value or the control value of the remapping control signal RMC may be represented by 'yx' when the logic value of the first bit signal RMC1 is 'x' and the logic value of the second bit signal RMC2 is 'y'. The terminal 'b' of the chip selection multiplexer 383 and the terminals 'c' of the first and second multiplexers 384 and 385 may be selected when the remapping control signal RMC has a first control value (e.g., '00'). The terminal 'a' of the chip selection multiplexer 353 and the terminals 'e' of the first and second multiplexers 384 and 385 may be selected when the remapping control signal RMC has a second control value (e.g., '01'). The terminal 'a' of the chip selection multiplexer 383 and the terminals 'd' of the first and second multiplexers 384 and 385 may be selected when the remapping control signal RMC has a third control value (e.g., '11').

As a result, the first chip selection signal CS1 and the second chip selection signal CS2 may be received as the two input signals IN1 and IN2 when the remapping control signal RMC has the first control value (e.g., '00'). The first chip selection signal CS1 and the chip identification signal CID may be received as the two input signals IN1 and IN2 when the remapping control signal RMC has the second control value (e.g., '01'). The first chip selection signal CS1 and the address bit signal An may be received as the two input signals IN1 and IN2 IN3 when the remapping control signal RMC has the third control value (e.g., '11').

In one embodiment, a first interface mode may refer to the case that the remapping control signal RMC has the first control value (e.g., '00'), that is, when the first chip selection signal CS1 and the second chip selection signal CS2 are received as the two input signals IN1 and IN2 and IN3. A second interface mode may refer to the case that the remapping control signal RMC has the second control value (e.g., '01'), that is, when the first chip selection signal CS1 and the chip identification signal CID are received as the two input signals IN1 and IN2 and. A third interface mode may refer to the case that the remapping control signal RMC has the third control value (e.g., '11'), that is, when the first chip selection signal CS1 and the address bit signal An are received as the two input signals IN1 and IN2. For example, a first set of input signals (e.g., CS1 and CS2) may be selected from the plurality of input signals (e.g., CS1, CS2, CID, and An) in response to the remapping control signal RMC having the first control value '00', a second set of input signals (e.g., CS1 and CID) may be selected from the plurality of input signals (e.g., CS1, CS2, CID, and An) in response to the remapping control signal RMC having the second control value '01', and a third set of input signals (e.g., CS1 and An) may be selected from the plurality of input signals (e.g., CS1, CS2, CID, and An) in response to the remapping control signal RMC having the third control value '11'. A logic value of each of the plurality of input signals (e.g., CS1, CS2, CID, and An) and the remapping control signal RMC may be determined by interface mode information.

As such, the remapping control signal RMC may have the control value '00', '01' or '11' that is changed depending on the different combinations of the input signals IN1 and IN2 that are received through two valid input terminals among the four input terminals.

Figures 14A, 14B:
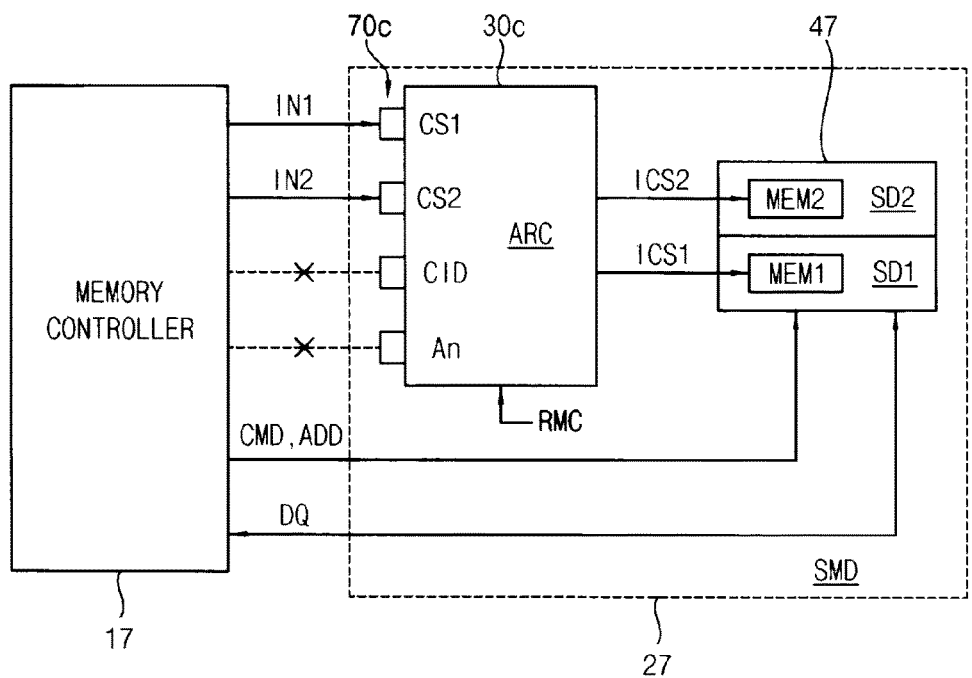
FIG. 14A is a block diagram illustrating an operation of a memory system in a first interface mode using the address remapping circuit of FIG. 13 according to an exemplary embodiment.
FIG. 14B is a diagram illustrating a truth table for describing the first interface mode performed by the memory system of FIG. 14A according to an exemplary embodiment.

FIG. 14A is a block diagram illustrating an operation of a memory system in a first interface mode using the address remapping circuit of FIG. 13 according to an exemplary embodiment, and FIG. 14B is a diagram illustrating a truth table for describing the first interface mode performed by the memory system of FIG. 14A according to an exemplary embodiment.

Referring to FIG. 14A, a memory system 107 may include a memory controller 17 and a stacked memory device 27. The stacked memory device 27 may include an address remapping circuit 30c and a plurality of semiconductor dies SD1 and SD2 47.

The address remapping circuit 30c may include four input terminals for receiving a first chip selection signal CS1, a second chip selection signal CS2, a chip identification signal CID and an address bit signal An. The address remapping circuit 30c may receive two input signals, for example, the first chip selection signal CS1 and the second chip selection signal CS2 as the input signals IN1 and IN2 through two valid input terminals among the four input terminals. For example, the two input signals (e.g., CS1 and CS2) may be selected from the plurality of input signals (e.g., CS1, CS2, CID, and An) in response to the remapping control signal RMC having the first control value '00'.

The address remapping circuit 30c may generate a first internal chip selection signal ICS1 and a second internal chip selection signal ICS2 based on the first chip selection signal CS1, the second chip selection signal CS2 and the remapping control signal RMC having the first control value '00'.

The semiconductor dies 47 may include a first semiconductor die SD1 that is accessed when the first internal chip selection signal ICS1 is activated, and a second semiconductor die SD2 that is accessed when the second internal chip selection signal ICS2 is activated.

Referring to FIG. 14B, the first chip selection signal CS1 and the second chip selection signal CS2 may be enabled as the input signals IN1 and IN2, and the chip identification signal CID and the address bit signal An may be disabled (e.g., 'X'). In the truth table of FIG. 14B, the first and second cases represent that the stacked memory device 27 is accessed and the third case represents that the stacked memory device 27 is not accessed.

One of the first chip selection signal CS1 and the second chip selection signal CS2 may be activated in the logic low level L when the stacked memory device 27 is accessed. According to the logic levels of the first chip selection signal CS1 and the second chip selection signal CS2, only one of the first and second internal chip selection signals ICS1 and ICS2 may be activated in the logic high level H. As described above, only one of the first and second semiconductor dies SD1 and SD2 may be accessed in response to the first and second internal chip selection signals ICS1 and ICS2 that are selectively activated.

When the stacked memory device 27 is not accessed, both of the first and second chip selection signals CS1 and CS2 may be deactivated in the logic high level H. Both of the first and second internal chip selection signal ICS1 and ICS2 may be deactivated in the logic low high level L.

Figures 15A, 15B:
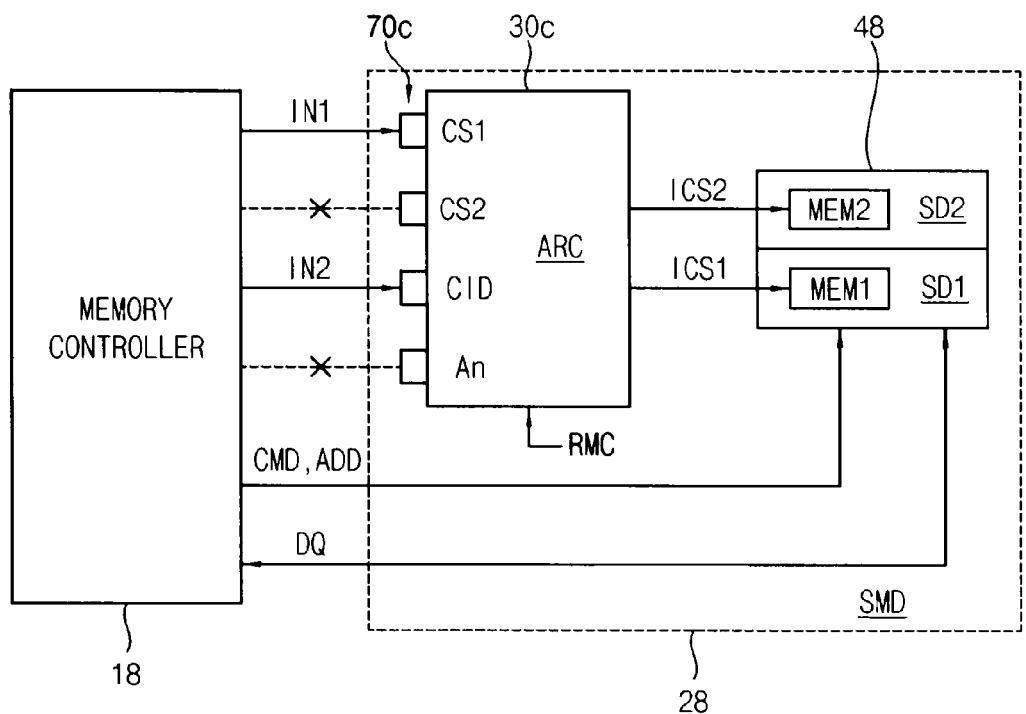
FIG. 15A is a block diagram illustrating an operation of a memory system in a second interface mode using the address remapping circuit of FIG. 13 according to an exemplary embodiment.
FIG. 15B is a diagram illustrating a truth table for describing the second interface mode performed by the memory system of FIG. 15A according to an exemplary embodiment.

FIG. 15A is a block diagram illustrating an operation of a memory system operating in a second interface mode using the address remapping circuit of FIG. 13 according to an exemplary embodiment, and FIG. 15B is a diagram illustrating a truth table for describing the second interface mode performed by the memory system of FIG. 15A according to an exemplary embodiment.

Referring to FIG. 15A, a memory system 108 may include a memory controller 18 and a stacked memory device 28. The stacked memory device 28 may include an address remapping circuit 30c and a plurality of semiconductor dies SD1 and SD2 48.

The address remapping circuit 30c may include four input terminals for receiving a first chip selection signal CS1, a second chip selection signal CS2, a chip identification signal CID and an address bit signal An. The address remapping circuit 30c may receive two input signals, for example, the first chip selection signal CS1 and the chip identification signal CID as the input signals IN1 and IN2 through two valid input terminals among the four input terminals. For example, the two input signals (e.g., CS1 and CID) may be selected from the plurality of input signals (e.g., CS1, CS2, CID, and An) in response to the remapping control signal RMC having the second control value '01'.

The address remapping circuit 30c may generate a first internal chip selection signal ICS1 and a second internal chip selection signal ICS2 based on the first chip selection signal CS1, the second chip selection signal CS2 and the remapping control signal RMC having the second control value '01'.

The semiconductor dies 48 may include a first semiconductor die SD1 that is accessed when the first internal chip selection signal ICS1 is activated, and a second semiconductor die SD2 that is accessed when the second internal chip selection signal ICS2 is activated.

Referring to FIG. 15B, the first chip selection signal CS1 and the chip identification signal CID may be enabled as the input signals IN1 and IN2, and the second chip selection signal CS2 and the address bit signal An may be disabled (e.g., 'X'). In the truth table of FIG. 15B, the first and second cases represent that the stacked memory device 28 is accessed and the third case represents that the stacked memory device 28 is not accessed.

The first chip selection signal CS1 may be activated in the logic low level L when the stacked memory device 28 is accessed. According to the logic levels of the first chip selection signal CS1 and the chip identification signal CID, only one of the first and second internal chip selection signals ICS1 and ICS2 may be activated in the logic high level H. As described above, only one of the first and second semiconductor dies SD1 and SD2 may be accessed in response to the first and second internal chip selection signals ICS1 and ICS2 that are selectively activated.

When the stacked memory device 28 is not accessed, the first chip selection signal CS1 may be deactivated in the logic high level H. Both of the first and second internal chip selection signal ICS1 and ICS2 may be deactivated in the logic low high level L regardless of the logic level of the chip identification signal CID (e.g., 'DC').

Figures 16A, 16B:
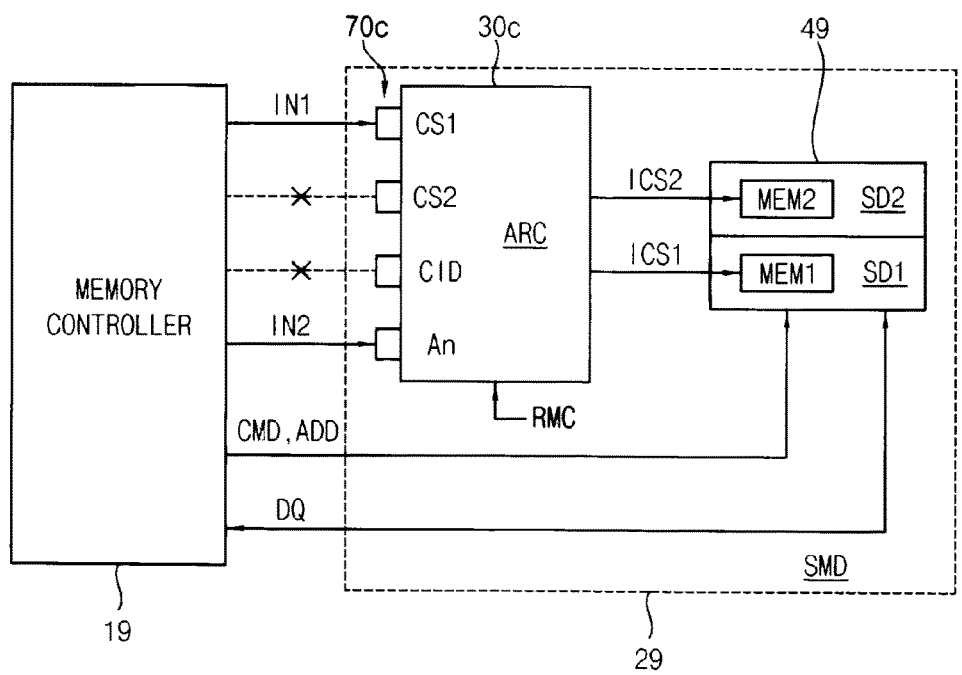
FIG. 16A is a block diagram illustrating an operation of a memory system in a third interface mode using the address remapping circuit of FIG. 13 according to an exemplary embodiment.
FIG. 16B is a diagram illustrating a truth table for describing the third interface mode performed by the memory system of FIG. 16A according to an exemplary embodiment.

FIG. 16A is a block diagram illustrating an operation of a memory system in a third interface mode using the address remapping circuit of FIG. 13 according to an exemplary embodiment, and FIG. 16B is a diagram illustrating a truth table for describing the third interface mode performed by the memory system of FIG. 16A according to an exemplary embodiment.

Referring to FIG. 16A, a memory system 109 may include a memory controller 19 and a stacked memory device 29. The stacked memory device 29 may include an address remapping circuit 30c and a plurality of semiconductor dies SD1 and SD2 49.

The address remapping circuit 30c may include four input terminals for receiving a first chip selection signal CS1, a second chip selection signal CS2, a chip identification signal CID and an address bit signal An. The address remapping circuit 30c may receive two input signals, for example, the first chip selection signal CS1 and the address bit signal An as the input signals IN1 and IN2 through two valid input terminals among the four input terminals. For example, the two input signals (e.g., CS1 and An) may be selected from the plurality of input signals (e.g., CS1, CS2, CID, and An) in response to the remapping control signal RMC having the third control value '11'.

The address remapping circuit 30c may generate a first internal chip selection signal ICS1 and a second internal chip selection signal ICS2 based on the first chip selection signal CS1, the address bit signal An and the remapping control signal RMC.

The semiconductor dies 49 may include a first semiconductor die SD1 that is accessed when the first internal chip selection signal ICS1 is activated, and a second semiconductor die SD2 that is accessed when the second internal chip selection signal ICS2 is activated.

Referring to FIG. 16B, the first chip selection signal CS1 and the address bit signal An may be enabled as the input signals IN1 and IN2, and the second chip selection signal CS2 and the chip identification signal CID may be disabled (e.g., 'X'). In the truth table of FIG. 16B, the first and second cases represent that the stacked memory device 29 is accessed and the third case represents that the stacked memory device 29 is not accessed.

The first chip selection signal CS1 may be activated in the logic low level L when the stacked memory device 29 is accessed. According to the logic levels of the first chip selection signal CS1 and the address bit signal An, only one of the first and second internal chip selection signals ICS1 and ICS2 may be activated in the logic high level H. As described above, only one of the first and second semiconductor dies SD1 and SD2 may be accessed in response to the first and second internal chip selection signals ICS1 and ICS2 that are selectively activated.

When the stacked memory device 29 is not accessed, the first chip selection signal CS1 may be deactivated in the logic high level H. Both of the first and second internal chip selection signal ICS1 and ICS2 may be deactivated in the logic low high level L regardless of the logic level of the address bit signal An (e.g., 'DC').

Figure 17:
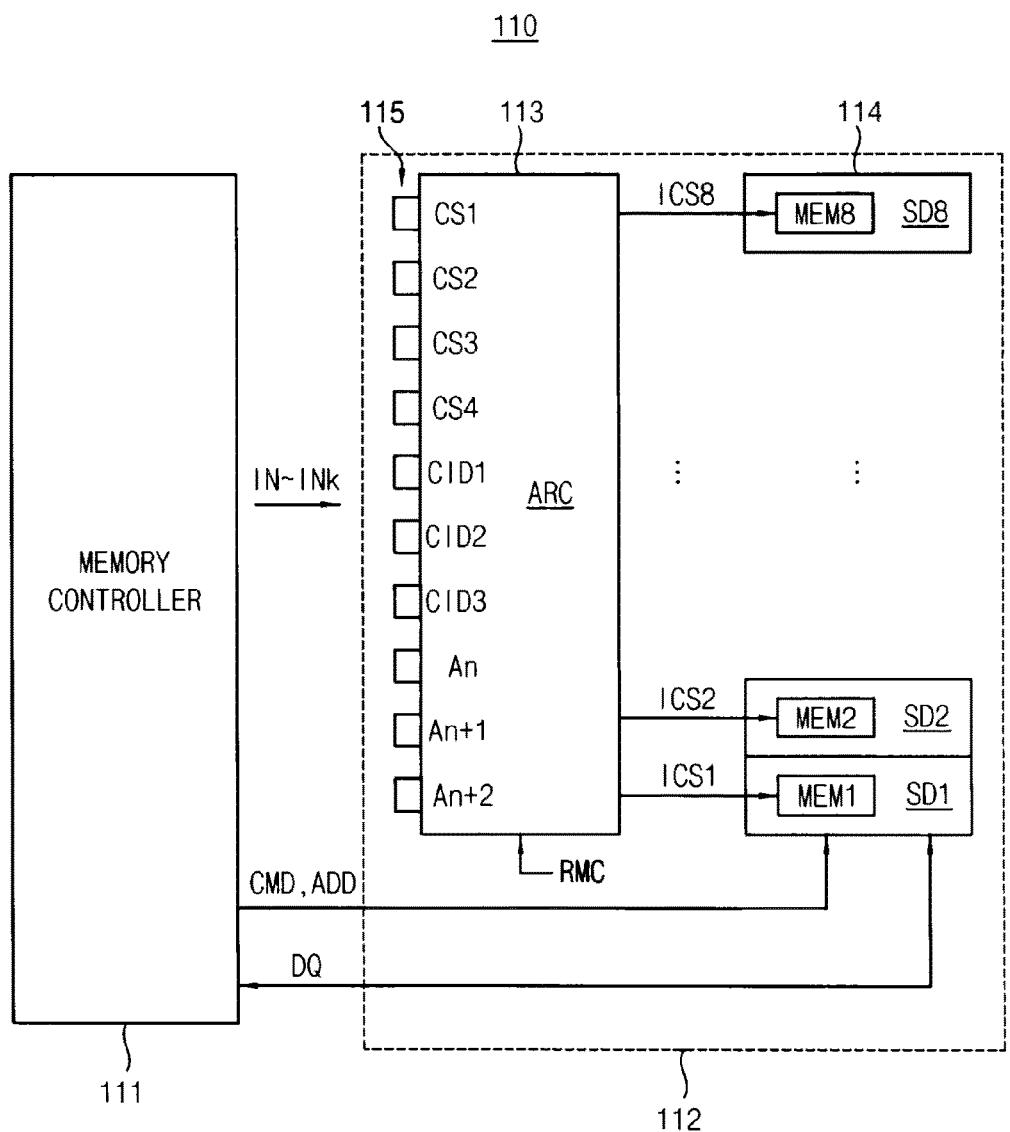
FIG. 17 is a block diagram illustrating a memory system according to example embodiments.

FIG. 17 is a block diagram illustrating a memory system according to example embodiments.

Referring to FIG. 17, a memory system 110 may include a memory controller 111 and a stacked memory device 112. The stacked memory device 112 may include an address remapping circuit 113 and a plurality of semiconductor dies SD1~SD8 114.

The address remapping circuit 113 may include ten input terminals for receiving first, second, third and fourth chip selection signals CS1, CS2, CS3 and CS4, first, second and third chip identification signals CID1, CID2 and CID3, and first, second and third address bit signals An, An+1 and An+2. As described with reference to FIGS. 18A through 18I, the address remapping circuit 113 may receive four input signals IN1~IN4 or five input terminals IN1~IN5 through four or five valid input terminals among the ten input terminals. The FIG. 17 illustrates the ten input terminals 115 to generate eight internal chip selection signals ICS1~ICS8, but the number and kind of the input terminals may be changed variously. In some example embodiments, the input terminals 115 may be implemented to receive the other signals except the two chip selection signals (e.g., CS3 and CS4) and in this case the number of the input terminals 115 may be eight. In other example embodiments, the input terminals 115 may be implemented to receive the chip selection signals (CS1~CS4) and the chip identification signals (CID1~CID3) except the address bit signals (An, An+1 and An+2) and in this case the number of the input terminals 115 may be seven.

The address remapping circuit 113 may generate first through eighth internal chip selection signals ICS1~ICS8 based on the received input signals IN1~INk and a remapping control signal RMC.

FIGS. 18A through 18I are diagram illustrating truth tables for describing interface modes performed by the memory system of FIG. 17 according to example embodiments.

The memory system 110 may perform one of a plurality of interface modes corresponding to the different combinations of the input signals IN1~INk. FIGS. 18A through 18I illustrate first through ninth interface modes that may be performed selectively by the memory system 110 of FIG. 17.

FIG. 18A illustrates a first interface mode receiving the first chip selection signal CS1, the second chip selection signal CS2, the third chip selection signal CS3, the fourth chip selection signal CS4 and the first chip identification signal CID1 as the five input signals IN1~IN5. FIG. 18B illustrates the second interface mode receiving the first chip selection signal CS1, the second chip selection signal CS2, the first chip identification signal CID1 and the second chip identification signal CID2 as the four input signals IN1~IN4. FIG. 18C illustrates the third interface mode receiving the first chip selection signal CS1, the first chip identification signal CID1, the second chip identification signal CID2 and the third chip identification signal CID3 as the four input signals IN1~IN4.

The first, second and third interface modes illustrated in FIGS. 18A, 18B and 18C may be performed selectively when the address remapping circuit 113 includes seven input terminals 115 for receiving the first through fourth chip selection signals CS1~CS4 and the first through third chip identification signals CID1~CID3.

FIG. 18D illustrates the fourth interface mode receiving the first chip selection signal CS1, the second chip selection signal CS2, the third chip selection signal CS3, the fourth chip selection signal CS4 and the first address bit signal An as the five input signals IN1~IN5. FIG. 18E illustrates the fifth interface mode receiving the first chip selection signal CS1, the second chip selection signal CS2, the first address bit signal An and the second address bit signal An+1 as the four input signals IN1~IN4. FIG. 18F illustrates the sixth interface mode receiving the first chip selection signal CS1, the first address bit signal An, the second address bit signal An+1 and the third address bit signal An+2 as the four input signals IN1~IN4.

The fourth, fifth and sixth interface modes illustrated in FIGS. 18D, 18E and 18F may be performed selectively when the address remapping circuit 113 includes seven input terminals 115 for receiving the first through fourth chip selection signals CS1~CS4 and the first through third address bit signals An, An+1 and An+2.

FIG. 18G illustrates the seventh interface mode receiving the first chip selection signal CS1, the second chip selection signal CS2, the first chip identification signal CID1 and the first address bit signal An as the four input signals IN1~IN4. FIG. 18H illustrates the eighth interface mode receiving the first chip selection signal CS1, the first chip identification signal CID1, the second chip identification signal CID2 and the first address bit signal An as the four input signals IN1~IN4. FIG. 18I illustrates the ninth interface mode receiving the first chip selection signal CS1, the first chip identification signal CID1, the first address bit signal An and the second address bit signal An+1 as the four input signals IN1~IN4.

The seventh, eighth and ninth interface modes illustrated in FIGS. 18G, 18H and 18I may be performed selectively when the address remapping circuit 113 includes six input terminals 115 for receiving the first and second chip selection signals CS1 and CS2, the first and second chip identification signals CID1 and CID2, and the first and second address bit signals An and An+1.

When the address remapping circuit 113 includes ten input terminals 115 for receiving the first through fourth chip selection signals CS1~CS4, the first through third chip identification signal CID1~CID3 and the first through third address bit signals An, An+1 and An+2, the first through ninth interface modes illustrated in FIGS. 18A through 18I may be performed selectively based on interface mode information.

For all of the first through ninth interface modes illustrated in FIGS. 18A through 18I, the first through eighth cases represent that the stacked memory device 112 is accessed and the ninth case represents that the stacked memory device 112 is not accessed.

One of the chip selection signals in the input signals IN1~INk may be activated in the logic low level L when the stacked memory device 112 is accessed. According to the logic levels of the input signals IN1~INk, only one of the first through eighth chip selection signals ICS1~ICS8 may be activated in the logic high level H. As described above, only one of the first through eighth semiconductor dies SD1~SD8 may be accessed in response to the first through eighth internal chip selection signals ICS1~ICS8 that are selectively activated.

When the stacked memory device 112 is not accessed, all of the chip selection signals in the input signals IN1~INk may be deactivated in the logic high level H. All of the first through eighth internal chip selection signal ICS1~ICS8 may be deactivated in the logic low high level L regardless of the logic levels of the chip identification signals and the address bit signals in the input signals IN1~INk.

The adaptive address remapping according to example embodiments have been described with reference to FIGS. 5 through 18I, for the cases that the stacked memory device includes, for example, two, four or eight semiconductor dies. It would be understood that the address remapping circuit is not limited to the configurations of FIGS. 3, 8, 13 and 17 and the inventive concept may be applied to various stacked memory device that includes various semiconductor dies other than the two, four and eight semiconductor dies.

As such, the stacked memory device, the memory system including the stacked memory device and the address remapping method may be applied adaptively to various devices and systems to enhance performance of the devices and the systems by performing an optimized address remapping operation depending on the provided address management scheme.

To satisfy high speed, high integration degree and low power consumption of a semiconductor memory device, it is required to form all of circuitry in a space of a single package and the integration degree of the semiconductor memory device has been increased through scaling down. Recently three-dimensional stacked package is being developed actively to overcome the limits of scaling down. The stack schemes may be divided largely as follows.

In one embodiment, as described with reference to FIG. 19, a master semiconductor die and slave semiconductor dies may be manufactured distinctively and then they may be packaged together. Each slave semiconductor die may include a memory block (or a memory device) and the master semiconductor die may include a memory block (or a memory device) and a control logic circuit to control the memory blocks (or a memory devices) in the master semiconductor die and the slave semiconductor dies. This scheme may remove the redundant circuits and have advantages in aspects of size and power consumption. In other embodiments, the master semiconductor die may comprise a controller and may not include a memory block functioning as the memory blocks of the slave semiconductor dies.

In one embodiment, as described with reference to FIG. 20, homogeneous semiconductor dies may be manufactured and then they may be packaged together. One of the homogeneous semiconductor dies may be operated in a master mode and the other semiconductor dies may be operated in a slave mode. Each semiconductor die may include a memory block (or a memory device) and a control logic circuit to control the memory block (or a memory device) in the same semiconductor die. This scheme may have advantages in aspect of manufacturing cost and testability since the semiconductor dies have the same configuration.

In one embodiment, as described with reference to FIGS. 21 and 22, an interface semiconductor die or a master semiconductor die may include a control logic circuit without a memory block corresponding to the memory block of the other semiconductor dies, other semiconductor dies or slave semiconductor dies may include only a memory block and they may be packaged together. The interface semiconductor die or master semiconductor die in this embodiment may comprise a cache memory (not shown) used to temporarily store information received from an external source prior to its retransmission (e.g., between a host and the other or slave semiconductor dies). The cache memory may be smaller in size than the size of the memory blocks of the other semiconductor dies or slave semiconductor dies.

Hereinafter, address remapping circuits according to example embodiments are described with reference to FIGS. 19 through 22, for various stack types.

Figure 19:
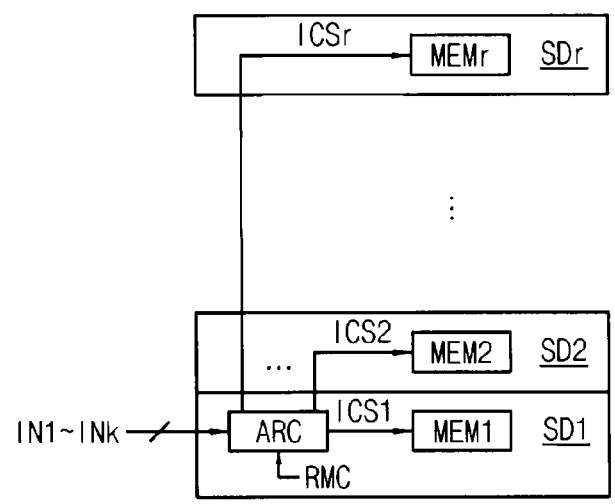
FIG. 19 is a block diagram illustrating a stacked memory device implemented with heterogeneous semiconductor dies according to example embodiments.

FIG. 19 is a block diagram illustrating a stacked memory device implemented with heterogeneous semiconductor dies according to example embodiments.

Referring to FIG. 19, a stacked memory device 401 may include a plurality of stacked semiconductor dies SD1~SDr. FIG. 19 illustrates only input signals IN1~INk for describing example embodiments and other signals such as a command signal CMD, an address signal ADD and a data signal DQ are omitted.

One of the semiconductor dies SD1~SDr may be a master semiconductor die SD1 configured to buffer command-address signals from an external device (e.g., a memory controller) and the rest of the semiconductor dies SD1~SDr may be slave semiconductor dies SD2~SDr configured to receive the buffered command-address signals from the master semiconductor die SD1. An address remapping circuit ARC as described in certain embodiments, may be included in the master semiconductor die SD1.

As described above, the address remapping circuit ARC may receive input signals IN1~INk corresponding to a portion of a plurality of chip selection signals CS1~CSp, a plurality of chip identification signals CID1~CIDq and a plurality of address bit signals An~Am through valid input terminals corresponding to a portion of input signals. The address remapping circuit ARC may generate a plurality of internal chip selection signals ICS1~ICSr based on the input signals IN1~INk and a remapping control signal RMC. The semiconductor dies SD1~SDr may be stacked vertically and include memory devices MEM1~MEMr, respectively. The memory devices MEM1~MEMr in the respective semiconductor dies SD1~SDr may receive the internal chip selection signals ICS1~ICSr, respectively. When the stacked memory device 401 is accessed, one of the internal chip selection signals ICS1~ICSr may be activated and one of the semiconductor dies SD1~SDr may be selected. When the stacked memory device 401 is not accessed, all of the internal chip selection signals ICS1~ICSr may be deactivated and all of the semiconductor dies SD1~SDr may not be selected.

As illustrated in FIG. 19, the master semiconductor die SD1 and the slave semiconductor dies SD2~SDr may have the different configurations and each of the internal chip selection signals ICS1~ICSr may be provided to the one corresponding semiconductor die among the semiconductor dies SD1~SDr. For example, the first internal chip selection signal ICS1 may be transferred to the first memory device MEM1 in the first semiconductor die SD1, the second internal chip selection signal ICS2 may be transferred to the second memory device MEM2 in the second semiconductor die SD2, and in this way the last internal chip selection signal ICSr may be transferred to the last memory device MEMr in the last semiconductor die SDr. As described below with reference to FIG. 28, the internal chip selection signals ICS1~ICSr may be transferred to the respective semiconductor dies SD1~SDr through bonding wires, through-substrate vias (e.g., through-silicon vias) or a combination of the bonding wires and the through-substrate vias.

Figure 20:
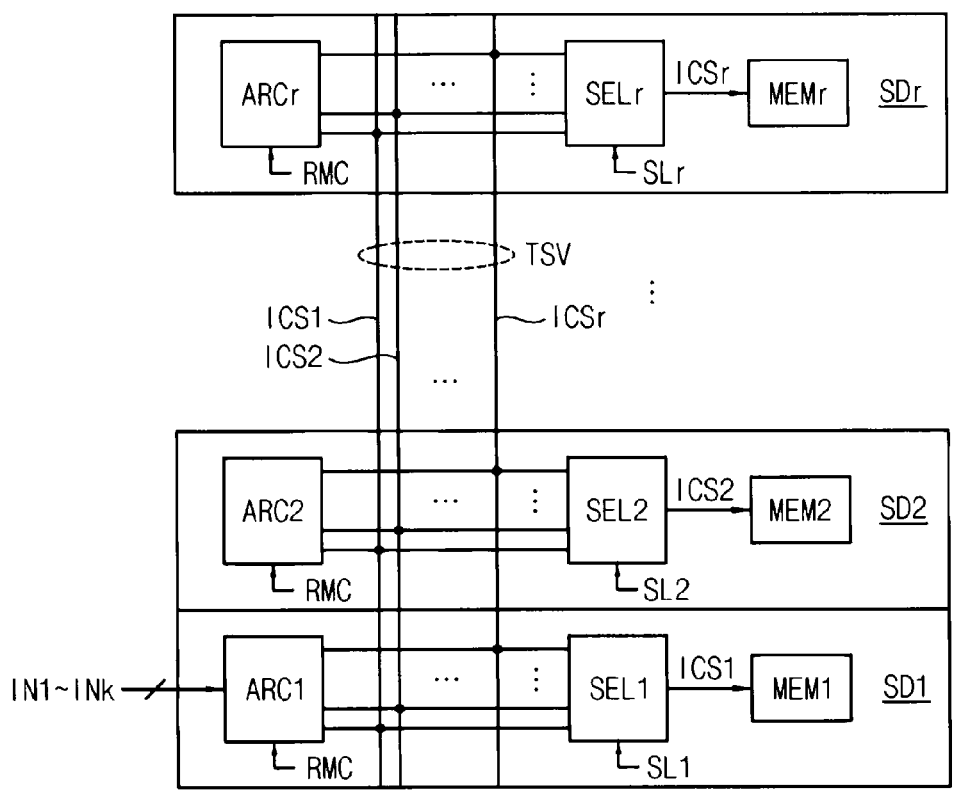
FIG. 20 is a block diagram illustrating a stacked memory device implemented with homogeneous semiconductor dies according to example embodiments.

FIG. 20 is a block diagram illustrating a stacked memory device implemented with homogeneous semiconductor dies according to example embodiments.

Referring to FIG. 20, a stacked memory device 402 may include a plurality of stacked semiconductor dies SD1~SDr. FIG. 20 illustrates only input signals IN1~INk for describing example embodiments and other signals such as a command signal CMD, an address signal ADD and a data signal DQ are omitted.

One of the semiconductor dies SD1~SDr may be operated as a master semiconductor die SD1 configured to buffer command-address signals from an external device (e.g., a memory controller) and the rest of the semiconductor dies SD1~SDr may be operated as slave semiconductor dies SD2~SDr configured to receive the buffered command-address signals from the master semiconductor die SD1. An address remapping circuit ARC as described in certain embodiments, may be included in each of the semiconductor dies SD1~SDr.

As described above, the address remapping circuit ARC may receive input signals IN1~INk corresponding to a portion of a plurality of chip selection signals CS1~CSp, a plurality of chip identification signals CID1~CIDq and a plurality of address bit signals An~Am through valid input terminals corresponding to a portion of input terminals. The address remapping circuit ARC may generate a plurality of internal chip selection signals ICS1~ICSr based on the input signals IN1~INk and a remapping control signal RMC. The semiconductor dies SD1~SDr may be stacked vertically and include memory devices MEM1~MEMr, respectively. The memory devices MEM1~MEMr in the respective semiconductor dies SD1~SDr may receive the internal chip selection signals ICS1~ICSr, respectively. When the stacked memory device 402 is accessed, one of the internal chip selection signals ICS1~ICSr may be activated and one of the semiconductor dies SD1~SDr may be selected. When the stacked memory device 402 is not accessed, all of the internal chip selection signals ICS1~ICSr may be deactivated and all of the semiconductor dies SD1~SDr may not be selected.

As illustrated in FIG. 20, the master semiconductor die SD1 and the slave semiconductor dies SD2~SDr may have the same configuration including the address remapping circuits ARC1~ARCr, respectively, and the internal chip selection signals ICS1~ICSr may be transferred commonly to the semiconductor dies SD1~SDr. Only the address remapping circuit ARC1 in the master semiconductor die SD1 may be enabled to receive the input signals IN1~INk and the address remapping circuits ARC2~ARCr in the slave semiconductor dies SD2~SDr may be disabled. The internal chip selection signals ICS1~ICSr may be transferred to the semiconductor dies SD2~SDr using the through-substrate vias TSVs.

When the internal chip selection signals ICS1~ICSr are transferred commonly to the semiconductor dies SD1~SDr, the semiconductor dies SD1~SDr may include selection circuits SEL1~SELr, respectively. The selection circuits SEL1~SELr may select the one internal chip selection signal corresponding to each of the semiconductor dies SD1~SDr among the commonly transferred internal chip selection signals ICS1~ICSr and transfer the selected internal chip selection signal to each of the memory devices MEM1~MEMr. The selection control signals SL1~SLr to control the selection circuits SEL1~SELr may have the different control values to select the respective internal chip selection signals ICS1~ICSr in the respective semiconductor dies SD1~SDr. The selection control signals SL1~SLr may be generated by the internal logic circuits of the respective semiconductor dies SD1~SDr or by the respective fuse circuits that are cut or programmed before the stacked memory device 402 is packaged.

Figure 21:
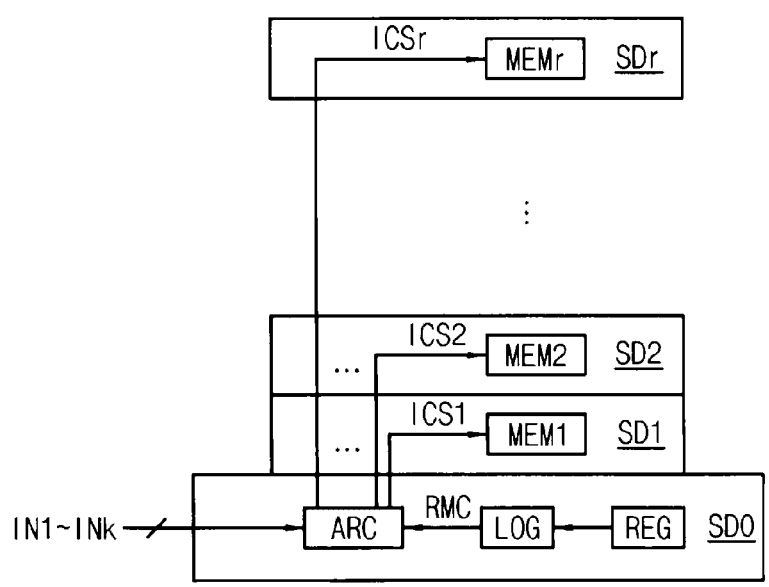
FIGS. 21 and 22 are block diagrams illustrating stacked memory devices including an interface semiconductor die according to example embodiments.
Figure 22:
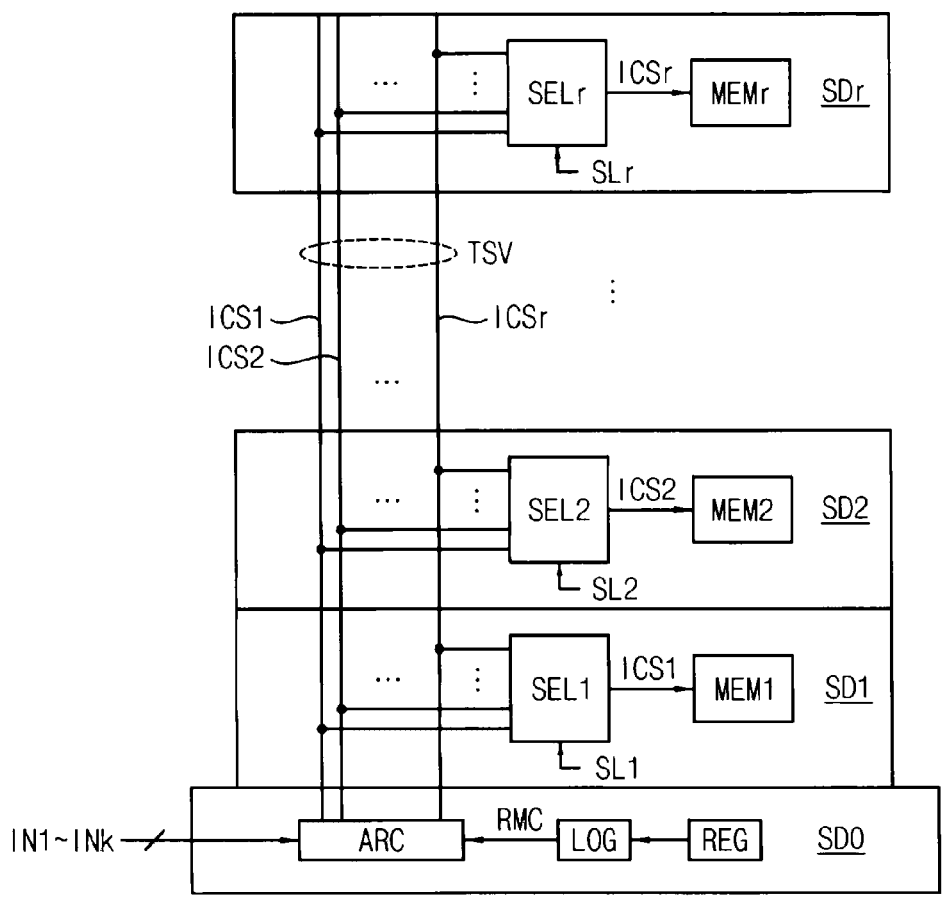

FIGS. 21 and 22 are block diagrams illustrating stacked memory devices including an interface semiconductor die according to example embodiments.

Referring to FIG. 21, a stacked memory device 403 may include a plurality of stacked semiconductor dies SD1~SDr and an interface semiconductor die SD0. FIG. 21 illustrates only input signals IN1~INk for describing example embodiments and other signals such as a command signal CMD, an address signal ADD and a data signal DQ are omitted.

As illustrated in FIG. 21, an address remapping circuit ARC as described in certain embodiments, may be included in the interface semiconductor die SD0 and the semiconductor dies SD1~SDr including the memory devices MEM1~MEMr may have substantially the same configuration.

As described above, the address remapping circuit ARC may receive input signals IN1~INk corresponding to a portion of a plurality of chip selection signals CS1~CSp, a plurality of chip identification signals CID1~CIDq and a plurality of address bit signals An~Am through valid input terminals corresponding to a portion of input terminals. The address remapping circuit ARC may generate a plurality of internal chip selection signals ICS1~ICSr based on the input signals IN1~INk and a remapping control signal RMC. The semiconductor dies SD1~SDr may be stacked vertically and include memory devices MEM1~MEMr, respectively. The memory devices MEM1~MEMr in the respective semiconductor dies SD1~SDr may receive the internal chip selection signals ICS1~ICSr, respectively. When the stacked memory device 403 is accessed, one of the internal chip selection signals ICS1~ICSr may be activated and one of the semiconductor dies SD1~SDr may be selected. When the stacked memory device 403 is not accessed, all of the internal chip selection signals ICS1~ICSr may be deactivated and all of the semiconductor dies SD1~SDr may not be selected.

As illustrated in FIG. 21, each of the internal chip selection signals ICS1~ICSr may be provided to the one corresponding semiconductor die among the semiconductor dies SD1~SDr. For example, the first internal chip selection signal ICS1 may be transferred to the first memory device MEM1 in the first semiconductor die SD1, the second internal chip selection signal ICS2 may be transferred to the second memory device MEM2 in the second semiconductor die SD2, and in this way the last internal chip selection signal ICSr may be transferred to the last memory device MEMr in the last semiconductor die SDr. As described below with reference to FIG. 28, the internal chip selection signals ICS1~ICSr may be transferred to the respective semiconductor dies SD1~SDr through bonding wires, through-substrate vias or a combination of the bonding wires and the through-substrate vias.

Referring to FIG. 22, a stacked memory device 404 may include a plurality of semiconductor dies SD1~SDr and an interface semiconductor die SD0. FIG. 22 illustrates only input signals IN1~INk for describing example embodiments and other signals such as a command signal CMD, an address signal ADD and a data signal DQ are omitted.

As illustrated in FIG. 22, an address remapping circuit ARC as described in certain embodiments, may be included in the interface semiconductor die SD0 and the semiconductor dies SD1~SDr including the memory devices MEM1~MEMr may have substantially the same configuration.

As described above, the address remapping circuit ARC may receive input signals IN1~INk corresponding to a portion of a plurality of chip selection signals CS1~CSp, a plurality of chip identification signals CID1~CIDq and a plurality of address bit signals An~Am through valid input terminals corresponding to a portion of input terminals. The address remapping circuit ARC may generate a plurality of internal chip selection signals ICS1~ICSr based on the input signals IN1~INk and a remapping control signal RMC. The semiconductor dies SD1~SDr may be stacked vertically and include memory devices MEM1~MEMr, respectively. The memory devices MEM1~MEMr in the respective semiconductor dies SD1~SDr may receive the internal chip selection signals ICS1~ICSr, respectively. When the stacked memory device 404 is accessed, one of the internal chip selection signals ICS1~ICSr may be activated and one of the semiconductor dies SD1~SDr may be selected. When the stacked memory device 404 is not accessed, all of the internal chip selection signals ICS1~ICSr may be deactivated and all of the semiconductor dies SD1~SDr may not be selected.

As illustrated in FIG. 22, the semiconductor dies SD1~SDr may have the same configuration including the address remapping circuits ARC1~ARCr, respectively, and the internal chip selection signals ICS1~ICSr may be transferred commonly to the semiconductor dies SD1~SDr. The internal chip selection signals ICS1~ICSr may be transferred to the semiconductor dies SD1~SDr using the through-substrate vias (e.g., through-silicon vias) TSVs.

When the internal chip selection signals ICS1~ICSr are transferred commonly to the semiconductor dies SD1~SDr, the semiconductor dies SD1~SDr may include selection circuits SEL1~SELr, respectively. The selection circuits SEL1~SELr may select the one internal chip selection signal corresponding to each of the semiconductor dies SD1~SDr among the commonly transferred internal chip selection signals ICS1~ICSr and transfer the selected internal chip selection signal to each of the memory devices MEM1~MEMr. The selection control signals SL1~SLr to control the selection circuits SEL1~SELr may have the different control values to select the respective internal chip selection signals ICS1~ICSr in the respective semiconductor dies SD1~SDr. The selection control signals SL1~SLr may be generated by the internal logic circuits of the respective semiconductor dies SD1~SDr or by the respective fuse circuits that are cut or programmed before the stacked memory device 404 is packaged.

Figure 23:
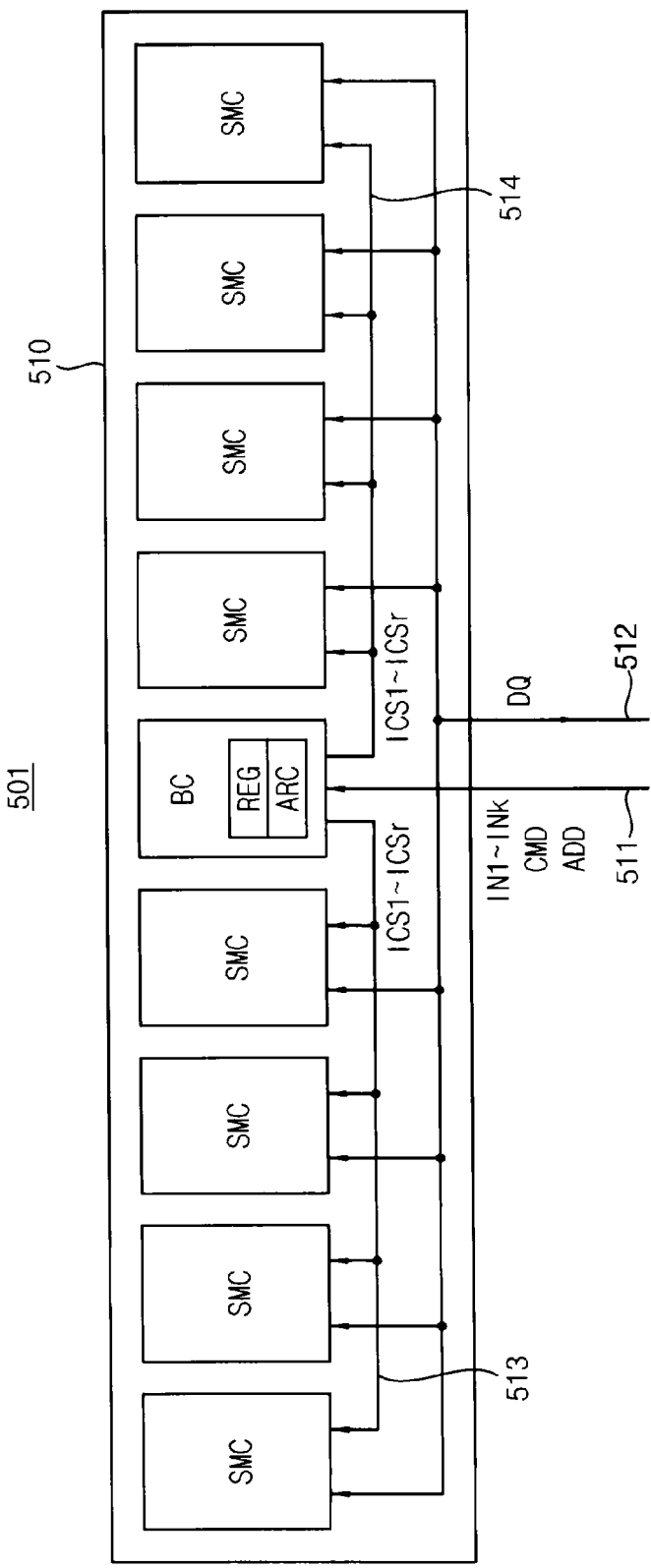
FIGS. 23 and 24 are block diagrams illustrating memory modules according to example embodiments.
Figure 24:
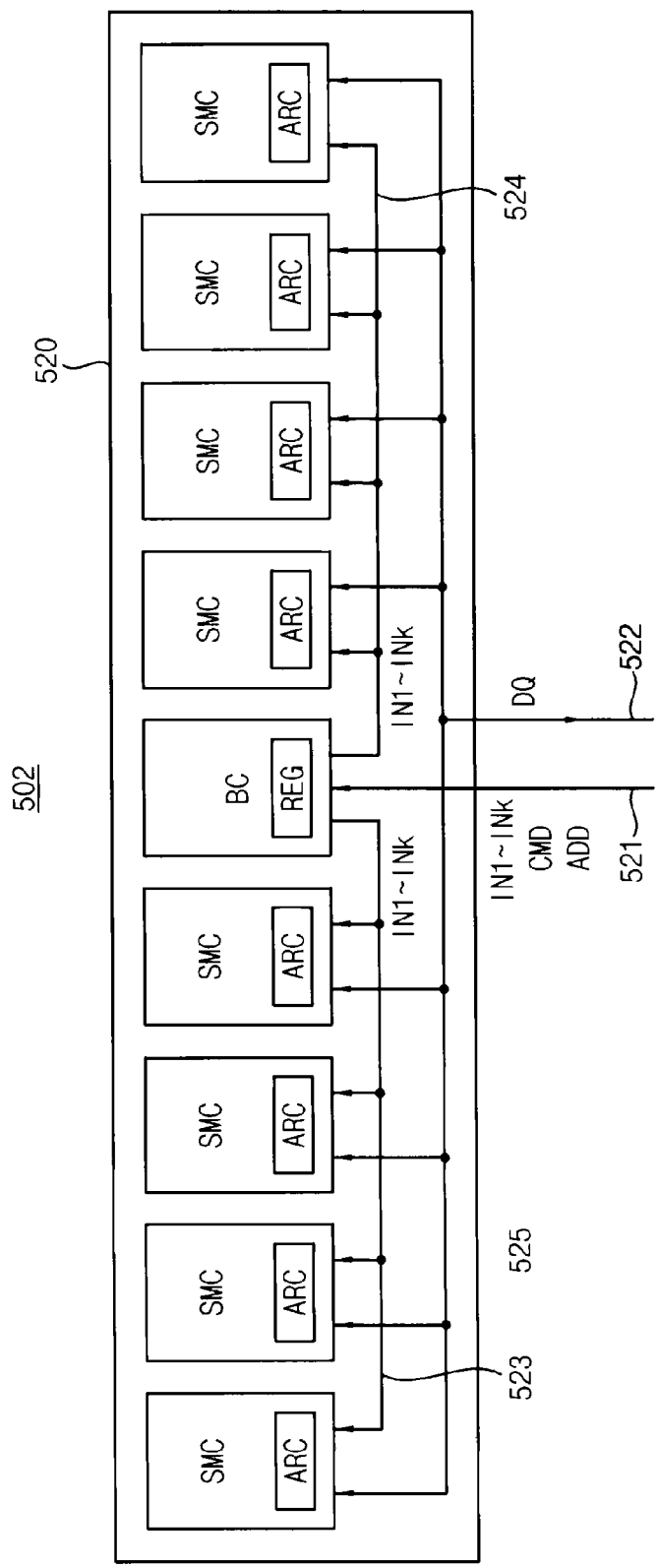

FIGS. 23 and 24 are block diagrams illustrating memory modules according to example embodiments.

Referring to FIG. 23, a memory module 501 may include a module substrate 510, a plurality of stacked semiconductor memory chips SMC and a buffer chip.

The plurality of stacked semiconductor memory chips SMC may be mounted on the module substrate 510 and each of the stacked semiconductor memory chips SMC may receive data DQ from an external device such as a memory controller through a data bus 512 in a write mode, or transmit the data DQ to the external device through the data bus 512 in a read mode. Each of the stacked semiconductor memory chips SMC may include semiconductor dies SD1~SDr.

The buffer chip BC may be mounted on the module substrate 510 and the buffer chip BC may receive command signals CMD and address signals ADD through a control bus 511 to provide the received signals CMD and ADD to the stacked semiconductor memory chips SMC through internal buses 513 and 514. The buffer chip BC may include a register REG to store control information of the memory module 501. The buffer chip BC may include an address remapping circuit ARC as described in certain embodiments.

As described above, the address remapping circuit ARC may include a plurality of input terminals for receiving a plurality of chip selection signals CS1~CSp and a plurality of chip identification signals CID1~CIDq. In some example embodiments, the input terminals may further receive one or more address bit signals An~Am. The address remapping circuit ARC may receive input signals IN1~INk corresponding to a portion of the chip selection signals CS1~CSp, the chip identification signals CID1~CIDq and the address bit signals An~Am through valid input terminals corresponding to a portion of input terminals. The address remapping circuit ARC may generate a plurality of internal chip selection signals ICS1~ICSr based on the input signals IN1~INk and a remapping control signal RMC. The semiconductor dies SD1~SDr in each stacked semiconductor memory chip SMC may be stacked vertically and include memory devices MEM1~MEMr, respectively. The memory devices MEM1~MEMr in the respective semiconductor dies SD1~SDr may receive the internal chip selection signals ICS1~ICSr, respectively.

As illustrated in FIG. 23, each of the stacked semiconductor memory chips SMC may receive the internal chip selection signals ICS1~ICSr through the internal control bus 513 or 514 from the address remapping circuit ARC in the buffer chip BC.

As such, the address remapping circuit ARC may be applied adaptively to the memory module 501 to enhance performance of the memory module 501 by performing an optimized address remapping operation depending on the provided address management scheme.

Referring to FIG. 24, a memory module 502 may include a module substrate 520 and a plurality of stacked semiconductor memory chips SMC.

The plurality of stacked semiconductor memory chips SMC may be mounted on the module substrate 520 and each of the stacked semiconductor memory chips SMC may receive data DQ from an external device such as a memory controller through a data bus 522 in a write mode, or transmit the data DQ to the external device through the data bus 522 in a read mode. Each of the stacked semiconductor memory chips SMC may include semiconductor dies SD1~SDR and an address remapping circuit ARC as described in certain embodiments.

The buffer chip BC may be mounted on the module substrate 520 and the buffer chip BC may receive command signals CMD and address signals ADD through a control bus 521 to provide the received signals CMD and ADD to the stacked semiconductor memory chips SMC through internal buses 523 and 524. The buffer chip BC may include a register REG to store control information of the memory module 501.

In one embodiment, each address remapping circuit ARC may include a plurality of input terminals for receiving a plurality of chip selection signals CS1~CSp and a plurality of chip identification signals CID1~CIDq. In some example embodiments, the input terminals may further receive one or more address bit signals An~Am. The address remapping circuit ARC may receive input signals IN1~INk corresponding to a portion of the chip selection signals CS1~CSp, the chip identification signals CID1~CIDq and the address bit signals An~Am through valid input terminals corresponding to a portion of input terminals. The address remapping circuit ARC may generate a plurality of internal chip selection signals ICS1~ICSr based on the input signals IN1~INk and a remapping control signal RMC. The semiconductor dies SD1~SDr in each stacked semiconductor memory chip SMC may be stacked vertically and include memory devices MEM1~MEMr, respectively. The memory devices MEM1~MEMr in the respective semiconductor dies SD1~SDr may receive the internal chip selection signals ICS1~ICSr, respectively.

As illustrated in FIG. 24, the address remapping circuits ARC may be included in each of the stacked semiconductor memory chips SMC, respectively. For example, each of the stacked semiconductor memory chips SMC may receive the input signals IN1~INk through the internal control bus 523 or 524 from buffer chip BC. The address remapping circuit ARC in each stacked semiconductor memory chip SMC may generate the internal chip selection signals ICS1~ICSr to be provided to its own semiconductor dies.

As such, the address remapping circuit ARC may be applied adaptively to the memory module 502 to enhance performance of the memory module 502 by performing an optimized address remapping operation depending on the provided address management scheme.

Figure 25:
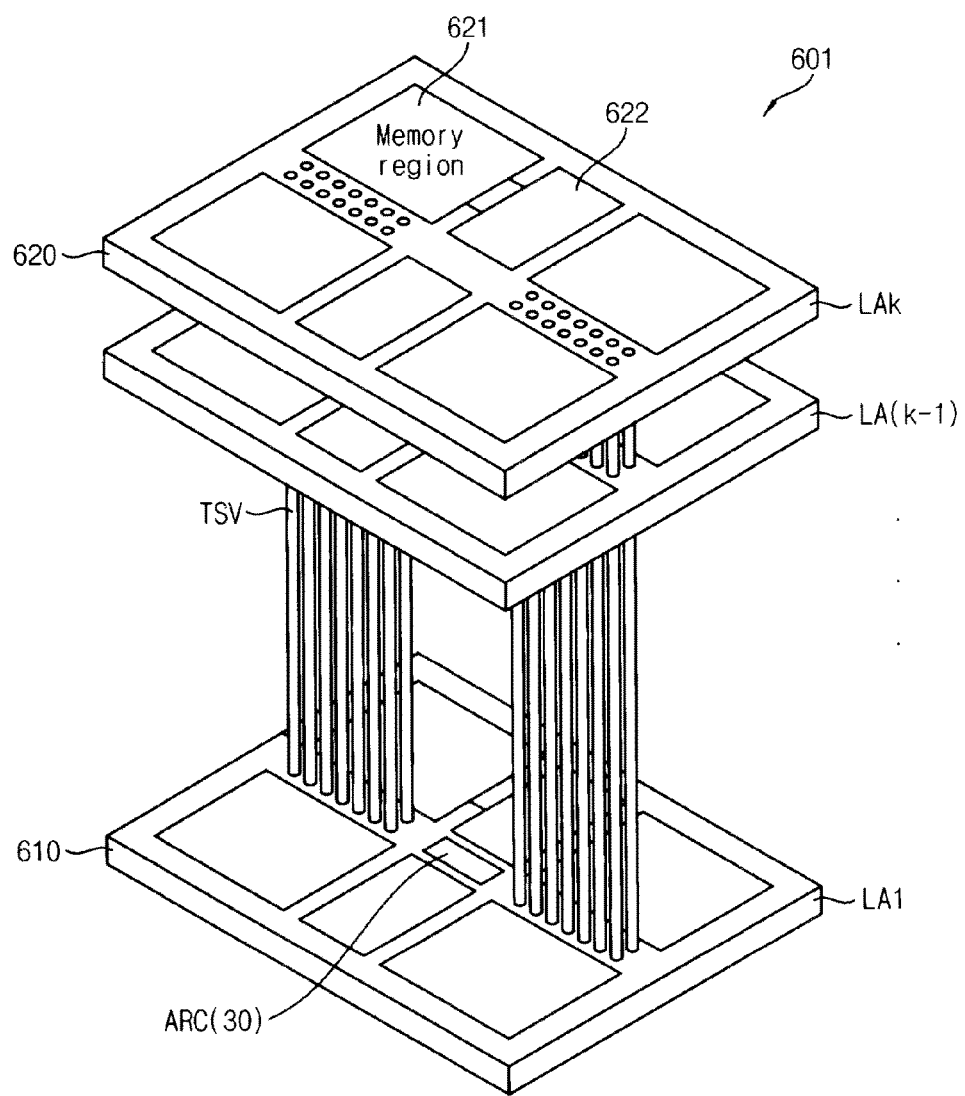
FIGS. 25 and 26 are diagrams illustrating structures of a stacked memory device according to example embodiments.
Figure 26:
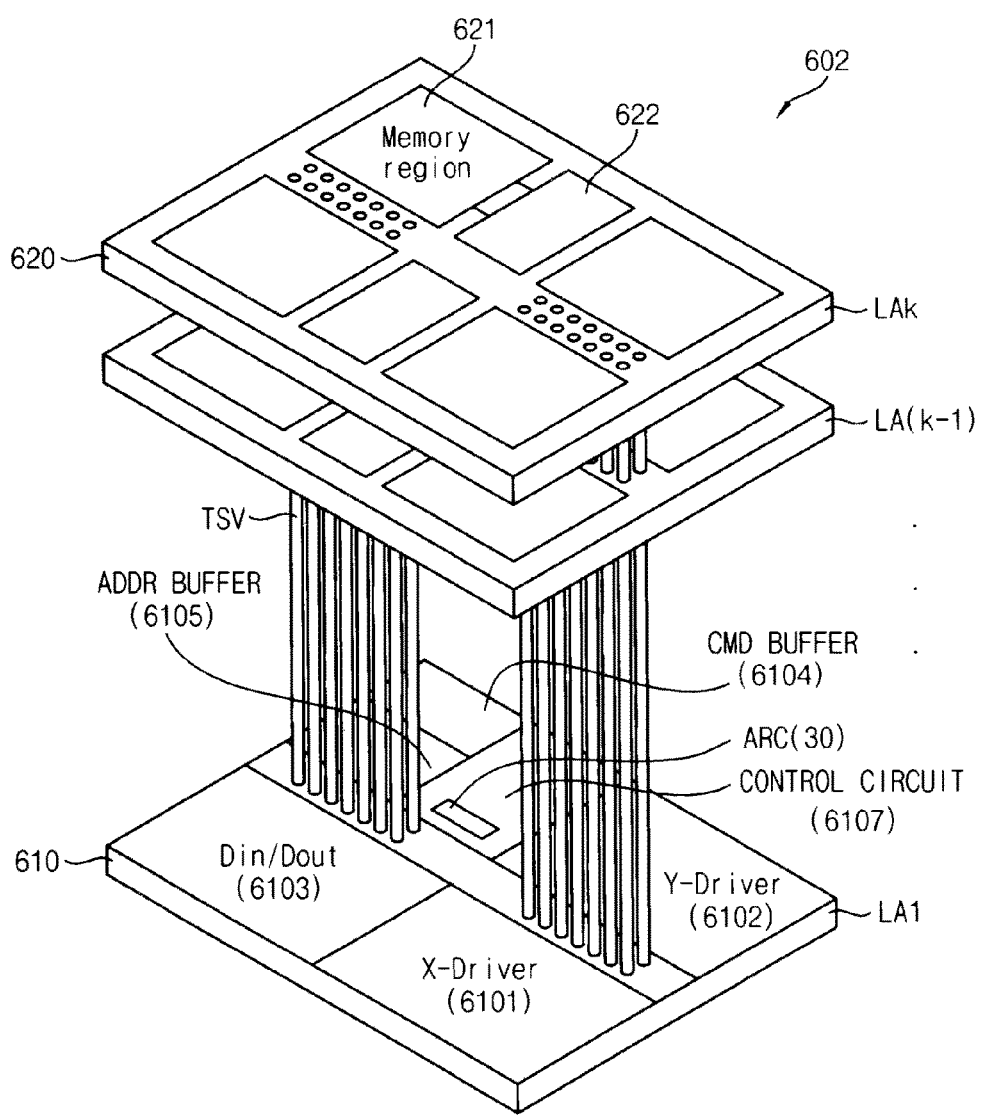

FIGS. 25 and 26 are diagrams illustrating structures of a stacked memory device according to example embodiments.

Referring to FIG. 25, a semiconductor memory device 601 may include first through kth semiconductor integrated circuit layers LA1 through LAk, in which the first semiconductor integrated circuit layer LA1 may be a master layer and the other semiconductor integrated circuit layers LA2 through LAk may be slave layers.

The first through kth semiconductor integrated circuit layers LA1 through LAk may transmit and receive signals between the layers by through-substrate vias (e.g., through-silicon vias) TSVs. The first semiconductor integrated circuit layer LA1 as the master layer may communicate with an external device (e.g., a memory controller) through a conductive structure formed on an external surface. A description will be made regarding structure and an operation of the semiconductor memory device 601 by mainly using the first semiconductor integrated circuit layer LA1 or 610 as the master layer and the kth semiconductor integrated circuit layer LAk or 620 as the slave layer.

The first semiconductor integrated circuit layer 610 and the kth semiconductor integrated circuit layer 620 may include memory regions 621 and various peripheral circuits for driving the memory regions 621. For example, the peripheral circuits may include a row (X)-driver for driving wordlines of the memory regions 621, a column (Y)-driver for driving bit lines of the memory regions 621, a data input/output unit (Din/Dout) for controlling input/output of data, a command buffer (CMD) for receiving a command CMD from outside and buffering the command CMD, and an address buffer (ADDR) for receiving an address from outside and buffering the address.

The first semiconductor integrated circuit layer 610 may further include an address remapping circuit ARC 30 as described in certain embodiments. As described above, the address remapping circuit 30 may include a plurality of input terminals for receiving a plurality of chip selection signals CS1~CSp and a plurality of chip identification signals CID1~CIDq. In some example embodiments, the input terminals may further receive one or more address bit signals An~Am. The address remapping circuit 30 may receive input signals IN1~INk corresponding to a portion of the chip selection signals CS1~CSp, the chip identification signals CID1~CIDq and the address bit signals An~Am through valid input terminals corresponding to a portion of input terminals. The address remapping circuit 30 may generate a plurality of internal chip selection signals ICS1~ICSr based on the input signals IN1~INk and a remapping control signal RMC. The internal chip selection signal ICS1~ICSr may be provided to the semiconductor integrated circuit layers LA1 through LAk, respectively, through through-substrate vias TSVs.

Referring to FIG. 26, a semiconductor memory device 602 may include first through kth semiconductor integrated circuit layers LA1 through LAk, in which the first semiconductor integrated circuit layer LA1 may be an interface layer and the other semiconductor integrated circuit layers LA2 through LAk may be memory layers.

The first through kth semiconductor integrated circuit layers LA1 through LAk may transmit and receive signals between the layers by through-substrate vias (e.g., through-silicon vias) TSVs. The first semiconductor integrated circuit layer LA1 as the interface layer may communicate with an external memory controller through a conductive structure formed on an external surface. A description will be made regarding structure and an operation of the semiconductor memory device 602 by mainly using the first semiconductor integrated circuit layer LA1 or 610 as the interface layer and the kth semiconductor integrated circuit layer LAk or 620 as the memory layer.

The first semiconductor integrated circuit layer 610 as the master layer may include various peripheral circuits for driving the memory regions 621 in the kth semiconductor integrated circuit layer 620 as the memory layer. For example, the first semiconductor integrated circuit layer 610 may include a row (X)-driver 6101 for driving wordlines of the memory regions 621, a column (Y)-driver 6102 for driving bit lines of the memory regions 621, a data input/output circuit (Din/Dout) 6103 for controlling input/output of data, a command buffer (CMD buffer) 6104 for receiving a command CMD from outside and buffering the command CMD, and an address buffer (ADDR buffer) 6105 for receiving an address from outside and buffering the address.

The first semiconductor integrated circuit layer 610 may further include a control circuit 6107 and the control circuit 6107 may generate control signals to control the memory regions 621 in the kth semiconductor integrated circuit layer 620 based on the command-address signals from the memory controller.

The first semiconductor integrated circuit layer 610 may further include an address remapping circuit ARC 30 as described in certain embodiments. As described above, the address remapping circuit 30 may include a plurality of input terminals for receiving a plurality of chip selection signals CS1~CSp and a plurality of chip identification signals CID1~CIDq. In some example embodiments, the input terminals may further receive one or more address bit signals An~Am. The address remapping circuit 30 may receive input signals IN1~INk corresponding to a portion of the chip selection signals CS1~CSp, the chip identification signals CID1~CIDq and the address bit signals An~Am through valid input terminals corresponding to a portion of input terminals. The address remapping circuit 30 may generate a plurality of internal chip selection signals ICS1~ICSr based on the input signals IN1~INk and a remapping control signal RMC. The internal chip selection signal ICS1~ICSr may be provided to the semiconductor integrated circuit layers LA1 through LAk, respectively, through through-substrate vias TSVs.

Figure 27:
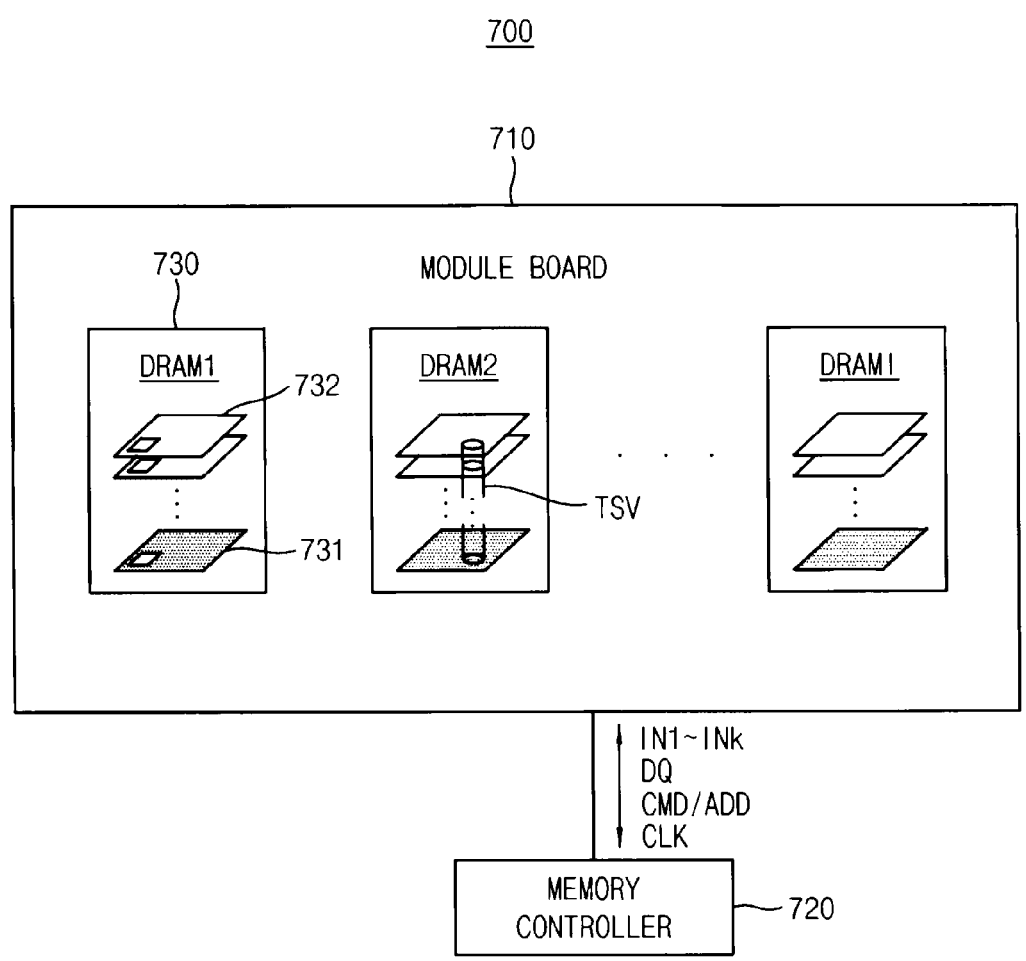
FIG. 27 is a block diagram illustrating a memory system according to example embodiments.

FIG. 27 is a block diagram illustrating a memory system according to example embodiments.

Referring to FIG. 27, a memory system 700 may include a memory module 710 and a memory controller 720. The memory module 710 may include at least one semiconductor memory device 730 mounted on a module substrate. For example, the semiconductor memory device 730 may be constructed as a DRAM chip. In addition, the semiconductor memory device 730 may include a stack of semiconductor dies. In some example embodiments, the semiconductor dies may include the master die 731 and the slave dies 732 as described with reference to FIG. 25. In other example embodiments, the semiconductor dies may include the interface die 731 and the memory dies or the slave dies 732. Signal transfer between the semiconductor chips may occur via through-substrate vias (e.g., through-silicon vias) TSVs.

The memory module 710 may communicate with the memory controller 720 via a system bus. Data DQ, command/address CMD/ADD, and a clock signal CLK may be transmitted and received between the memory module 710 and the memory controller 720 via the system bus.

As described above with reference to FIGS. 23 and 24, the memory module 710 may include at least one address remapping circuit ARC (not shown) as described in certain embodiments. Each address remapping circuits ARC may include a plurality of input terminals for receiving a plurality of chip selection signals CS1~CSp and a plurality of chip identification signals CID1~CIDq. In some example embodiments, the input terminals may further receive one or more address bit signals An~Am. The address remapping circuit ARC may receive input signals IN1~INk corresponding to a portion of the chip selection signals CS1~CSp, the chip identification signals CID1~CIDq and the address bit signals An~Am through valid input terminals corresponding to a portion of input terminals. The address remapping circuit ARC may generate a plurality of internal chip selection signals ICS1~ICSr based on the input signals IN1~INk and a remapping control signal RMC. The semiconductor dies SD1~SDr in each semiconductor memory die may be stacked vertically and include memory devices MEM1~MEMr, respectively. The memory devices MEM1~MEMr in the respective semiconductor dies SD1~SDr may receive the internal chip selection signals ICS1~ICSr, respectively.

Figure 28:
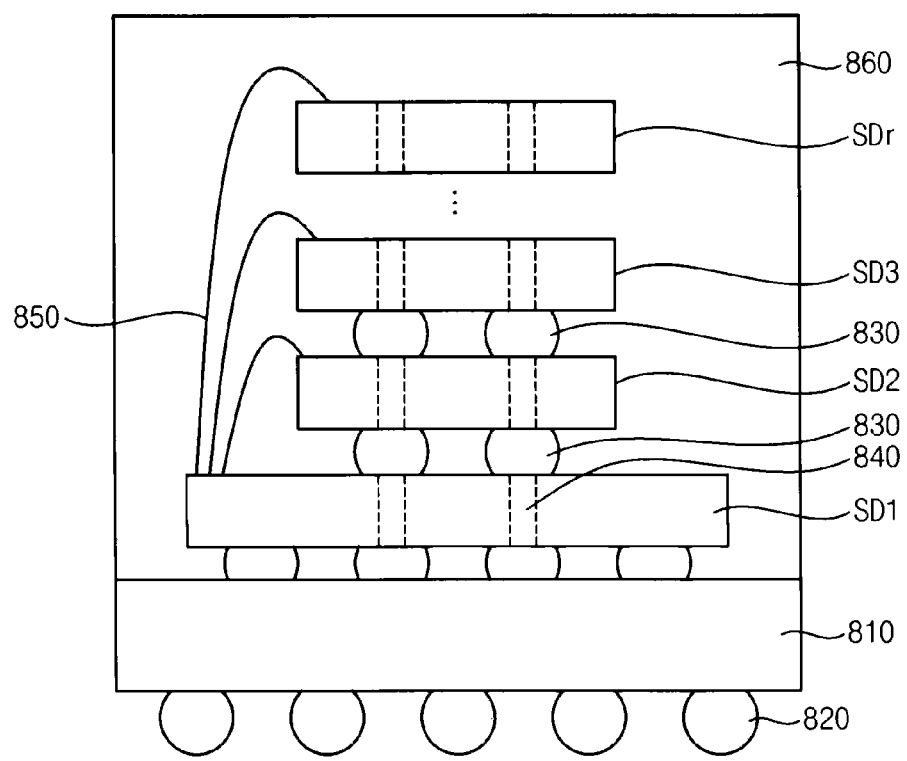
FIG. 28 is a diagram for describing a package structure of a memory chip according to example embodiments.

FIG. 28 is a diagram for describing a package structure of a memory chip according to example embodiments.

Referring to FIG. 28, a stacked memory chip 800 may include a base substrate 810 and a plurality of semiconductor dies SD1~SDr stacked on the base substrate 810.

The base substrate 810 may be a printed circuit board (PCB). External connecting members 820, e.g., package terminals comprised of conductive bumps, may be formed on a lower surface of the base substrate 810. Internal connecting members 830, e.g., chip terminals comprised of conductive bumps, may be formed on a upper surface of the base substrate 810 and between the semiconductor dies SD1~SDr. In some example embodiments, the semiconductor dies SD1~SDr may be connected to each other and to the base substrate 810 by the through-substrate vias TSVs 840 and the conductive bumps. In other example embodiments, the semiconductor dies SD1~SDr may be connected to the base substrate 810 by bonding wires 850 and the conductive bumps. In still other example embodiments, the semiconductor dies SD1~SDr may be connected to the base substrate 810 by a combination of the through-substrate vias 840, the conductive bumps, and the bonding wires 850. The stacked semiconductor dies SD1~SDr may be packaged using the sealing member 860.

In some example embodiments, the first semiconductor die SD1 directly on the base substrate 810 in FIG. 28 may be the master semiconductor die and the second through the last semiconductor dies SD2~SDr stacked on the first semiconductor die SD1 may be the slave semiconductor dies as described with reference to FIGS. 19 and 20.

In other example embodiments, the first semiconductor die SD1 directly on the base substrate 810 in FIG. 28 may be the interface semiconductor die and the second through the last semiconductor dies SD2~SDr stacked on the first semiconductor die SD1 may be the memory semiconductor dies or the slave semiconductor dies as described with reference to FIGS. 21 and 22.

The first semiconductor die SD1 corresponding to the master semiconductor die or the interface semiconductor die may include an address remapping circuit ARC (not shown) as described in certain embodiments. The address remapping circuits ARC may include a plurality of input terminals for receiving a plurality of chip selection signals CS1~CSp and a plurality of chip identification signals CID1~CIDq. In some example embodiments, the input terminals may further receive one or more address bit signals An~Am. The address remapping circuit ARC may receive input signals IN1~INk corresponding to a portion of the chip selection signals CS1~CSp, the chip identification signals CID1~CIDq and the address bit signals An~Am through valid input terminals corresponding to a portion of input terminals. The address remapping circuit ARC may generate a plurality of internal chip selection signals ICS1~ICSr based on the input signals IN1~INk and a remapping control signal RMC. The semiconductor dies SD1~SDr may include memory devices MEM1~MEMr to receive the internal chip selection signal ICS1~ICSr, respectively.

Figure 29:
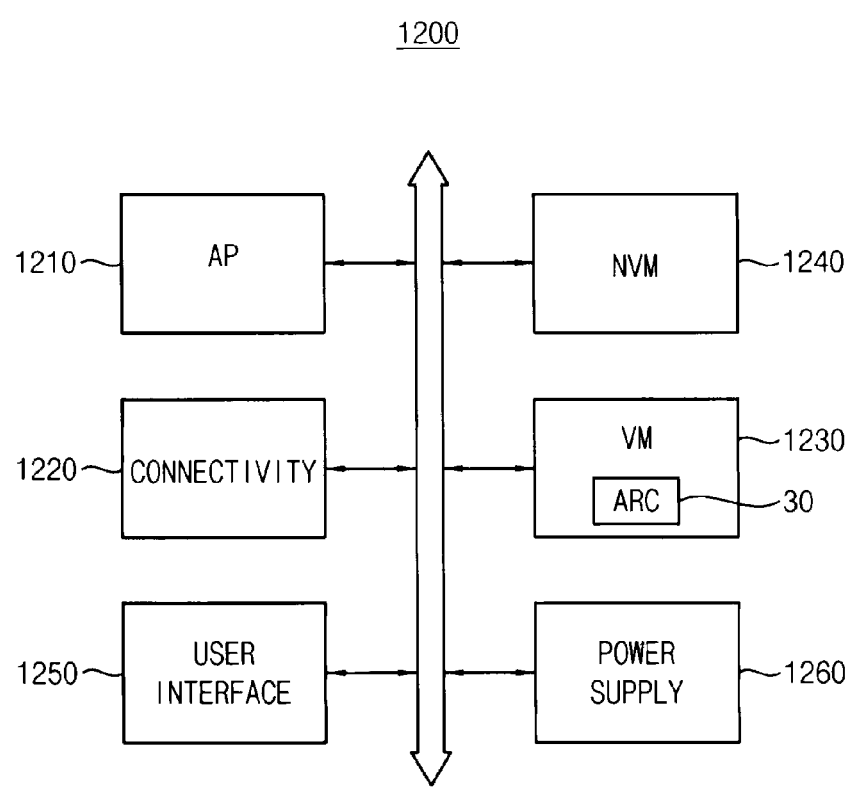
FIG. 29 is a block diagram illustrating a mobile system according to example embodiments.

FIG. 29 is a block diagram illustrating a mobile system according to example embodiments.

Referring to FIG. 29, a mobile system 1200 includes an application processor (AP) 1210, a connectivity unit 1220, a volatile memory device (VM) 1230, a nonvolatile memory device (NVM) 1240, a user interface 1250, and a power supply 1260. In some embodiments, the mobile system 1200 may be, for example, a mobile phone, a smart phone, a personal digital assistant (PDA), a portable multimedia player (PMP), a digital camera, a music player, a portable game console, a navigation system, or another type of electronic device.

The application processor 1210 may execute applications such as a web browser, a game application, a video player, etc. In some embodiments, the application processor 1210 may include a single core or multiple cores. For example, the application processor 1210 may be a multi-core processor such as a dual-core processor, a quad-core processor, a hexa-core processor, etc. The application processor 1210 may include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, universal serial bus (USB) communication, etc. In some embodiments, connectivity unit 1220 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc. The volatile memory device 1230 may include an address remapping circuit ARC 30 as described in certain embodiments. The address remapping circuit 30 may perform the adaptive address remapping as described above. The address remapping circuit 30 may be applied to the mobile system 1200 having various configurations to enhance performance of the mobile system 1200 by performing an optimized address remapping operation depending on the provided address management scheme.

The nonvolatile memory device 1240 may store a boot image for booting the mobile system 1200. For example, the nonvolatile memory device 1240 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

In some embodiments, the mobile system 1200 and/or components of the mobile system 1200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), wafer-level processed stack package (WSP), etc.

Figure 30:
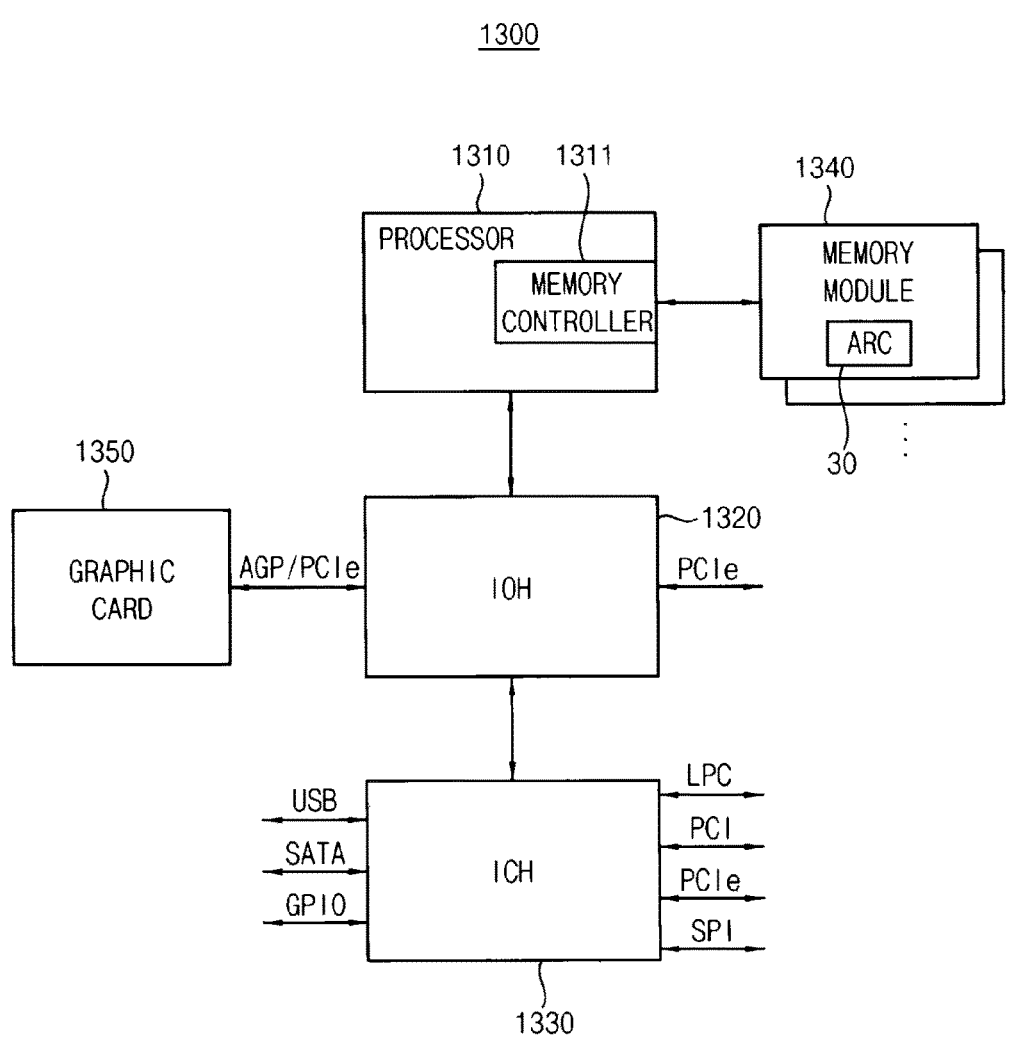
FIG. 30 is a block diagram illustrating a computing system according to example embodiments.

FIG. 30 is a block diagram illustrating a computing system according to example embodiments.

Referring to FIG. 30, a computing system 1300 includes a processor 1310, an input/output hub (IOH) 1320, an input/output controller hub (ICH) 1330, at least one memory module 1340, and a graphics card 1350. In some embodiments, the computing system 1300 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1310 may perform various computing functions such as executing specific software for performing specific calculations or tasks. For example, the processor 1310 may be a microprocessor, a central process unit (CPU), a digital signal processor, or the like. In some embodiments, the processor 1310 may include a single core or multiple cores. For example, the processor 1310 may be a multi-core processor, such as a dual-core processor, a quad-core processor, a hexa-core processor, etc. Although FIG. 30 illustrates the computing system 1300 including one processor 1310, in some embodiments, the computing system 1300 may include a plurality of processors. The processor 1310 may include an internal or external cache memory.

The processor 1310 may include a memory controller 1311 for controlling operations of the memory module 1340. The memory controller 1311 included in the processor 1310 may be referred to as an integrated memory controller (IMC). A memory interface between the memory controller 1311 and the memory module 1340 may be implemented with a single channel including a plurality of signal lines, or may bay be implemented with multiple channels, to each of which at least one memory module 1340 may be coupled. In some embodiments, the memory controller 1311 may be located inside the input/output hub 1320, which may be referred to as memory controller hub (MCH).

The memory module 1340 may include a plurality of memory devices that store data provided from the memory controller 1311 and an address remapping circuit ARC 30 as described in certain embodiments. The address remapping circuit 30 may perform the adaptive address remapping as described above. The address remapping circuit 30 may be applied to the computing system 1300 having various configurations to enhance performance of the computing system 1300 by performing an optimized address remapping operation depending on the provided address management scheme.

The input/output hub 1320 may manage data transfer between processor 1310 and devices, such as the graphics card 1350. The input/output hub 1320 may be coupled to the processor 1310 via various interfaces. For example, the interface between the processor 1310 and the input/output hub 1320 may be a front side bus (FSB), a system bus, a HyperTransport, a lightning data transport (LDT), a Quick-Path interconnect (QPI), a common system interface (CSI), etc. Although FIG. 19 illustrates the computing system 1300 including one input/output hub 1320, in some embodiments, the computing system 1300 may include a plurality of input/output hubs. The input/output hub 1320 may provide various interfaces with the devices. For example, the input/output hub 1320 may provide an accelerated graphics port (AGP) interface, a peripheral component interface-express (PCIe), a communications streaming architecture (CSA) interface, etc.

The graphic card 1350 may be coupled to the input/output hub 1320 via AGP or PCIe. The graphics card 1350 may control a display device (not shown) for displaying an image. The graphics card 1350 may include an internal processor for processing image data and an internal memory device. In some embodiments, the input/output hub 1320 may include an internal graphics device along with or instead of the graphics card 1350 outside the graphics card 1350. The graphics device included in the input/output hub 1320 may be referred to as integrated graphics. Further, the input/output hub 1320 including the internal memory controller and the internal graphics device may be referred to as a graphics and memory controller hub (GMCH).

The input/output controller hub 1330 may perform data buffering and interface arbitration to efficiently operate various system interfaces. The input/output controller hub 1330 may be coupled to the input/output hub 1320 via an internal bus, such as a direct media interface (DMI), a hub interface, an enterprise Southbridge interface (ESI), PCIe, etc. The input/output controller hub 1330 may provide various interfaces with peripheral devices. For example, the input/output controller hub 1330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1310, the input/output hub 1320 and the input/output controller hub 1330 may be implemented as separate chipsets or separate integrated units. In other embodiments, at least two of the processor 1310, the input/output hub 1320 and the input/output controller hub 1330 may be implemented as a single chipset. Also, while many features of the embodiments are disclosed as units, in other embodiments those features may be implemented as other forms of logic including but not limited to code-based operations performed by a processor.

As such, the stacked memory device, the memory chip, the memory module, the memory system and the address remapping method may be applied adaptively to various devices and systems to enhance performance of the devices and the systems by performing an optimized address remapping operation depending on the provided address management scheme.

The present disclosure may be applied to arbitrary devices and systems including a memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory system comprising:
    an address remapping circuit including a plurality of input terminals for receiving a plurality of chip selection signals and a plurality of chip identification signals, the address remapping circuit configured to receive input signals corresponding to a portion of the plurality of chip selection signals and the plurality of chip identification signals through corresponding input terminals of the plurality of input terminals and configured to generate a plurality of internal chip selection signals based on the input signals and a remapping control signal; and
    a first set of memory devices each memory device configured to receive a corresponding one of the plurality of internal chip selection signals such that each memory device is selected in response to the corresponding one of the internal chip selection signals,
    wherein the address remapping circuit is configured to activate only one of the internal chip selection signals when the first set of memory devices are accessed.

2. The memory system of claim 1, wherein the remapping control signal is programmable.

3. The memory system of claim 1, further comprising:
    a register configured to store interface mode information representing valid input terminals of the address remapping circuit through which the input signals may be received,
    wherein the remapping control signal is generated based on the interface mode information stored in the register.

4. The memory system of claim 1, wherein each of the first set of memory devices comprises a semiconductor die, and
    wherein the memory devices are stacked on each other.

5. The memory system of claim 1,
    wherein each of the first set of memory devices comprises a semiconductor die,
    wherein the memory devices are stacked on each other,
    wherein one of the semiconductor dies corresponds to a master semiconductor die configured to buffer command-address signals and the other semiconductor dies each corresponds to a slave semiconductor die configured to receive the buffered command-address signals from the master semiconductor die, and
    wherein the address remapping circuit is included in the master semiconductor die.

6. The memory system of claim 5, wherein each of the semiconductor dies has a same configuration including the address remapping circuit,
    wherein the address remapping circuit in the master semiconductor die is configured to receive the input signals, and
    wherein the address remapping circuit in each of the slave semiconductor dies is not configured to receive the input signals.

7. The memory system of claim 1,
    wherein each of the first set of memory devices is a semiconductor die, and
    wherein the memory system further comprises an interface semiconductor die stacked with the semiconductor dies, the interface semiconductor die configured to buffer command-address signals and to transfer the buffered command-address signals to the semiconductor dies.

8. The memory system of claim 7, wherein the address remapping circuit is included in the interface semiconductor die.

9. The memory system of claim 1, wherein the plurality of input terminals further include at least one input terminal for receiving at least a first address bit signal.

10. The memory system of claim 1,
    wherein each of the first set of memory devices comprises a semiconductor die,
    wherein the memory devices are stacked on each other,
    wherein the memory system further comprises:
        a module substrate;
        the first set of memory devices and one or more additional sets of memory devices mounted on the module substrate, each set of memory devices comprising a plurality of semiconductor dies stacked on each other; and a buffer chip mounted on the module substrate, the buffer chip configured to buffer command-address signals and transfer the buffered command-address signals to each set of memory devices.

11. A memory module comprising:

a module substrate;

a plurality of stacked memory chips mounted on the module substrate;

a buffer chip mounted on the module substrate, the buffer chip configured to buffer command-address signals from an external device and transfer the buffered command-address signals to the memory chips and configured to transfer a remapping control signal based on interface mode information; and an address remapping circuit including a plurality of input terminals for receiving a plurality of input signals from the external device, the address remapping circuit configured to receive a first set of input signals corresponding to a portion of the plurality of input signals through a first set of input terminals corresponding to a portion of the plurality of input terminals and configured to generate a plurality of internal chip selection signals based on the first set of input signals and the remapping control signal, wherein each memory chip of the plurality of stacked memory chips is selected by activating a corresponding one of the plurality of internal chip selection signals, and wherein the first set of input signals is selected from the plurality of input signals in response to the remapping control signal.

12. The memory module of claim 11, wherein each memory chip of the plurality of stacked memory chips is selected by a corresponding one of the plurality of internal chip selection signals.

13. The memory module of claim 11, wherein the first set of input signals further includes at least one address bit signal.

14. A memory system comprising:

a register programmable to store interface mode information;

an address remapping circuit including a plurality of input terminals for receiving a plurality of input signals, the address remapping circuit configured to receive input signals from a first set of the plurality of input terminals in response to a first value of the interface mode information stored in the register, configured to receive input signals from a second set of the plurality of input terminals in response to a second value of the interface mode information stored in the register, and configured to generate a plurality of internal chip selection signals based on the input signals; and a plurality of memory devices each configured to be selected in response to a corresponding one of the plurality of internal chip selection signals.

15. The memory system of claim 14, further comprising:

a memory controller configured to transfer the interface mode information to the register and transfer the input signals to the address remapping circuit.

16. The memory system of claim 15, wherein the memory controller is configured to determine the interface mode information based on a number of the plurality of memory devices.

17. The memory system of claim 14, wherein the input signals include at least one of chip selection signals and at least one of chip identification signals.

18. The memory system of claim 17, wherein the input signals further include at least one address bit signal.

19. The memory system of claim 14, wherein the plurality of memory devices are stacked on each other.

20. The memory system of claim 14, wherein during a power-up of the memory system, the memory system is configured to program the register with the interface mode information received from a serial presence detect non-volatile memory.

* * * * *